(12) United States Patent
Hirano et al.

(10) Patent No.: US 9,250,531 B2
(45) Date of Patent: Feb. 2, 2016

(54) METHOD OF FORMING RESIST PATTERN AND NEGATIVE TONE-DEVELOPMENT RESIST COMPOSITION

(75) Inventors: Tomoyuki Hirano, Kawasaki (JP); Daichi Takaki, Kawasaki (JP); Daiju Shiono, Kawasaki (JP); Kenri Konno, Kawasaki (JP); Isamu Takagi, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 24 days.

(21) Appl. No.: 14/003,708

(22) PCT Filed: Mar. 7, 2012

(86) PCT No.: PCT/JP2012/055776
§ 371 (c)(1),
(2), (4) Date: Sep. 6, 2013

(87) PCT Pub. No.: WO2012/121278
PCT Pub. Date: Sep. 13, 2012

(65) Prior Publication Data
US 2014/0004467 A1 Jan. 2, 2014

(30) Foreign Application Priority Data
Mar. 8, 2011 (JP) .................... 2011-050817

(51) Int. Cl.
*G03F 7/004* (2006.01)
*G03F 7/38* (2006.01)
*C08F 220/24* (2006.01)
*C08F 224/00* (2006.01)
*C08F 226/02* (2006.01)
*C08F 228/06* (2006.01)
*G03F 7/32* (2006.01)
*C08F 220/28* (2006.01)
*C08F 220/38* (2006.01)
*G03F 7/039* (2006.01)
*G03F 7/20* (2006.01)

(52) U.S. Cl.
CPC .............. *G03F 7/325* (2013.01); *C08F 220/28* (2013.01); *C08F 220/38* (2013.01); *G03F 7/0045* (2013.01); *G03F 7/0046* (2013.01); *G03F 7/0397* (2013.01); *G03F 7/2041* (2013.01); *C08F 220/24* (2013.01); *C08F 224/00* (2013.01); *C08F 226/02* (2013.01); *C08F 228/06* (2013.01)

(58) Field of Classification Search
CPC ....... G03F 7/0045; G03F 7/0382; G03F 7/38; G03F 7/325; C08F 220/24; C08F 224/00; C08F 226/02; C08F 228/06
USPC .............. 430/270.1, 325, 330, 910, 921, 922; 526/243, 256, 281, 287, 288
See application file for complete search history.

(56) References Cited

U.S. PATENT DOCUMENTS

| | | | |
|---|---|---|---|
| 4,743,529 A * | 5/1988 | Farid et al. ................ | 430/281.1 |
| 5,945,517 A | 8/1999 | Nitta et al. | |
| 6,153,733 A | 11/2000 | Yukawa et al. | |
| 7,629,106 B2 * | 12/2009 | Hatakeyama et al. ..... | 430/270.1 |
| 8,048,610 B2 * | 11/2011 | Ohsawa et al. ............ | 430/270.1 |
| 8,632,960 B2 * | 1/2014 | Hirano et al. ............... | 430/326 |
| 8,785,105 B2 * | 7/2014 | Ohsawa et al. ............ | 430/270.1 |
| 2004/0110085 A1 | 6/2004 | Iwai et al. | |
| 2005/0153232 A1 * | 7/2005 | Li et al. ...................... | 430/270.1 |
| 2006/0147836 A1 | 7/2006 | Hatakeyama et al. | |
| 2006/0234153 A1 * | 10/2006 | Nishimura et al. ........ | 430/270.1 |
| 2007/0231708 A1 | 10/2007 | Matsumaru et al. | |
| 2008/0187860 A1 | 8/2008 | Tsubaki et al. | |
| 2010/0159392 A1 | 6/2010 | Hatakeyama et al. | |
| 2010/0227273 A1 | 9/2010 | Hatakeyama et al. | |
| 2011/0244392 A1 * | 10/2011 | Hirano et al. .............. | 430/270.1 |
| 2011/0300485 A1 | 12/2011 | Tsubaki et al. | |
| 2011/0311914 A1 | 12/2011 | Kamimura et al. | |

FOREIGN PATENT DOCUMENTS

| | | |
|---|---|---|
| EP | 0 824 223 A1 | 2/1998 |
| JP | A-06-194847 | 7/1994 |
| JP | A-09-208554 | 8/1997 |
| JP | A-10-062995 | 3/1998 |
| JP | A-11-035551 | 2/1999 |
| JP | A-11-035552 | 2/1999 |

(Continued)

OTHER PUBLICATIONS

Gil et al., "First Microprocessors with Immersion Lithography" Proceedings of SPIE, vol. 5754, pp. 119-128, 2005.
Ebihara et al., "Beyond $k_1$=0.25 lithography : 70nm L/S patterning using KrF scanners" Proceedings of SPIE, vol. 5256, pp. 985-994, 2003.
Borodovsky, "Marching to the beat of Moore's Law" Proceedings of SPIE, vol. 6153, pp. 615301-1-615301-19, 2006.

(Continued)

*Primary Examiner* — John S Chu
(74) *Attorney, Agent, or Firm* — Knobbe Martens Olson & Bear LLP

(57) ABSTRACT

A method of forming a resist pattern including: forming a resist film on a substrate using a resist composition containing a base component (A) which exhibits decreased solubility in an organic solvent by action of an acid; exposing the resist film; and patterning by a negative-tone development using a developing solution containing the organic solvent, wherein the base component (A) contains a resin component (A1) having a structural unit (a0) which generates acid upon exposure and a structural unit (a1) derived from an acrylate ester which may have the hydrogen atom bonded to the carbon atom on the α-position substituted with a substituent and contains an acid decomposable group which exhibits increased polarity by the action of acid, and the developing solution contains a nitrile solvent.

20 Claims, No Drawings

(56) References Cited

FOREIGN PATENT DOCUMENTS

| JP | A-11-035573 | 2/1999 |
|----|----|----|
| JP | A-11-322707 | 11/1999 |
| JP | A-2002-090991 | 3/2002 |
| JP | A-2003-241385 | 8/2003 |
| JP | A-2006-045311 | 2/2006 |
| JP | A-2006-215526 | 8/2006 |
| JP | A-2008-292975 | 12/2008 |
| JP | A-2010-139996 | 6/2010 |
| JP | A-2010-197619 | 9/2010 |
| JP | A-2010-217884 | 9/2010 |
| JP | A-2010-237661 | 10/2010 |
| JP | A-2010-266842 | 11/2010 |
| WO | WO 2004/074242 A2 | 9/2004 |

OTHER PUBLICATIONS

International Search Report mailed on Apr. 3, 2012 in International Application No. PCT/JP2012/055776.

* cited by examiner

METHOD OF FORMING RESIST PATTERN AND NEGATIVE TONE-DEVELOPMENT RESIST COMPOSITION

This application is the U.S. National Phase under 35 U.S.C. §371 of International Application PCT/JP2012/055776, filed Mar. 7, 2012, designating the U.S., and published in Japanese as WO 2012/121278 on Sep. 13, 2012, which claims priority to Japanese Patent Application No. 2011-050817, filed Mar. 8, 2011, the entire content of which is incorporated herein by reference.

TECHNICAL FIELD

The present invention relates to a method of forming a resist pattern by a negative tone development using a developing solution containing an organic solvent, and a negative tone-development resist composition which is used in the method.

Priority is claimed on Japanese Patent Application No. 2011-050817, filed on Mar. 8, 2011, the content of which is incorporated herein by reference.

DESCRIPTION OF RELATED ART

Techniques (pattern-forming techniques) in which a fine pattern is formed on top of a substrate, and a lower layer beneath that pattern is then fabricated by conducting etching with this pattern as a mask are widely used in the production of semiconductor devices and liquid display device. These types of fine patterns are usually formed from an organic material, and are formed, for example, using a lithography method or a nanoimprint method or the like. In lithography techniques, for example, a resist film composed of a resist material containing a base component such as a resin is formed on a support such as a substrate, and the resist film is subjected to selective exposure of radial rays such as light or electron beam, followed by development, thereby forming a resist pattern having a predetermined shape on the resist film. Using this resist pattern as a mask, a semiconductor or the like is produced by conducting a step in which the substrate is processed by etching.

The aforementioned resist material can be classified into positive types and negative types. Resist materials in which the exposed portions exhibit increased solubility in a developing solution is called a positive type, and a resist material in which the exposed portions exhibit decreased solubility in a developing solution is called a negative type.

In general, an aqueous alkali solution (alkali developing solution) such as an aqueous solution of tetramethylammonium hydroxide (TMAH) is used as the developing solution. Alternatively, organic solvents such as aromatic solvents, aliphatic hydrocarbon solvents, ether solvents, ketone solvents, ester solvents, amide solvents and alcohol solvents are used as the developing solution (for example, see Patent Document 1).

In recent years, advances in lithography techniques have led to rapid progress in the field of pattern miniaturization.

Typically, these miniaturization techniques involve shortening the wavelength (increasing the energy) of the exposure light source. Conventionally, ultraviolet radiation typified by g-line and i-line radiation has been used, but nowadays KrF excimer lasers and ArF excimer lasers are starting to be introduced in mass production. Furthermore, research is also being conducted into lithography techniques that use an exposure light source having a wavelength shorter (energy higher) than these excimer lasers, such as electron beam (EB), extreme ultraviolet radiation (EUV), and X ray.

As shortening the wavelength of the exposure light source progresses, it is required to improve various lithography properties of the resist material, such as the sensitivity to the exposure light source and a resolution capable of reproducing patterns of minute dimensions. As resist materials which satisfy such requirements, chemically amplified resists are known.

As a chemically amplified composition, a composition including a base material component that exhibits a changed solubility in a developing solution under the action of acid and an acid-generator component that generates acid upon exposure is generally used. For example, in the case where an alkali developing solution is used as a developing solution (alkali developing process), a base component which exhibits increased solubility in an alkali developing solution under action of acid is used.

Conventionally, a resin (base resin) is typically used as the base component of a chemically amplified resist composition. Resins that contain structural units derived from (meth)acrylate esters within the main chain (acrylic resins) are the mainstream as base resins for chemically amplified resist compositions that use ArF excimer laser lithography, as they exhibit excellent transparency in the vicinity of 193 nm.

Here, the term "(meth)acrylic acid" is a generic term that includes either or both of acrylic acid having a hydrogen atom bonded to the α-position and methacrylic acid having a methyl group bonded to the α-position. The term "(meth)acrylate ester" is a generic term that includes either or both of the acrylate ester having a hydrogen atom bonded to the α-position and the methacrylate ester having a methyl group bonded to the α-position. The term "(meth)acrylate" is a generic term that includes either or both of the acrylate having a hydrogen atom bonded to the α-position and the methacrylate having a methyl group bonded to the α-position.

In general, the base resin contains a plurality of structural units for improving lithography properties and the like. For example, a structural unit having a lactone structure and a structural unit having a polar group such as a hydroxy group are used, as well as a structural unit having an acid decomposable group which is decomposed by the action of an acid generated from the acid generator to form an alkali soluble group (for example, see Patent Document 2). When the base resin is an acrylic resin, as the acid decomposable group, in general, resins in which the carboxy group of (meth)acrylic acid or the like is protected with an acid dissociable group such as a tertiary alkyl group or an acetal group are used.

As a technique for further improving the resolution, a lithography method called liquid immersion lithography (hereafter, frequently referred to as "immersion exposure") is known in which exposure (immersion exposure) is conducted in a state where the region between the lens and the resist layer formed on a wafer is filled with a solvent (an immersion medium) that has a larger refractive index than the refractive index of air (see for example, Non-Patent Document 1).

According to this type of immersion exposure, it is considered that higher resolutions equivalent to those obtained using a shorter wavelength light source or a larger NA lens can be obtained using the same exposure light source wavelength, with no lowering of the depth of focus. Furthermore, immersion exposure can be conducted by applying a conventional exposure apparatus. As a result, it is expected that immersion exposure will enable the formation of resist patterns of higher resolution and superior depth of focus at lower costs. Accordingly, in the production of semiconductor devices, which requires enormous capital investment, immersion exposure is attracting considerable attention as a method that offers significant potential to the semiconductor industry, both in terms of cost and in terms of lithography properties such as resolution.

Immersion lithography is effective in forming patterns having various shapes. Further, immersion exposure is expected to be capable of being used in combination with currently studied super-resolution techniques, such as phase shift method and modified illumination method. Currently, as the immersion exposure technique, technique using an ArF excimer laser as an exposure source is being actively studied. Further, water is mainly used as the immersion medium.

As a lithography technique which has been recently proposed, a double patterning method is known in which patterning is conducted two or more times to form a resist pattern (for example, see Non-Patent Documents 2 and 3). There are several different types of double patterning process, for example, (1) a method in which a lithography step (from application of resist compositions to exposure and developing) and an etching step are performed twice or more to form a pattern and (2) a method in which the lithography step is successively performed twice or more. According to the double patterning method, a resist pattern with a higher level of resolution can be formed, as compared to the case where a resist pattern is formed by a single lithography step (namely, a single patterning process), even when a light source with the same exposure wavelength is used, or even when the same resist composition is used. Furthermore, double patterning process can be conducted using a conventional exposure apparatus.

Moreover, a double exposure process has also been proposed in which a resist film is formed, and the resist film is subjected to exposure twice or more, followed by development to form a resist pattern. Like the double patterning process described above, this type of double exposure process is also capable of forming a resist pattern with a high level of resolution, and also has an advantage in that fewer number of steps is required than the above-mentioned double patterning process.

In a positive tone development process using a positive type, chemically amplified resist composition (i.e., a chemically amplified resist composition which exhibits increased alkali solubility in an alkali developing solution upon exposure) in combination with an alkali developing solution, as described above, the exposed portions of the resist film are dissolved and removed by an alkali developing solution to thereby form a resist pattern. The positive tone process is advantageous over a negative tone development process in which a negative type, chemically amplified resist composition is used in combination with an alkali developing solution in that the structure of the photomask can be simplified, a satisfactory contrast for forming an image can be reliably obtained, and the characteristics of the formed resist pattern are excellent. For these reasons, currently, positive tone development process is tended to be used in the formation of an extremely fine resist pattern.

However, in the case of forming a trench pattern (isolated space pattern) or a hole pattern by the positive tone development process, it becomes necessary to form a resist pattern using an incident light weaker than that used in the case of a line pattern or a dot pattern, such that the contrast of the intensity of the incident light between exposed portions and unexposed portions becomes unsatisfactory. Therefore, pattern formation performance such as resolution tends to be restricted, and it becomes difficult to form a resist pattern with a high resolution.

In contrast, a negative tone development process using a negative type, chemically amplified resist composition (i.e., a chemically amplified resist composition which exhibits decreased alkali solubility in an alkali developing solution upon exposure) in combination with an alkali developing solution is advantageous over the positive tone development process in the formation of a trench pattern or a hole pattern.

As a negative tone development process, a process has been proposed in which a positive type, chemically amplified resist composition is used in combination with a developing solution containing an organic solvent (hereafter, frequently referred to as "organic developing solution") (for example, see Patent Documents 3 and 4). A positive type, chemically amplified resist composition exhibits increased solubility in an alkali developing solution upon exposure, but comparatively, the solubility in an organic solvent is decreased. Therefore, in a negative tone development process, the unexposed portions of the resist film are dissolved and removed by an organic solvent-type developing solution to thereby form a resist pattern.

DOCUMENTS OF RELATED ART

Patent Document

[Patent Document 1] Japanese Unexamined Patent Application, First Publication No. Hei 6-194847
[Patent Document 2] Japanese Unexamined Patent Application, First Publication No. 2003-241385
[Patent Document 3] Japanese Unexamined Patent Application, First Publication No. 2008-292975
[Patent Document 4] Japanese Unexamined Patent Application, First Publication No. 2010-217884

Non-Patent Documents

[Non-Patent Document 1] Proceedings of SPIE (U.S.), vol. 5754, pp. 119-128 (2005)
[Non-Patent Document 2] Proceedings of SPIE (U.S.), vol. 5256, pp. 985-994 (2003)
[Non-Patent Document 3] Proceedings of SPIE (U.S.), vol. 6153, pp.

SUMMARY OF THE INVENTION

The negative tone development process using a positive type, chemically amplified resist composition in combination with an organic developing solution, as in the case of using a negative type, chemically amplified resist composition in combination with an alkali developing solution, is considered to be advantageous in the formation of a trench pattern or a hole pattern.

However, as further progress is made in lithography techniques and the application field for lithography techniques expands, improvement is required in the negative tone development process and the chemically amplified resist composition used in the process. For example, as a matter of course, improvement in the resolution and improvement in the sensitivity together with shortening of the wavelength (increasing the energy) of the exposure light source are required, but also, reducing the roughness which develop on the upper surface and side wall surfaces of the formed pattern is required. The roughness becomes the cause of defects in the shape of the resist pattern, and therefore, improvement thereof is important as the pattern size becomes smaller. For example, roughness on the side wall surfaces of a pattern can cause various defects such as non-uniformity of the line width of line and space patterns, or distortions around the holes in hole patterns. Such defects adversely affect the formation of very fine semiconductor elements.

Further, with the miniaturization of the pattern, in the positive development process, there is a problem that swelling or collapse of the resist pattern tends to occur. In contrast, in a negative tone development process, the unexposed portions of the resist film are dissolved and removed by an organic solvent-type developing solution to thereby form a resist pattern. Therefore, swelling or collapse of the resist pattern is unlikely to occur.

However, in the studies of reducing roughness by the present inventors, it has been found that, in the negative development process, by the difference of the base resin used as the base component of a chemically amplified resist composition, a conventional developing solution containing an organic solvent such as an ester or ketone solvent cannot obtain the contrast between the exposed portions and unexposed portions, such that a pattern cannot be formed in some cases.

The present invention takes the above circumstances into consideration, with an object of providing a method of forming a resist pattern by a negative tone process using a developing solution containing an organic solvent which enables stable formation of fine resist patterns with excellent lithography properties, and a negative tone-development resist composition used in the same method.

In the negative development process, in the case where a specific resin component having a structural unit which generates acid upon exposure is used as a base component of a resist composition, and a conventional developing solution containing an ester solvent or a ketone solvent is used, a pattern would not resolve, and a resist pattern cannot be obtained. In this regard, as a result of intensive studies of the present inventors, they have found that the aforementioned problems can be solved by using a nitrile solvent-containing developing solution. The present invention has been completed based on this finding.

Specifically, a first aspect of the present invention is a method of forming a resist pattern including: forming a resist film on a substrate using a resist composition containing a base component (A) which exhibits decreased solubility in an organic solvent by action of an acid; exposing the resist film; and patterning by a negative-tone development using a developing solution containing the organic solvent, wherein the base component (A) contains a resin component (A1) having a structural unit (a0) which generates acid upon exposure and a structural unit (a1) derived from an acrylate ester which may have the hydrogen atom bonded to the carbon atom on the α-position substituted with a substituent and contains an acid decomposable group which exhibits increased polarity by the action of acid, and the developing solution contains a nitrile solvent.

A second aspect of the present invention is a negative-tone development resist composition usable in a method of forming a resist pattern including: forming a resist film on a substrate using a resist composition containing a base component (A) which exhibits decreased solubility in an organic solvent by action of an acid; exposing the resist film; and patterning by a negative-tone development using a developing solution containing the organic solvent, the base component (A) containing a resin component (A1) having a structural unit (a0) which generates acid upon exposure and a structural unit (a1) derived from an acrylate ester which may have the hydrogen atom bonded to the carbon atom on the α-position substituted with a substituent and contains an acid decomposable group which exhibits increased polarity by the action of acid.

In the present description and claims, the term "aliphatic" is a relative concept used in relation to the term "aromatic", and defines a group or compound that has no aromaticity.

The term "alkyl group" includes linear, branched or cyclic, monovalent saturated hydrocarbon, unless otherwise specified. The same applies for the alkyl group within an alkoxy group.

The term "alkylene group" includes linear, branched or cyclic divalent saturated hydrocarbon, unless otherwise specified.

A "halogenated alkyl group" is a group in which part or all of the hydrogen atoms of an alkyl group is substituted with a halogen atom, and a "halogenated alkylene group" is a group in which part or all of the hydrogen atoms of an alkylene group is substituted with a halogen atom. Examples of the halogen atom include a fluorine atom, a chlorine atom, a bromine atom and an iodine atom.

A "hydroxyalkyl group" is a group in which part or all of the hydrogen atoms within an alkyl group have been substituted with a hydroxyl group.

The term "structural unit" refers to a monomer unit that contributes to the formation of a polymeric compound (resin, polymer, copolymer).

The term "exposure" is used as a general concept that includes irradiation with any form of radiation.

According to the present invention, there are provided a method of forming a resist pattern by a negative tone process using a developing solution containing an organic solvent which enables stable formation of fine resist patterns with excellent lithography properties, and a negative tone-development resist composition used in the same method.

DETAILED DESCRIPTION OF THE INVENTION

Method of Forming a Resist Pattern

The method of forming a resist pattern according to the present invention includes forming a resist film on a substrate using a resist composition (hereafter, frequently referred to as "negative tone-development resist composition") containing a base component (A) which exhibits decreased solubility in an organic solvent under action of an acid, conducting exposure of the resist film, and patterning the resist film by a negative tone development using a developing solution containing an organic solvent.

In the method of forming a resist pattern, as the base component (A), a resin component (A1) having a structural unit (a0) which generates acid upon exposure and a structural unit (a1) derived from an acrylate ester which may have the hydrogen atom bonded to the carbon atom on the α-position substituted with a substituent and contains an acid decomposable group is used, and a developing solution containing a nitrile solvent is used.

In a negative tone-development resist composition, when radial rays are irradiated (when exposure is conducted), acid is generated from the resin component (A1), and the solubility of the base component (A) in an organic solvent is decreased by the action of the acid. Therefore, in the formation of a resist pattern, by conducting selective exposure of a resist film formed by using the negative tone-development resist composition, the solubility of the exposed portions in a developing solution containing an organic solvent (hereafter, frequently referred to as "organic developing solution") is decreased, whereas the solubility of the unexposed portions in an organic developing solution is unchanged, and hence, a resist pattern can be formed by removing the unexposed portions by negative tone development using an organic developing solution.

As the negative tone-development resist composition, the negative tone-development resist composition according to the present invention described later can be used.

More specifically, the method for forming a resist pattern according to the present invention can be performed, for example, as follows.

Firstly, a negative tone-development resist composition is applied to a substrate using a spinner or the like, and a bake treatment (post applied bake (PAB)) is conducted at a temperature of 80 to 150° C. for 40 to 120 seconds, preferably 60 to 90 seconds, to form a resist film. Following selective exposure of the thus formed resist film, either by exposure through a mask having a predetermined pattern formed thereon (mask pattern) using an exposure apparatus such as an ArF exposure apparatus, an electron beam lithography apparatus or an EUV exposure apparatus, or by patterning via direct irradiation with an electron beam without using a mask pattern, baking treatment (post exposure baking (PEB)) is conducted under temperature conditions of 80 to 150° C. for 40 to 120 seconds, and preferably 60 to 90 seconds. The resulting resist film is subjected to developing treatment using an organic developing solution, preferably followed by rinsing with a rinse liquid containing an organic solvent, and then drying is conducted.

After the developing treatment or the rinsing, the developing solution or the rinse liquid remaining on the pattern can be removed by a treatment using a supercritical fluid.

If necessary, after the developing treatment, the rinsing or the treatment with a supercritical fluid, a bake treatment (post bake) may be conducted to remove any remaining organic solvent.

The substrate is not specifically limited and a conventionally known substrate can be used. For example, substrates for electronic components, and such substrates having wiring patterns formed thereon can be used. Specific examples of the material of the substrate include metals such as silicon wafer, copper, chromium, iron and aluminum; and glass. Suitable materials for the wiring pattern include copper, aluminum, nickel, and gold.

Further, as the substrate, any one of the above-mentioned substrates provided with an inorganic and/or organic film on the surface thereof may be used. As the inorganic film, an inorganic antireflection film (inorganic BARC) can be used. As the organic film, an organic antireflection film (organic BARC) and an organic film such as a lower-layer organic film used in a multilayer resist method can be used.

Here, a "multilayer resist method" is method in which at least one layer of an organic film (lower-layer organic film) and at least one layer of a resist film (upper resist film) are provided on a substrate, and a resist pattern formed on the upper resist film is used as a mask to conduct patterning of the lower-layer organic film. This method is considered as being capable of forming a pattern with a high aspect ratio. More specifically, in the multilayer resist method, a desired thickness can be ensured by the lower-layer organic film, and as a result, the thickness of the resist film can be reduced, and an extremely fine pattern with a high aspect ratio can be formed.

The multilayer resist method is broadly classified into a method in which a double-layer structure consisting of an upper-layer resist film and a lower-layer organic film is formed (double-layer resist method), and a method in which a multilayer structure having at least three layers consisting of an upper-layer resist film, a lower-layer organic film and at least one intermediate layer (thin metal film or the like) provided between the upper-layer resist film and the lower-layer organic film (triple-layer resist method).

The wavelength to be used for exposure is not particularly limited and the exposure can be conducted using radiation such as ArF excimer laser, KrF excimer laser, $F_2$ excimer laser, extreme ultraviolet rays (EUV), vacuum ultraviolet rays (VUV), electron beam (EB), X-rays, and soft X-rays. The resist composition of the present invention is effective to KrF excimer laser, ArF excimer laser, EB and EUV, and particularly effective to ArF excimer laser, EB and EUV.

The exposure of the resist film can be either a general exposure (dry exposure) conducted in air or an inert gas such as nitrogen, or immersion exposure (immersion lithography).

In immersion lithography, the region between the resist film and the lens at the lowermost point of the exposure apparatus is pre-filled with a solvent (immersion medium) that has a larger refractive index than the refractive index of air, and the exposure (immersion exposure) is conducted in this state.

The immersion medium preferably exhibits a refractive index larger than the refractive index of air but smaller than the refractive index of the resist film to be exposed. The refractive index of the immersion medium is not particularly limited as long as it satisfies the above-mentioned requirements.

Examples of this immersion medium which exhibits a refractive index that is larger than the refractive index of air but smaller than the refractive index of the resist film include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which have a boiling point within a range from 70 to 180° C. and preferably from 80 to 160° C. A fluorine-based inert liquid having a boiling point within the above-mentioned range is advantageous in that the removal of the immersion medium after the exposure can be conducted by a simple method.

As a fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point 102° C.), and an example of a suitable perfluoroalkylamine compound is perfluorotributylamine (boiling point 174° C.).

As the immersion medium, water is preferable in terms of cost, safety, environment and versatility.

In the present invention, the developing treatment is conducted using a developing solution containing a nitrile solvent.

A nitrile solvent is an organic solvent containing —CN in the structure thereof.

Examples of nitrile solvents include acetonitrile, propionitrile, butyronitrile, isobutyronitrile, valeronitrile, isovaleronitrile and benzonitrile. Among these examples, in terms of obtaining a high resolution, acetonitrile and propionitrile are preferable, and acetonitrile is most preferable.

As the developing solution containing an organic solvent (organic developing solution), a nitrile solvent may be used alone (100% by weight), or a combination of a nitrile solvent with another organic solvent may be used in terms of obtaining a contrast between exposed portions and unexposed portions.

In the case where another organic solvent is used in combination, the amount of the nitrite solvent contained in the organic developing solution is appropriately selected depending on the kind of organic solvent used in combination. The amount of the nitrite solvent based on the total amount of the organic developing solution is preferably 1 to 99.9% by weight, more preferable 5 to 70% by weight, and still more preferably 10 to 50% by weight.

Specific examples of the organic solvent usable in combination with the nitrite solvent include polar solvents such as ketone solvents, ester solvents, alcohol solvents, amide solvents and ether solvents, and hydrocarbon solvents.

A ketone solvent is an organic solvent containing C—C(=O)—C within the structure thereof. An ester solvent is an organic solvent containing C—C(=O)—O—C within the structure thereof. An alcohol solvent is an organic solvent containing an alcoholic hydroxy group within the structure thereof, and an "alcoholic hydroxy group" refers to a hydroxy group bonded to a carbon atom of an aliphatic hydrocarbon group. An amide solvent is an organic solvent containing an amide group within the structure thereof. An ether solvent is an organic solvent containing C—O—C within the structure thereof. Some organic solvents have a plurality of the functional groups which characterizes the aforementioned solvents within the structure thereof. In such a case, the organic solvent can be classified as any type of the solvent having the characteristic functional group. For example, diethyleneglycol monomethylether can be classified as either an alcohol solvent or an ether solvent. A hydrocarbon solvent consists of a hydrocarbon, and does not have any substituent (atom or group other than hydrogen and carbon).

Specific examples of ketone solvents include 1-octanone, 2-octanone, 1-nonanone, 2-nonanone, acetone, 4-heptanone, 1-hexanone, 2-hexanone, diisobutyl ketone, cyclohexanone, methylcyclohexanone, phenylacetone, methyl ethyl ketone, methyl isobutyl ketone, acetylacetone, acetonylacetone, ionone, diacetonylalcohol, acetylcarbinol, acetophenone, methyl naphthyl ketone, isophorone, propylenecarbonate and γ-butyrolactone.

Examples of ester solvents include methyl acetate, butyl acetate, ethyl acetate, isopropyl acetate, amyl acetate, isoamyl acetate, ethyl methoxyacetate, ethyl ethoxyacetate, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, diethylene glycol monoethyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl-3-methoxypropionate, ethyl-3-methoxypropionate, ethyl-3-ethoxypropionate and propyl-3-methoxypropionate.

As the ester solvent, a solvent represented by general formula (1) described later or a solvent represented by general formula (2) described later is preferable, a solvent represented by general formula (1) is more preferable, an alkyl acetate is still more preferable, and butyl acetate is particularly desirable.

Examples of alcohol solvents include monohydric alcohols, such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol, n-decanol and 3-methoxy-1-butanol; glycol solvents, such as ethylene glycol, diethylene glycol and triethylene glycol; and glycol ether solvents containing a hydroxy group, such as ethylene glycol monomethyl ether, propylene glycol monomethyl ether, diethylene glycol monomethyl ether, triethylene glycol monoethyl ether, methoxymethyl butanol, ethylene glycol monoethyl ether, ethylene glycol monopropyl ether, ethylene glycol monobutyl ether, propylene glycol monoethyl ether, propylene glycol monopropyl ether, propylene glycol monobutyl ether and propylene glycol monophenyl ether. Among these examples, a glycol ether solvent is preferable.

Examples of ether solvents include the aforementioned glycol ether solvents containing a hydroxy group; glycol ether solvents containing no hydroxy group, such as propylene glycol dimethyl ether, propylene glycol diethyl ether, diethylene glycol dimethyl ether and diethylene glycol diethyl ether:dioxane; tetrahydrofuran; anisole; perfluoro-2-butyltetrahydrofuran, perfluorotetrahydrofuran and 1,4-dioxane. Among these, a glycol ether solvent containing a hydroxy group or a glycol ether solvent containing no hydroxy group is preferable.

Examples of amide solvents include N-methyl-2-pyrrolidone, N,N-dimethylacetamide, N,N-dimethylformamide, hexamethylphosphoric amide and 1,3-dimethyl-2-imidazolidinone.

Examples of hydrocarbon solvents include aliphatic hydrocarbon solvents, such as pentane, hexane, octane, decane, 2,2,4-trimethylpentane, 2,2,3-trimethylhexane, perfluorohexane and perfluoronpetane; and aromatic hydrocarbon solvents, such as toluene, xylene, ethylbenzene, propylbenzene, 1-methylpropylbenzene, 2-methylpropylbenzene, dimethylbenzene, diethylbenzene, ethylmethylbenzene, trimethylbenzene, ethyldimethylbenzene and dipropylbenzene. Among these examples, an aromatic hydrocarbon solvent is preferable.

As the organic solvent usable in combination with the nitrile solvent, one kind of solvent may be used, or two or more kinds may be used. Further, an organic solvent other than those described above may be used.

As the organic solvent usable in combination with the nitrile solvent, a solvent represented by general formula (1) or (2) shown below is preferable.

$$R^{00}—C(=O)—O—R^{01} \quad (1)$$

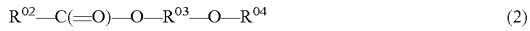

$$R^{02}—C(=O)—O—R^{03}—O—R^{04} \quad (2)$$

In formula (1), each of $R^{00}$ and $R^{01}$ independently represents a hydrogen atom, an alkyl group, an alkoxy group, an alkoxycarbonyl group, a carboxy group, a hydroxy group, a cyano group or a halogen atom, provided that $R^{00}$ and $R^{01}$ may be mutually bonded to form a ring. In formula (2), each of $R^{02}$ and $R^{04}$ independently represents a hydrogen atom, an alkyl group, an alkoxy group, an alkoxycarbonyl group, a carboxy group, a hydroxy group, a cyano group or a halogen atom, provided that $R^{02}$ and $R^{04}$ may be mutually bonded to form a ring; and $R^{03}$ represents an alkylene group.

In formula (1), the alkyl group for $R^{00}$ and $R^{01}$ may be linear, branched or cyclic, preferably linear or branched, and preferably has 1 to 5 carbon atoms. The alkyl group may have a substituent. Examples of the substituent include a hydroxy group, a carboxy group and a cyano group.

As the alkyl group within the alkoxy group and the alkoxycarbonyl group, the same alkyl groups as those described above can be used.

Examples of the halogen atom include a fluorine atom, a chlorine atom, a bromine atom and an iodine atom, and a fluorine atom is preferable.

It is preferable that $R^{00}$ and $R^{01}$ each independently represents a hydrogen atom or an alkyl group.

Specific example of the solvent represented by formula (1) include methyl acetate, butyl acetate, ethyl acetate, isopropyl acetate, pentyl acetate, isopentyl acetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate and ethyl 2-hydroxypropionate.

Among the aforementioned examples, as the solvent represented by formula (1), those in which $R^{00}$ and $R^{01}$ both represent an unsubstituted alkyl group is preferable, an alkyl acetate is more preferable, and butyl acetate is particularly desirable.

In formula (2), $R^{02}$ and $R^{04}$ are the same as defined for $R^{00}$ and $R^{01}$ described above.

The alkylene group for $R^{03}$ may be linear, branched or cyclic, preferably linear or branched, and preferably has 1 to 5 carbon atoms. The alkylene group may have a substituent. Examples of the substituent include a hydroxy group, a carboxy group and a cyano group. When the alkylene group has 2 or more carbon atoms, an oxygen atom (—O—) may be present between the carbon atoms within the alkylene group.

Specific example of the solvent represented by formula (2) include ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monophenyl ether acetate, diethylene glycol monobutyl ether acetate, diethylene glycol monoethyl ether acetate, propylene glycol monomethyl ether acetate, propylene glycol monoethyl ether acetate, propylene glycol monopropyl ether acetate, methyl-3-methoxypropionate, ethyl-3-methoxypropionate, ethyl-3-ethoxypropionate, propyl-3-methoxypropionate, ethyl methoxyacetate, ethyl ethoxyacetate, 2-methoxybutyl acetate, 3-methoxybutyl acetate, 4-methoxybutyl acetate, 3-methyl-3-methoxybutyl acetate, 3-ethyl-3-methoxybutyl acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate and 4-methyl-4-methoxypentyl acetate.

The solvent represented by formula (1) and/or (2) can be used individually, or at least 2 types of solvents may be mixed together. Further, another solvent may be mixed together.

The other solvent is not particularly limited as long as it can be mixed with the solvent represented by formula (1) or (2) without being separated, and can be appropriately selected from the aforementioned ester solvents, ketone solvents, alcohol solvents, amide solvents, ether solvents and hydrocarbon solvents.

As the organic solvent usable in combination with nitrile solvent, especially in terms of reliably obtaining contrast between exposed portions and unexposed portions, an ester solvent is more preferable, a solvent represented by formula (1) is still more preferable, and butyl acetate is most preferable.

The mixing ratio of the nitrile solvent to the ester solvent in terms of weight ratio (nitrile solvent/ester solvent) is preferably 90:10 to 1:99, more preferably 70:30 to 5:95, and still more preferably 50:50 to 10:90.

When the weight ratio is at least as large as the lower limit (i.e., when the amount of the nitrile solvent becomes large), it becomes possible to more reliably resolve a pattern. On the other hand, when the weight ratio is no more than the upper limit (i.e., when the amount of the ester solvent becomes large), a difference in solubility in a developing solution is likely to occur between the exposed portions and unexposed portions, such that the lithography properties are improved (e.g., roughness is reduced).

In terms of reducing the cost, it is preferable to use an organic solvent containing no halogen atom as the organic developing solution. The amount of the organic solvent containing no halogen atom, based on the total weight of the organic developing solvent is preferably 60% by weight or more, more preferably 80% by weight or more, still more preferably 90% by weight or more, and may be even 100% by weight.

The boiling point of the organic solvent used as the organic developing solution is preferably 50° C. to lower than 250° C.

The ignition point of the organic solvent used as the organic developing solution is preferably 200° C. or higher.

If desired, the organic developing solution may have a conventional additive blended. Examples of the additive include surfactants. The surfactant is not particularly limited, and for example, an ionic or non-ionic fluorine and/or silicon surfactant can be used.

Examples of commercially available surfactants include fluorine surfactants or silicon surfactants such as F Top EF301, EF303 (produced by Shinakita Kasei K.K.), Florad FC430, FC431 (produced by Sumitomo 3M), Megafac F171, F173, F176, F189, R08 (produced by DIC Corporation), Surflon S-382, SC101, SC102, SC103, SC104, SC105, SC106 (Asahi Glass Company, Limited) and Troysol S-366 (troy chemical corporation). Further, polysiloxane polymer KP-341 (produced by The Shin-etsu Chemical Industry Co., Ltd.) can be used as a silicon surfactant.

Further, other than the aforementioned conventional surfactants, there can be used a surfactant containing a polymer having a fluoroaliphatic group derived from a fluoroaliphatic compound produced by a telomerization method (telomer method) or an oligomerization method (oligomer method). The fluoroaliphatic compound can be produced by a method described in Japanese Unexamined Patent Application, First Publication No. 2002-90991.

As the polymer containing a fluoroaliphatic group, a copolymer of a monomer containing a fluoroaliphatic group and a (poly(oxyalkylene)) acrylate and/or (poly(oxyalkylene)) methacrylate is preferable. The copolymer may be either a random copolymer or a block copolymer. Examples of the poly(oxyalkylene) group include a poly(oxyethylene) group) a poly(oxypropylene) group and a poly(oxybutylene)

group. Alternatively, a unit in which different types of alkylene chains exist within the same chain may be used, such as a poly(block linkage of oxyethylene, oxypropylene and oxyethylene) or a poly(block linkage of oxyethylene and oxypropylene). Furthermore, the copolymer of a monomer having a fluoroaliphatic group and a (poly(oxyalkylene))acrylate (or methacrylate) may not only be a bipolymer, but may be a terpolymer or more in which 2 or more types of monomers having a fluoroaliphatic group or 2 or more types of (poly(oxyalkylene))acrylate (or methacrylate) have been copolymerized together.

Examples of such surfactants which are commercially available include Megafac F178, Megafac F470, Megafac F473, Megafac F475, Megafac F476 and Megafac F472 (produced by DIC Corporation). Further examples include a copolymer containing an acrylate (or a methacrylate) having a C6F13 group and a (poly(oxyalkylene)) acrylate (or methacrylate), a copolymer containing an acrylate (or a methacrylate) having a C6F13 group, a (poly(oxyethylene)) acrylate (or methacrylate) and a (poly(oxypropylene)) acrylate (or methacrylate), a copolymer containing an acrylate (or a methacrylate) having a C8F17 group and a (poly(oxyalkylene)) acrylate (or methacrylate), and a copolymer containing an acrylate (or a methacrylate) having a C8F17 group, a (poly(oxyethylene)) acrylate (or methacrylate) and a (poly(oxypropylene)) acrylate (or methacrylate).

As the surfactant, a non-ionic surfactant is preferable, and a fluorine surfactant or a silicon surfactant is more preferable.

When a surfactant is added, the amount thereof based on the total amount of the organic developing solution is generally 0.001 to 5% by weight, preferably 0.005 to 2% by weight, and more preferably 0.01 to 0.5% by weight.

The development treatment using the organic developing solution can be performed by a conventional developing method. Examples thereof include a developing method in which the substrate is immersed in the developing solution for a predetermined time (a dip method), a method in which the developing solution is cast up on the surface of the substrate by surface tension and maintained for a predetermined period (a puddle method), a method in which the developing solution is sprayed onto the surface of the substrate (spray method), and a method in which the developing solution is continuously ejected from a developing solution ejecting nozzle while scanning at a constant rate to apply the developing solution to the substrate while rotating the substrate at a constant rate (dynamic dispense method).

After the developing treatment and before drying, it is preferable to perform a rinse treatment using a rinse liquid containing an organic solvent. By performing a rinse treatment, an excellent pattern can be formed.

As the organic solvent used for the rinse liquid, any of the aforementioned organic solvents for the organic developing solution can be used which hardly dissolve the pattern. In general, at least one solvent selected from the group consisting of hydrocarbon solvents, ketone solvents, ester solvents, alcohol solvents, amide solvents and ether solvents is used. Among these, at least one member selected from the group consisting of hydrocarbon solvents, ketone solvents, ester solvents, alcohol solvents and amide solvents is preferable.

These organic solvents can be used individually, or at least 2 solvents may be mixed together. Further, an organic solvent other than the aforementioned examples or water may be mixed together. However, in consideration of the development characteristics, the amount of water within the rinse liquid, based on the total amount of the rinse liquid is preferably 30% by weight or less, more preferably 10% by weight or less, still more preferably 5% by weight or less, and most preferably 3% by weight or less.

<<Negative Tone-Development Resist Composition>>

The negative tone-development resist composition of the present invention includes a base component (A) (hereafter, referred to as component (A)) which exhibits reduced solubility in an organic solvent under action of an acid, and is used in a method of forming a resist pattern including the steps of forming a resist film on a substrate using the resist composition, conducting exposure of the resist film, and patterning the resist film by a negative tone development using a developing solution containing an organic solvent. As the base component (A), a resin component (A1) having a structural unit (a0) which generates acid upon exposure and a structural unit (a1) derived from an acrylate ester which may have the hydrogen atom bonded to the carbon atom on the α-position substituted with a substituent and contains an acid decomposable group which exhibits increased polarity by the action of acid is used.

In the resist composition, when radial rays are irradiated (when exposure is conducted), at exposed portions, acid is generated from the component (A1), and the solubility of the component (A) in an organic is decreased by the action of the generated acid. Therefore, in the formation of a resist pattern, by conducting selective exposure of a resist film formed by using the resist composition, the solubility of the exposed portions in a developing solution containing an organic developing solution is decreased, whereas the solubility of the unexposed portions in an organic developing solution is unchanged, and hence, a resist pattern can be formed by removing the unexposed portions by negative tone development using an organic developing solution.

<Component (A)>

In the present invention, the term "base component" refers to an organic compound capable of forming a film.

As the base component, an organic compound having a molecular weight of 500 or more is used. When the organic compound has a molecular weight of 500 or more, the organic compound exhibits a satisfactory film-forming ability, and a resist pattern of nano level can be easily formed.

The "organic compound having a molecular weight of 500 or more" is broadly classified into non-polymers and polymers.

In general, as a non-polymer, any of those which have a molecular weight in the range of 500 to less than 4,000 is used. Hereafter, a "low molecular weight compound" refers to a non-polymer having a molecular weight in the range of 500 to less than 4,000.

As a polymer, any polymeric compound which has a molecular weight of 1,000 or more is generally used. In the present description and claims, the term "polymeric compound" refers to a polymer having a molecular weight of 1,000 or more, and the polymeric compound is frequently referred to as "resin".

With respect to a polymeric compound, the "molecular weight" is the weight average molecular weight in terms of the polystyrene equivalent value determined by gel permeation chromatography (GPC).

[Resin Component (A1)]

In the present invention, the component (A) contains a resin component (A1) (hereafter, referred to as "component (A1)") containing a structural unit (a0) which generates acid upon exposure and a structural unit (a1) derived from an acrylate ester which may have the hydrogen atom bonded to the carbon atom on the α-position substituted with a substituent and contains an acid decomposable group which exhibits increased polarity by the action of acid.

Further, in addition to the structural units (a0) and (a1), it is preferable that the component (A1) has a structural unit (a2) derived from an acrylate ester which may have the hydrogen atom bonded to the carbon atom on the α-position substituted with a substituent and contains a lactone-containing cyclic group.

In addition to the structural units (a0) and (a1) or in addition to the structural units (a0), (a1) and (a2), it is preferable that the component (A1) further include a structural unit (a3) derived from an acrylate ester containing a polar group-containing aliphatic hydrocarbon group and may have the hydrogen atom bonded to the carbon atom on the α-position substituted with a substituent.

In the present descriptions and claims, the term "structural unit derived from an acrylate ester" refers to a structural unit which is formed by the cleavage of the ethylenic double bond of an acrylate ester.

An "acrylate ester" refers to a compound in which the terminal hydrogen atom of the carboxy group of acrylic acid ($CH_2$=CH—COOH) has been substituted with an organic group.

The acrylate ester may have the hydrogen atom bonded to the carbon atom on the α-position substituted with a substituent. The substituent that substitutes the hydrogen atom bonded to the carbon atom on the α-position is atom other than hydrogen or a group, and examples thereof include an alkyl group of 1 to 5 carbon atoms, a halogenated alkyl group of 1 to 5 carbon atoms and a hydroxyalkyl group. A carbon atom on the α-position of an acrylate ester refers to the carbon atom bonded to the carbonyl group, unless specified otherwise.

Hereafter, an acrylate ester having the hydrogen atom bonded to the carbon atom on the α-position substituted with a substituent is sometimes referred to as "α-substituted acrylate ester". Further, acrylate esters and α-substituted acrylate esters are collectively referred to as "(α-substituted) acrylate ester".

In the α-substituted acrylate ester, the alkyl group as the substituent on the α-position is preferably a linear or branched alkyl group, and specific examples thereof include a methyl group, an ethyl group, a propyl group, an isopropyl group, an n-butyl group, an isobutyl group, a tert-butyl group, a pentyl group, an isopentyl group and a neopentyl group.

Specific examples of the halogenated alkyl group as the substituent on the α-position include groups in which part or all of the hydrogen atoms of the aforementioned "alkyl group as the substituent on the α-position" are substituted with halogen atoms. Examples of the halogen atom include a fluorine atom, a chlorine atom, a bromine atom and an iodine atom, and a fluorine atom is particularly desirable.

It is preferable that a hydrogen atom, an alkyl group of 1 to 5 carbon atoms or a halogenated alkyl group of 1 to 5 carbon atoms is bonded to the α-position of the α-substituted acrylate ester, a hydrogen atom, an alkyl group of 1 to 5 carbon atoms or a fluorinated alkyl group of 1 to 5 carbon atoms is more preferable, and in terms of industrial availability, a hydrogen atom or a methyl group is the most desirable.

(Structural Unit (a0))

The structural unit (a0) is a structural unit which generates acid upon exposure. The structural unit (a0) is not particularly limited as long as it generates acid upon exposure. For example, a structural unit copolymerizable with the structural units (a1) to (a6) described later and in which an acid generator for a conventional chemically amplified resist have been introduced can be used.

Preferable examples of structural units copolymerizable with structural units (a1) to (a6) include a structural unit derived from an acrylate ester which may have the hydrogen atom bonded to the carbon atom on the α-position substituted with a substituent, and a structural unit derived from hydroxystyrene which may have the hydrogen atom bonded to the carbon atom on the α-position substituted with a substituent.

Preferable examples of the acid generator for a conventional chemically amplified resist include the component (B) described later.

Among these examples, in terms of acid strength, sensitivity, resolution and roughness, the structural unit (a0) used in the present invention preferably has a group represented by general formula (a0-1-1) or (a0-2-1) shown below.

[Chemical Formula 1]

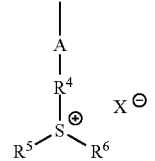

(a0-1-1)

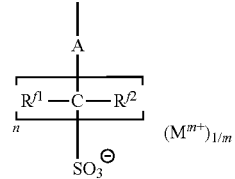

(a0-2-1)

In the formulas, A represents a single bond or a divalent linking group; $R^4$ represents an arylene group which may have a substituent; each of $R^5$ and $R^6$ independently represents an organic group, wherein $R^5$ and $R^6$ may be mutually bonded to form a ring with the sulfur atom; $X^-$ represents a counteranion; each of $R^{f1}$ and $R^{f2}$ independently represents a hydrogen atom, an alkyl group, a fluorine atom or a fluorinated alkyl group, provided that at least one of $R^{f1}$ and $R^{f2}$ represents a fluorine atom or a fluorinated alkyl group; n represents an integer of 1 to 8; $M^{m+}$ represents a counteraction; and m represents an integer of 1 to 3.

In formulae (a0-1-1) and (a0-2-1), A represents a single bond or a divalent linking group.

As preferable examples of the divalent linking group for A, a divalent hydrocarbon group which may have a substituent, and a divalent linking group containing a hetero atom can be given.

A hydrocarbon "has a substituent" means that part or all of the hydrogen atoms within the hydrocarbon group is substituted with groups or atoms other than hydrogen.

The hydrocarbon group may be either an aliphatic hydrocarbon group or an aromatic hydrocarbon group. An "aliphatic hydrocarbon group" refers to a hydrocarbon group that has no aromaticity.

The aliphatic hydrocarbon group may be saturated or unsaturated. In general, the aliphatic hydrocarbon group is preferably saturated.

As specific examples of the aliphatic hydrocarbon group, a linear or branched aliphatic hydrocarbon group, and an aliphatic hydrocarbon group containing a ring in the structure thereof can be given.

The linear or branched aliphatic hydrocarbon group preferably has 1 to 10 carbon atoms, more preferably 1 to 8, still more preferably 1 to 5, and most preferably 1 or 2.

As the linear aliphatic hydrocarbon group, a linear alkylene group is preferable. Specific examples thereof include a methylene group [—$CH_2$—], an ethylene group [—$(CH_2)_2$—], a trimethylene group [—$(CH_2)_3$—], a tetramethylene group [—$(CH_2)_4$—] and a pentamethylene group [—$(CH_2)_5$—].

As the branched aliphatic hydrocarbon group, branched alkylene groups are preferred, and specific examples include various alkylalkylene groups, including alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; alkyltrimethylene groups such as —$CH(CH_3)CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—. As the alkyl group within the alkylalkylene group, a linear alkyl group of 1 to 5 carbon atoms is preferable.

The linear or branched aliphatic hydrocarbon group (chain-like aliphatic hydrocarbon group) may or may not have a substituent. Examples of the substituent include a fluorine atom, a fluorinated alkyl group of 1 to 5 carbon atoms, and an oxygen atom (=O).

As examples of the hydrocarbon group containing a ring in the structure thereof, a cyclic aliphatic hydrocarbon group (a group in which two hydrogen atoms have been removed from an aliphatic hydrocarbon ring), and a group in which the cyclic aliphatic hydrocarbon group is bonded to the terminal of the aforementioned chain-like aliphatic hydrocarbon group or interposed within the aforementioned chain-like aliphatic hydrocarbon group, can be given.

The cyclic aliphatic hydrocarbon group preferably has 3 to 20 carbon atoms, and more preferably 3 to 12 carbon atoms.

The cyclic aliphatic hydrocarbon group may be either a polycyclic group or a monocyclic group. As the monocyclic group, a group in which two hydrogen atoms have been removed from a monocycloalkane of 3 to 6 carbon atoms is preferable. Examples of the monocycloalkane include cyclopentane and cyclohexane.

As the polycyclic group, a group in which two hydrogen atoms have been removed from a polycycloalkane of 7 to 12 carbon atoms is preferable. Examples of the polycycloalkane include adamantane, norbornane, isobornane, tricyclodecane and tetracyclododecane.

The cyclic aliphatic hydrocarbon group may or may not have a substituent. Examples of the substituent include an alkyl group of 1 to 5 carbon atoms, a fluorine atom, a fluorinated alkyl group of 1 to 5 carbon atoms, and an oxygen atom (=O).

Examples of the aforementioned aromatic hydrocarbon group include a divalent aromatic hydrocarbon group in which one hydrogen atom has been removed from a benzene ring of a monovalent aromatic hydrocarbon group such as a phenyl group, a biphenyl group, a fluorenyl group, a naphthyl group, an anthryl group or a phenanthryl group; an aromatic hydrocarbon group in which part of the carbon atoms constituting the ring of the aforementioned divalent aromatic hydrocarbon group has been substituted with a hetero atom such as an oxygen atom, a sulfur atom or a nitrogen atom; and an aromatic hydrocarbon group in which one hydrogen atom has been removed from a benzene ring of an arylalkyl group such as a benzyl group, a phenethyl group, a 1-naphthylmethyl group, a 2-naphthylmethyl group, a 1-naphthylethyl group or a 2-naphthylethyl group.

The aromatic hydrocarbon group may or may not have a substituent. Examples of the substituent include an alkyl group of 1 to 5 carbon atoms, a fluorine atom, a fluorinated alkyl group of 1 to 5 carbon atoms, and an oxygen atom (=O).

With respect to a "divalent linking group containing a hetero atom", a hetero atom is an atom other than carbon and hydrogen, and examples thereof include an oxygen atom, a nitrogen atom, a sulfur atom and a halogen atom.

Specific examples of the divalent linking group containing a hetero atom include —O—, —C(=O)—, —C(=O)—O—, a carbonate bond (—O—C(=O)—O—), —NH—, —$NR^{05}$— ($R^{05}$ represents an alkyl group), —NH—C(=O)—, and =N—. Further, a combination of any one of these "divalent linking groups containing a hetero atom" with a divalent hydrocarbon group can also be used. As examples of the divalent hydrocarbon group, the same groups as those described above for the hydrocarbon group which may have a substituent can be given, and a linear or branched aliphatic hydrocarbon group is preferable.

A may or may not have an acid dissociable portion in the structure thereof. An "acid dissociable portion" refers to a portion within the organic group which is dissociated from the organic group by the action of acid generated upon exposure. When A has an acid dissociable portion, it is preferable that the acid dissociable portion has a tertiary carbon atom.

In the present invention, as the divalent linking group for A, an alkylene group, a divalent aliphatic cyclic group or a divalent linking group containing a hetero atom is preferable.

When A represents an alkylene group, it preferably has 1 to 10 carbon atoms, more preferably 1 to 6, still more preferably 1 to 4, and most preferably 1 to 3. Specific examples of alkylene groups include the aforementioned linear alkylene groups and branched alkylene groups.

When A represents a divalent aliphatic cyclic group, as the aliphatic cyclic group, the same aliphatic cyclic groups as those described above for the "aliphatic hydrocarbon group containing a ring in the structure thereof" can be used.

As the aliphatic cyclic group, a group in which two or more hydrogen atoms have been removed from cyclopentane, cyclohexane, norbornane, isobornane, adamantane, tricyclodecane or tetracyclododecane is particularly desirable.

When A represents a divalent linking group containing a hetero atom, preferable examples of the divalent linking group containing a hetero atom include —O—, —C(=O)—O—, —C(=O)—, —O—C(=O)—O—, —C(=O)—NH—, —NH— (H may be substituted with a substituent such as an alkyl group or an acyl group), —S—, —$S(=O)_2$—, —$S(=O)_2$—O—, a group represented by the formula: -A'-O—B'— and a group represented by the formula -[A'—C(=O)—O]$_m$'—B'—. Herein, each of A' and B' independently represents a divalent hydrocarbon group which may have a substituent, and m' represents an integer of 0 to 3.

When A represents —NH—, H may be substituted with a substituent such as an alkyl group, an acyl group or the like. The substituent (an alkyl group, an acyl group or the like) preferably has 1 to 10 carbon atoms, more preferably 1 to 8, and most preferably 1 to 5.

In the group represented by the formula -A'-O—B'— or -[A'-C(=O)—O]$_m$'—B'—, each of A' and B' independently represents a divalent hydrocarbon group which may have a substituent.

Examples of divalent hydrocarbon groups for A' and B' which may have a substituent include the same groups as those described above for the "divalent hydrocarbon group which may have a substituent" usable as A.

As A', a linear aliphatic hydrocarbon group is preferable, more preferably a linear alkylene group, still more preferably a linear alkylene group of 1 to 5 carbon atoms, and a methylene group or an ethylene group is particularly desirable.

As B', a linear or branched aliphatic hydrocarbon group is preferable, and a methylene group, an ethylene group or an alkylmethylene group is more preferable. The alkyl group within the alkylmethylene group is preferably a linear alkyl group of 1 to 5 carbon atoms, more preferably a linear alkyl group of 1 to 3 carbon atoms, and most preferably a methyl group.

In the group represented by the formula -[A'—C(=O)—O]$_m$'—B'—, m represents an integer of 0 to 3, preferably an integer of 0 to 2, more preferably 0 or 1, and most preferably 1.

In the present invention, A preferably represents an ester bond [—C(=O)—O—], an ether bond (—O—), an alkylene group, a combination of these, or a single bond. Among these, an alkylene group is particularly desirable.

In formula (a0-1-1), $R^4$ represents an arylene group which may have a substituent. The $R^4$ group may have one substituent, or a plurality of substituents.

The arylene group for $R^4$ is not particularly limited. For example, an arylene group having 6 to 20 carbon atoms in which part or all of the hydrogen atoms of the aryl group may or may not be substituted can be used. For example, the arylene group may or may not be substituted with an alkyl group, an alkoxy group, a halogen atom, a hydroxy group or the like.

The arylene group is preferably an arylene group of 6 to 10 carbon atoms because it can be synthesized at a low cost. Specific examples thereof include a phenylene group and a naphthylene group. Of these, a phenylene group is particularly desirable.

The alkyl group, with which hydrogen atoms of the arylene group may be substituted, is preferably an alkyl group having 1 to 5 carbon atoms, more preferably a methyl group, an ethyl group, a propyl group, an n-butyl group, or a tert-butyl group, and most preferably a methyl group.

The alkoxy group, with which hydrogen atoms of the arylene group may be substituted, is preferably an alkoxy group having 1 to 5 carbon atoms, more preferably a methoxy group, an ethoxy group, an n-propoxy group, an iso-propoxy group, an n-butoxy group or a tert-butoxy group.

The halogen atom, with which hydrogen atoms of the arylene group may be substituted, is preferably a fluorine atom.

In formula (a0-1-1), each of $R^5$ and $R^6$ independently represents an organic group.

The organic group for $R^5$ and $R^6$ refers to a group containing a carbon atom, and may include atoms other than carbon (e.g., a hydrogen atom, an oxygen atom, a nitrogen atom, a sulfur atom, a halogen atom (such as a fluorine atom or a chlorine atom) and the like).

The organic group for $R^5$ and $R^6$ is preferably an aryl group or an alkyl group.

The aryl group for $R^5$ and $R^6$ is not particularly limited. For example, an aryl group having 6 to 20 carbon atoms in which part or all of the hydrogen atoms of the aryl group may or may not be substituted can be used. For example, the arylene group may or may not be substituted with an alkyl group, an alkoxy group, a halogen atom, a hydroxy group or the like.

The aryl group is preferably an aryl group having 6 to 10 carbon atoms because it can be synthesized at a low cost. Specific examples thereof include a phenyl group and a naphthyl group. Of these, a phenyl group is particularly desirable.

As examples of the alkyl group, alkoxy group and halogen atom with which the hydrogen atoms of the aryl group may be substituted, the same alkyl group, alkoxy group and halogen atom as those with which the arylene group for $R^4$ may be substituted can be given.

The alkyl group for $R^5$ and $R^6$ is not particularly limited and includes, for example, a linear, branched or cyclic alkyl group having 1 to 10 carbon atoms. In terms of achieving excellent resolution, the alkyl group preferably has 1 to 5 carbon atoms. Specific examples include a methyl group, an ethyl group, an n-propyl group, an isopropyl group, an n-butyl group, an isobutyl group, an n-pentyl group, a cyclopentyl group, a hexyl group, a cyclohexyl group, a nonyl group and a decyl group. Among these, a methyl group is preferable because it is excellent in resolution and can be synthesized at a low cost.

In formula (a0-1-1), $R^5$ and $R^6$ may be mutually bonded to form a ring with the sulfur atom.

In such a case, the ring including the sulfur atom is preferably a 3- to 10-membered ring, and more preferably a 5- to 7-membered ring.

The ring structure formed with the sulfur atom may include a hetero atom such as a sulfur atom or an oxygen atom (—O—, =O).

Specific examples of the ring formed include a benzene ring, a naphthalene ring, an anthracene ring, a phenanthrene ring, a fluorene ring, a triphenylene ring, a naphthacene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a quinolizine ring, a quinoline ring, a phthalazine ring, a naphthyridine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxathiin ring, a phenothiazine ring and a phenazine ring.

In formula (a0-1-1), $X^-$ represents a counteranion.

The counteranion for $X^-$ is not particularly limited, and examples thereof include an anion moiety ($R^{4\prime\prime}SO_3^-$) of the onium salt-based acid generator represented by general formula (b-1) or (b-2) described later in the explanation of the component (B), and an anion moiety represented by general formula (b-3) or (b-4) described later in the explanation of the component (B). In particular, the counteranion is preferably $R^{4\prime\prime}SO_3^-$, and more preferably a fluorinated alkylsulfonate ion of 1 to 8 carbon atoms (preferably 1 to 4 carbon atoms) or at least one member selected from those represented by general formulas (b1) to (b8) described later.

In formula (a0-2-1), each of $R^{f1}$ and $R^{f2}$ independently represents a hydrogen atom, an alkyl group, a fluorine atom or a fluorinated alkyl group, provided that at least one of $R^{f1}$ and $R^{f2}$ represents a fluorine atom or a fluorinated alkyl group.

The alkyl group for $R^{f1}$ and $R^{f2}$ is preferably an alkyl group of 1 to 5 carbon atoms, and specific examples thereof include a methyl group, an ethyl group, a propyl group, an isopropyl group, an n-butyl group, an isobutyl group, a tert-butyl group, a pentyl group, an isopentyl group and a neopentyl group.

The fluorinated alkyl group for $R^{f1}$ and $R^{f2}$ is preferably a group in which part or all of the hydrogen atoms within the aforementioned alkyl group for $R^{f1}$ and $R^{f2}$ have been substituted with a fluorine atom.

In the present invention, $R^{f1}$ and $R^{f2}$ is preferably a fluorine atom.

In formula (a0-2-1), n represents an integer of 1 to 8, preferably an integer of 1 to 4, and more preferably 1 or 2.

In formula (a0-2-1), $M^{m+}$ represents a countercation, and m represents an integer of 1 to 3.

Examples of the countercation for $M^{m+}$ include a metal cation and an onium cation.

Examples of the metal ion for $M^{m+}$ include alkali metal ions such as sodium, potassium and lithium; alkaline earth metal ions such as magnesium and calcium; an iron ion; and an aluminum ion. Among these examples, in terms of ease in ion exchange to a sulfonate, a sodium ion, a potassium ion or a lithium ion is preferable.

Examples of the onium cation for $M^{m+}$ include a sulfonium cation, an iodonium cation, a phosphonium cation, a diazonium cation, an ammonium cation and a pyridinium cation. Among these, a cation moiety which is the same as those of an onium salt represented by general formula (b-1) or (b-2) described later in the explanation of the component (B) is preferable.

Specific examples of the group represented by formula (a0-1-1) or (a0-2-1) are shown below.

[Chemical Formula 2]

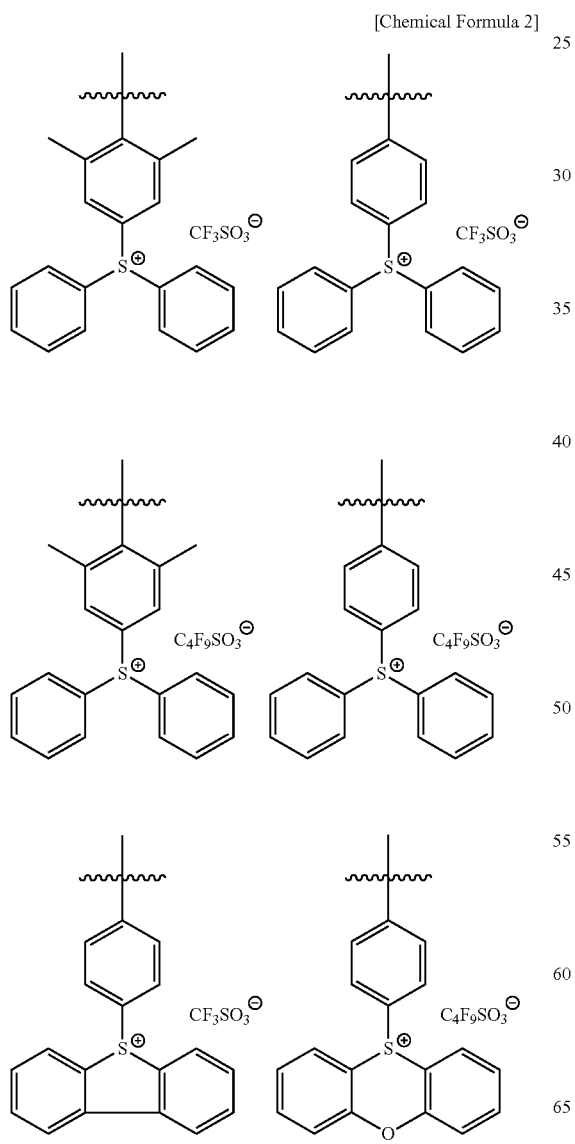

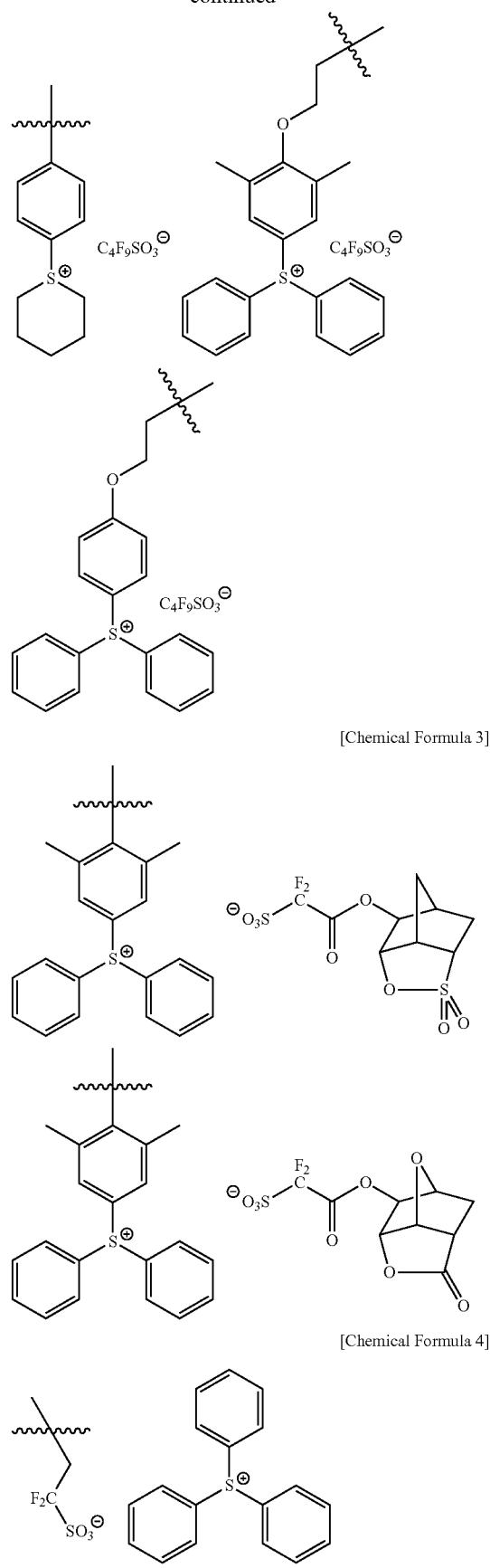

[Chemical Formula 3]

[Chemical Formula 4]

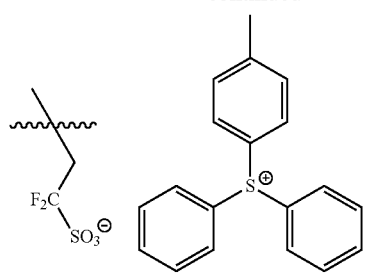
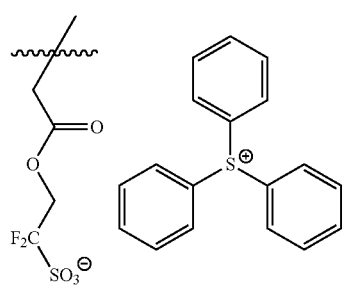
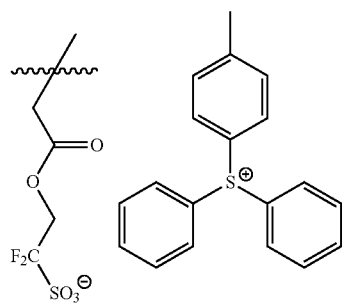
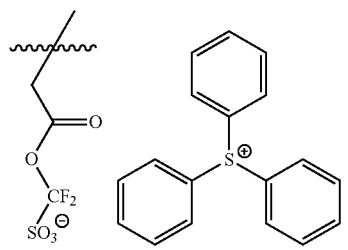
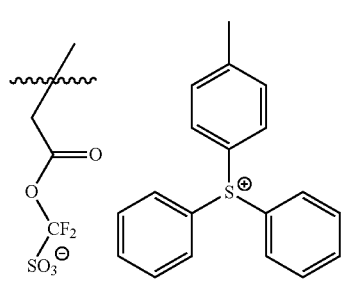
[Chemical Formula 5]
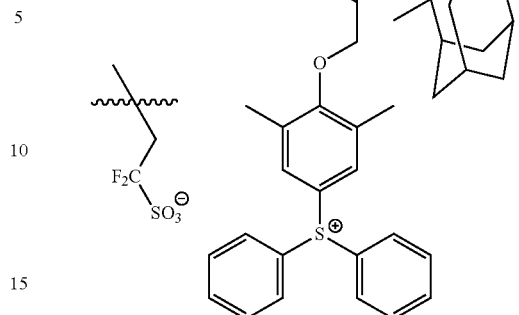
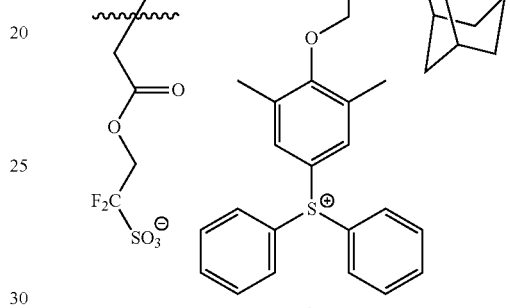
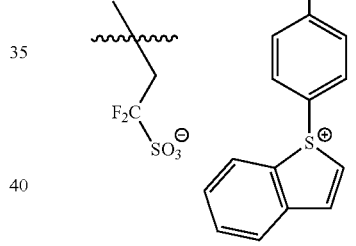
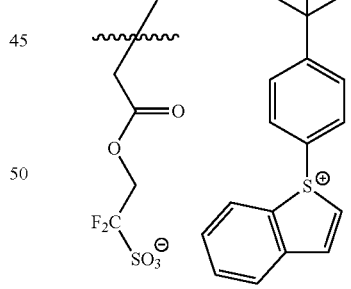
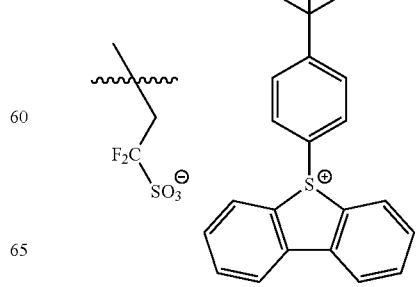

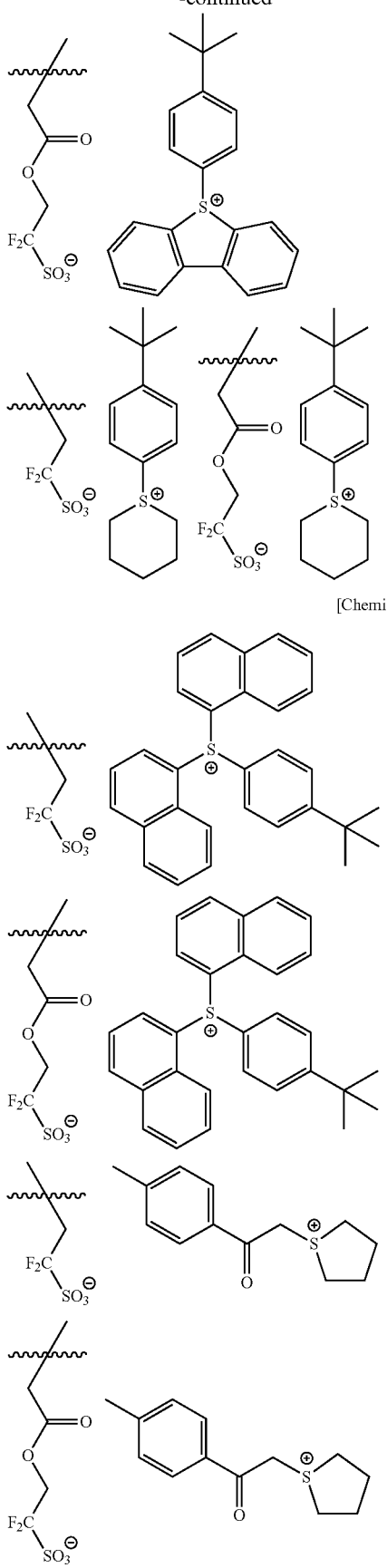
[Chemical Formula 6]
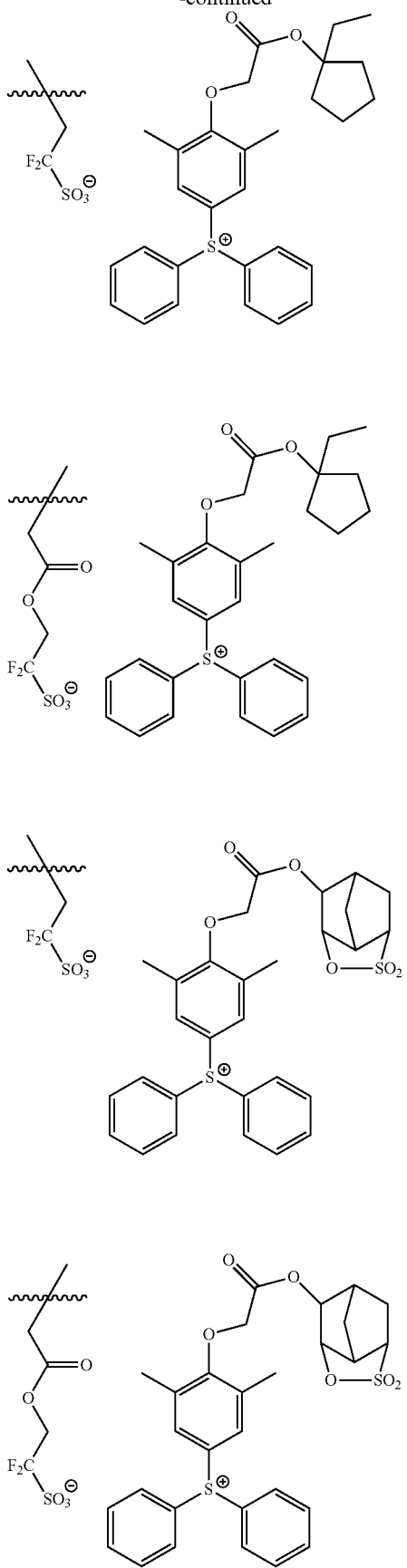

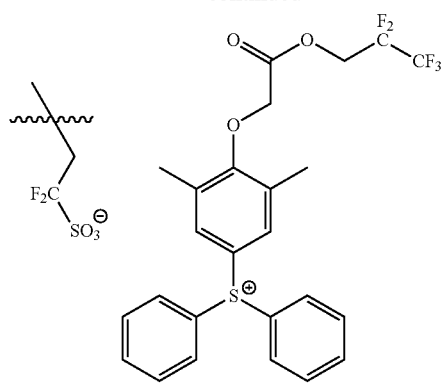
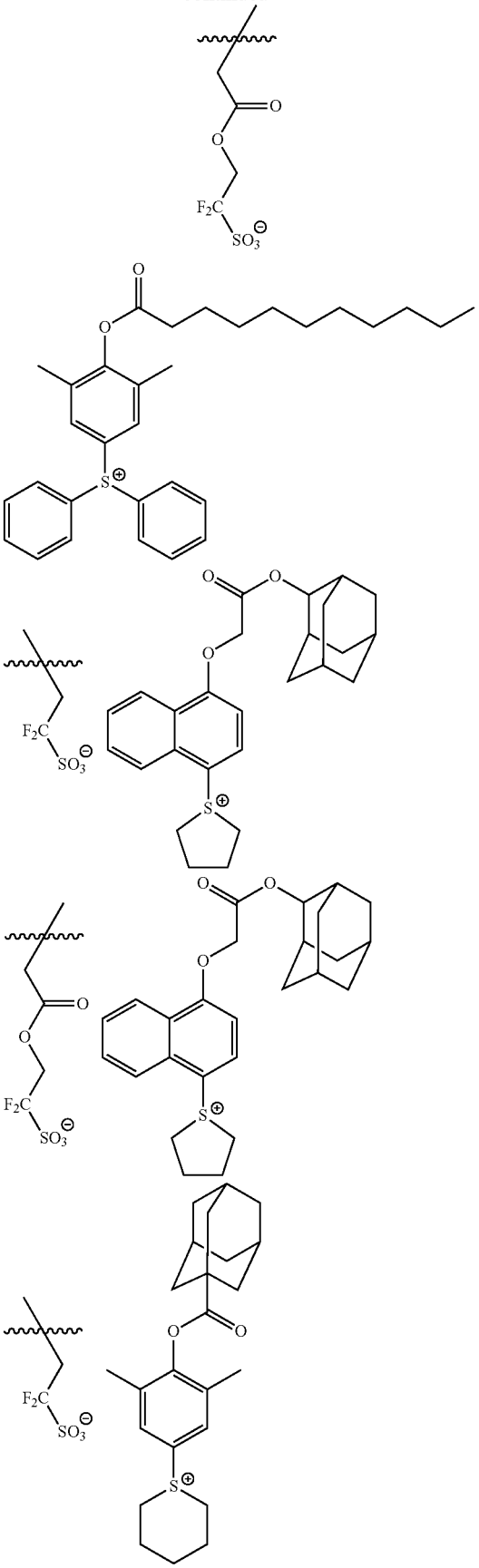
[Chemical Formula 7]

-continued

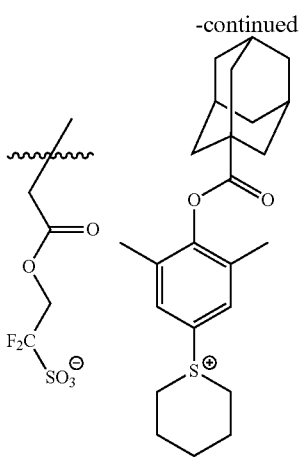

In the present invention, in terms of acid strength, sensitivity, resolution and roughness, the structural unit (a0) is preferably a structural unit represented by general formula (a0-1) shown below or a structural unit represented by general formula (a0-2) shown below.

[Chemical Formula 8]

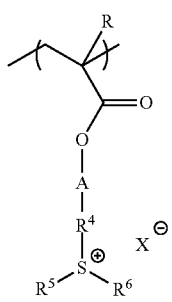
(a0-1)

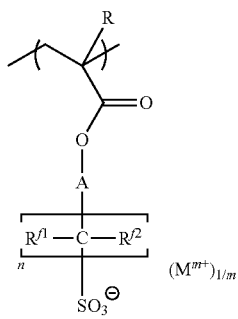
(a0-2)

In the formulas, R represents a hydrogen atom, an alkyl group of 1 to 5 carbon atoms or a halogenated alkyl group of 1 to 5 carbon atoms; A represents a single bond or a divalent linking group; $R^4$ represents an arylene group which may have a substituent; each of $R^5$ and $R^6$ independently represents an organic group, wherein $R^5$ and $R^6$ may be mutually bonded to form a ring with the sulfur atom; $X^-$ represents a counteranion; each of $R^{f1}$ and $R^{f2}$ independently represents a hydrogen atom, an alkyl group, a fluorine atom or a fluorinated alkyl group, provided that at least one of $R^{f1}$ and $R^{f2}$ represents a fluorine atom or a fluorinated alkyl group; n represents an integer of 1 to 8; $M^{m+}$ represents a countercation; and m represents an integer of 1 to 3.

In formulae (a0-1) and (a0-2), R is the same as defined above, and is preferably a hydrogen atom or a methyl group.

In formulae (a0-1) and (a0-2), A, $R^4$, $R^5$, $R^6$, $X^-$, $R^{f1}$, $R^{f2}$, n, $M^{m+}$ and m are respectively the same as defined for A, $R^4$, $R^5$, $R^6$, $X^-$, $R^{f1}$, $R^{f2}$, n, $M^{m+}$ and m in the aforementioned formulas (a0-1-1) and (a0-2-1).

In the component (A1), as the structural unit (a0), one type of structural unit may be used alone, or two or more types of structural units may be used in combination.

In the component (A1), the amount of the structural unit (a0) based on the combined total of all structural units constituting the component (A1) is preferably 1 to 40 mol %, more preferably 1 to 35 mol %, and still more preferably 3 to 30 mol %. By ensuring the lower limit, various lithography properties, e.g., roughness is reduced. On the other hand, when the amount of the structural unit (a0) is no more than the upper limit of the above-mentioned range, a good balance can be achieved with the other structural units.

(Structural Unit (a1))

The structural unit (a1) is a structural unit derived from an acrylate ester which may have the hydrogen atom bonded to the carbon atom on the α-position substituted with a substituent and contains an acid decomposable group which exhibits increased polarity by the action of acid.

The term "acid decomposable group" refers to a group in which at least a part of the bond within the structure thereof is cleaved by the action of acid generated from the component (A1) (structural unit (a0)) upon exposure.

Examples of acid decomposable groups which exhibit increased polarity by the action of an acid include groups which are decomposed by the action of an acid to form a polar group.

Examples of the polar group include a carboxy group, a hydroxy group, an amino group and a sulfo group (—$SO_3H$). Among these, a polar group containing —OH in the structure thereof (hereafter, referred to as "OH-containing polar group") is preferable, a carboxy group or a hydroxy group is more preferable, and a carboxy group is particularly desirable.

More specifically, as an example of an acid decomposable group, a group in which the aforementioned polar group has been protected with an acid dissociable group (such as a group in which the hydrogen atom of the OH-containing polar group has been protected with an acid dissociable group) can be given.

An "acid dissociable group" is a group in which at least the bond between the acid dissociable group and the adjacent carbon atom is cleaved by the action of acid generated from the component (A1) (structural unit (a0)) upon exposure. It is necessary that the acid dissociable group that constitutes the acid decomposable group is a group which exhibits a lower polarity than the polar group generated by the dissociation of the acid dissociable group. Thus, when the acid dissociable group is dissociated by the action of acid, a polar group exhibiting a higher polarity than that of the acid dissociable group is generated, thereby increasing the polarity. As a result, the polarity of the entire component (A1) is increased. When the polarity is increased, the solubility in a developing solution containing an organic solvent (organic developing solution) is relatively decreased.

The acid dissociable group is not particularly limited, and any of the groups that have been conventionally proposed as acid dissociable groups for the base resins of chemically amplified resists can be used. Generally, groups that form either a cyclic or chain-like tertiary alkyl ester with the carboxyl group of the (meth)acrylic acid, and acetal-type acid dissociable groups such as alkoxyalkyl groups are widely known.

Here, a tertiary alkyl ester describes a structure in which an ester is formed by substituting the hydrogen atom of a carboxyl group with a chain-like or cyclic tertiary alkyl group, and a tertiary carbon atom within the chain-like or cyclic tertiary alkyl group is bonded to the oxygen atom at the terminal of the carbonyloxy group (—C(=O)—O—). In this tertiary alkyl ester, the action of acid causes cleavage of the bond between the oxygen atom and the tertiary carbon atom, thereby forming a carboxy group.

The chain-like or cyclic alkyl group may have a substituent.

Hereafter, for the sake of simplicity, groups that exhibit acid dissociability as a result of the formation of a tertiary alkyl ester with a carboxyl group are referred to as "tertiary alkyl ester-type acid dissociable groups".

Examples of tertiary alkyl ester-type acid dissociable groups include aliphatic branched, acid dissociable groups and aliphatic cyclic group-containing acid dissociable groups.

The term "aliphatic branched" refers to a branched structure having no aromaticity. The "aliphatic branched, acid dissociable group" is not limited to be constituted of only carbon atoms and hydrogen atoms (not limited to hydrocarbon groups), but is preferably a hydrocarbon group. Further, the "hydrocarbon group" may be either saturated or unsaturated, but is preferably saturated.

As an example of the aliphatic branched, acid dissociable group, for example, a group represented by the formula —C($R^{71}$)($R^{72}$)($R^{73}$) can be given. (in the formula, each of $R^{71}$ to $R^{73}$ independently represents a linear alkyl group of 1 to 5 carbon atoms). The group represented by the formula —C($R^{71}$)($R^{72}$)($R^{73}$) preferably has 4 to 8 carbon atoms, and specific examples include a tert-butyl group, a 2-methyl-2-butyl group, a 2-methyl-2-pentyl group and a 3-methyl-3-pentyl group.

Among these, a tert-butyl group is particularly desirable.

The term "aliphatic cyclic group" refers to a monocyclic group or polycyclic group that has no aromaticity.

In the "aliphatic cyclic group-containing acid dissociable group", the "aliphatic cyclic group" may or may not have a substituent. Examples of the substituent include an alkyl group of 1 to 5 carbon atoms, an alkoxy group of 1 to 5 carbon atoms, a fluorine atom, a fluorinated alkyl group of 1 to 5 carbon atoms, and an oxygen atom (=O).

The basic ring of the "aliphatic cyclic group" exclusive of substituents is not limited to be constituted from only carbon and hydrogen (not limited to hydrocarbon groups), but is preferably a hydrocarbon group. Further, the "hydrocarbon group" may be either saturated or unsaturated, but is preferably saturated.

The aliphatic cyclic group may be either a monocyclic group or a polycyclic group.

As such aliphatic cyclic groups, groups in which one or more hydrogen atoms have been removed from a monocycloalkane or a polycycloalkane such as a bicycloalkane, tricycloalkane or tetracycloalkane which may or may not be substituted with a lower alkyl group, a fluorine atom or a fluorinated alkyl group, may be used. Specific examples of aliphatic cyclic hydrocarbon groups include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane. In these aliphatic cyclic hydrocarbon groups, part of the carbon atoms constituting the ring may be replaced with an ethereal oxygen atom (—O—).

Examples of aliphatic cyclic group-containing acid dissociable groups include (i) a monovalent aliphatic cyclic group in which a substituent (a group or an atom other than hydrogen) is bonded to the carbon atom on the ring skeleton to which an atom adjacent to the acid dissociable group (e.g., "—O—" within "—C(=O)—O— group") is bonded to form a tertiary carbon atom; and (ii) a group which has a branched alkylene group containing a tertiary carbon atom, and a monovalent aliphatic cyclic group to which the tertiary carbon atom is bonded.

In the group (i), as the substituent bonded to the carbon atom to which an atom adjacent to the acid dissociable group on the ring skeleton of the aliphatic cyclic group, an alkyl group can be mentioned. Examples of the alkyl group include the same groups as those represented by $R^{14}$ in formulas (1-1) to (1-9) described later.

Specific examples of the group (i) include groups represented by general formulas (1-1) to (1-9) shown below.

Specific examples of the group (ii) include groups represented by general formulas (2-1) to (2-6) shown below.

[Chemical Formula 9]

(1-1)

(1-2)

(1-3)

(1-4)

(1-5)

(1-6)

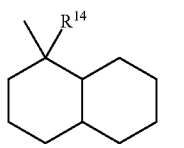
(1-7)

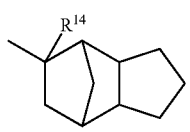
(1-8)

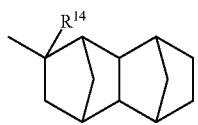
(1-9)

In the formulas above, $R^{14}$ represents an alkyl group; and g represents an integer of 0 to 8.

[Chemical Formula 10]

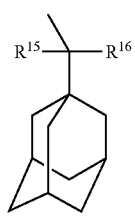
(2-1)

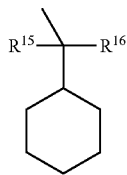
(2-2)

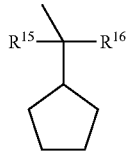
(2-3)

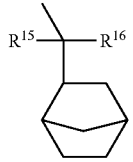
(2-4)

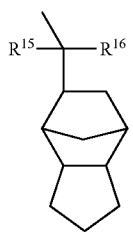
(2-5)

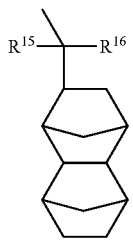
(2-6)

In the formulas above, each of $R^{15}$ and $R^{16}$ independently represents an alkyl group.

In formulas (1-1) to (1-9), the alkyl group for $R^{14}$ may be linear, branched or cyclic, and is preferably linear or branched.

The linear alkyl group preferably has 1 to 5 carbon atoms, more preferably 1 to 4, and still more preferably 1 or 2. Specific examples include a methyl group, an ethyl group, an n-propyl group, an n-butyl group and an n-pentyl group. Among these, a methyl group, an ethyl group or an n-butyl group is preferable, and a methyl group or an ethyl group is more preferable.

The branched alkyl group preferably has 3 to 10 carbon atoms, and more preferably 3 to 5. Specific examples of such branched alkyl groups include an isopropyl group, an isobutyl group, a tert-butyl group, an isopentyl group and a neopentyl group, and an isopropyl group is particularly desirable.

g is preferably an integer of 0 to 3, more preferably 1 to 3, and still more preferably 1 or 2.

In formulas (2-1) to (2-6), as the alkyl group for $R^{15}$ and $R^{16}$, the same alkyl groups as those for $R^{14}$ can be used.

In formulas (1-1) to (1-9) and (2-1) to (2-6), part of the carbon atoms constituting the ring may be replaced with an ethereal oxygen atom (—O—).

Further, in formulas (1-1) to (1-9) and (2-1) to (2-6), one or more of the hydrogen atoms bonded to the carbon atoms constituting the ring may be substituted with a substituent. Examples of the substituent include an alkyl group of 1 to 5 carbon atoms, a fluorine atom and a fluorinated alkyl group.

An "acetal-type acid dissociable group" generally substitutes a hydrogen atom at the terminal of an OH-containing polar group such as a carboxy group or hydroxyl group, so as to be bonded with an oxygen atom. When acid is generated upon exposure, the generated acid acts to break the bond between the acetal-type acid dissociable group and the oxygen atom to which the acetal-type, acid dissociable group is bonded, thereby forming an OH-containing polar group such as a carboxy group or a hydroxy group.

Examples of acetal-type acid dissociable groups include groups represented by general formula (p1) shown below.

[Chemical Formula 11]

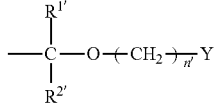
(p1)

In the formula, $R^{1'}$ and $R^{2'}$ each independently represent a hydrogen atom or an alkyl group of 1 to 5 carbon atoms; n' represents an integer of 0 to 3; and Y represents an alkyl group of 1 to 5 carbon atoms or an aliphatic cyclic group.

In general formula (p1), n' is preferably an integer of 0 to 2, more preferably 0 or 1, and most preferably 0.

As the lower alkyl group for $R^{1\prime}$ and $R^{2\prime}$, the same lower alkyl groups as those described above the alkyl groups as the substituent which may be bonded to the carbon atom on the α-position of the aforementioned α-substituted alkylester can be used, although a methyl group or ethyl group is preferable, and a methyl group is particularly desirable.

In the present invention, it is preferable that at least one of $R^{1\prime}$ and $R^{2\prime}$ be a hydrogen atom. That is, it is preferable that the acid dissociable group (p1) is a group represented by general formula (p1-1) shown below.

[Chemical Formula 12]

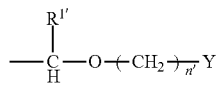

(p1-1)

In the formula, $R^{1\prime}$, n' and Y are the same as defined above.

As the alkyl group for Y, the same alkyl groups as those described above the for the substituent which may be bonded to the carbon atom on the α-position of the aforementioned α-substituted alkylester can be mentioned.

As the aliphatic cyclic group for Y, any of the aliphatic monocyclic/polycyclic groups which have been proposed for conventional ArF resists and the like can be appropriately selected for use. For example, the same aliphatic cyclic groups described above in connection with the "acid dissociable group containing an aliphatic cyclic group" can be used.

Further, as the acetal-type, acid dissociable group, groups represented by general formula (p2) shown below can also be used.

[Chemical Formula 13]

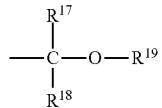

(p2)

In the formula, $R^{17}$ and $R^{18}$ each independently represent a linear or branched alkyl group or a hydrogen atom; and $R^{19}$ represents a linear, branched or cyclic alkyl group; or $R^{17}$ and $R^{19}$ each independently represents a linear or branched alkylene group, and the terminal of $R^{17}$ is bonded to the terminal of $R^{19}$ to form a ring.

The alkyl group for $R^{17}$ and $R^{18}$ preferably has 1 to 15 carbon atoms, and may be either linear or branched. As the alkyl group, an ethyl group or a methyl group is preferable, and a methyl group is most preferable.

It is particularly desirable that either one of $R^{17}$ and $R^{18}$ be a hydrogen atom, and the other be a methyl group.

$R^{19}$ represents a linear, branched or cyclic alkyl group which preferably has 1 to 15 carbon atoms, and may be any of linear, branched or cyclic.

When $R^{19}$ represents a linear or branched alkyl group, it is preferably an alkyl group of 1 to 5 carbon atoms, more preferably an ethyl group or methyl group, and most preferably an ethyl group.

When $R^{19}$ represents a cycloalkyl group, it preferably has 4 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane. Among these, a group in which one or more hydrogen atoms have been removed from adamantane is preferable.

In general formula (p2) above, $R^{17}$ and $R^{19}$ may each independently represent a linear or branched alkylene group (preferably an alkylene group of 1 to 5 carbon atoms), and the terminal of $R^{19}$ may be bonded to the terminal of $R^{17}$.

In such a case, a cyclic group is formed by $R^{17}$, $R^{19}$, the oxygen atom having $R^{19}$ bonded thereto, and the carbon atom having the oxygen atom and $R^{17}$ bonded thereto. Such a cyclic group is preferably a 4- to 7-membered ring, and more preferably a 4- to 6-membered ring. Specific examples of the cyclic group include tetrahydropyranyl group and tetrahydrofuranyl group.

More specific examples of the structural unit (a1) include a structural unit represented by general formula (a1-0-1) shown below and a structural unit represented by general formula (a1-0-2) shown below.

[Chemical Formula 14]

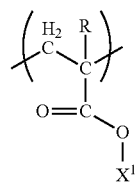

(a1-0-1)

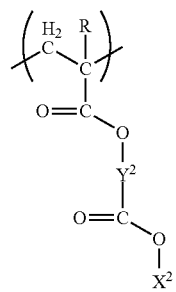

(a1-0-2)

In the formulae, R represents a hydrogen atom, an alkyl group of 1 to 5 carbon atoms or a halogenated alkyl group of 1 to 5 carbon atoms; $X^1$ represents an acid dissociable group; $Y^2$ represents a divalent linking group; and $X^2$ represents an acid dissociable group.

In general formula (a1-0-1), the alkyl group and the halogenated alkyl group for R are respectively the same as defined for the alkyl group and the halogenated alkyl group for the substituent which may be bonded to the carbon atom on the α-position of the aforementioned substituted acrylate ester. R is preferably a hydrogen atom, an alkyl group of 1 to 5 carbon atoms or a fluorinated alkyl group of 1 to 5 carbon atoms, and most preferably a hydrogen atom or a methyl group.

$X^1$ is not particularly limited as long as it is an acid dissociable group. Examples thereof include the aforementioned tertiary alkyl ester-type acid dissociable groups and acetal-type acid dissociable groups, and tertiary alkyl ester-type acid dissociable groups are preferable.

In general formula (a1-0-2), R is the same as defined above.

$X^2$ is the same as defined for $X^1$ in general formula (a1-0-1).

The divalent linking group for $Y^2$ is not particularly limited, and preferable examples thereof include a divalent hydrocarbon group which may have a substituent and a divalent linking group containing a hetero atom.

A hydrocarbon "has a substituent" means that part or all of the hydrogen atoms within the hydrocarbon group is substituted with a substituent (a group or an atom other than hydrogen).

The hydrocarbon group may be either an aliphatic hydrocarbon group or an aromatic hydrocarbon group.

An "aliphatic hydrocarbon group" refers to a hydrocarbon group that has no aromaticity.

The divalent aliphatic hydrocarbon group as the divalent hydrocarbon group for $Y^2$ may be either saturated or unsaturated. In general, the divalent aliphatic hydrocarbon group is preferably saturated.

As specific examples of the aliphatic hydrocarbon group, a linear or branched aliphatic hydrocarbon group, and an aliphatic hydrocarbon group containing a ring in the structure thereof can be given.

The linear or branched aliphatic hydrocarbon group preferably has 1 to 10 carbon atoms, more preferably 1 to 6, still more preferably 1 to 4, and most preferably 1 to 3.

As the linear aliphatic hydrocarbon group, a linear alkylene group is preferable. Specific examples thereof include a methylene group [—$CH_2$—], an ethylene group [—$(CH_2)_2$—], a trimethylene group [—$(CH_2)_3$—], a tetramethylene group [—$(CH_2)_4$—] and a pentamethylene group [—$(CH_2)_5$—].

As the branched aliphatic hydrocarbon group, branched alkylene groups are preferred, and specific examples include various alkylalkylene groups, including alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; alkyltrimethylene groups such as —$CH(CH_3)CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—. As the alkyl group within the alkylalkylene group, a linear alkyl group of 1 to 5 carbon atoms is preferable.

The linear or branched aliphatic hydrocarbon group may or may not have a substituent. Examples of the substituent include a fluorine atom, a fluorinated alkyl group of 1 to 5 carbon atoms, and an oxygen atom (=O).

As examples of the hydrocarbon group containing a ring in the structure thereof, an alicyclic hydrocarbon group (a group in which two hydrogen atoms have been removed from an aliphatic hydrocarbon ring), a group in which the alicyclic hydrocarbon group is bonded to the terminal of the aforementioned chain-like aliphatic hydrocarbon group, and a group in which the alicyclic group is interposed within the aforementioned linear or branched aliphatic hydrocarbon group, can be given. As the linear or branched aliphatic hydrocarbon group, the same groups as those described above can be used.

The alicyclic hydrocarbon group preferably has 3 to 20 carbon atoms, and more preferably 3 to 12 carbon atoms.

The alicyclic hydrocarbon group may be either a monocyclic group or a polycyclic group. As the monocyclic aliphatic hydrocarbon group, a group in which 2 hydrogen atoms have been removed from a monocycloalkane is preferable. The monocycloalkane preferably has 3 to 6 carbon atoms, and specific examples thereof include cyclopentane and cyclohexane. As the polycyclic group, a group in which two hydrogen atoms have been removed from a polycycloalkane is preferable, and the polycyclic group preferably has 7 to 12 carbon atoms. Examples of the polycycloalkane include adamantane, norbornane, isobornane, tricyclodecane and tetracyclododecane.

The alicyclic hydrocarbon group may or may not have a substituent. Examples of the substituent include an alkyl group of 1 to 5 carbon atoms, a fluorine atom, a fluorinated alkyl group of 1 to 5 carbon atoms, and an oxygen atom (=O).

The aromatic hydrocarbon group is a hydrocarbon group having an aromatic ring.

The aromatic hydrocarbon group as the divalent hydrocarbon group for $Y^2$ preferably has 3 to 30 carbon atoms, more preferably 5 to 30, still more preferably 5 to 20, still more preferably 6 to 15, and most preferably 6 to 10. Here, the number of carbon atoms within a substituent(s) is not included in the number of carbon atoms of the aromatic hydrocarbon group.

Examples of the aromatic ring contained in the aromatic hydrocarbon group include aromatic hydrocarbon rings, such as benzene, biphenyl, fluorene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom.

Specific examples of the aromatic hydrocarbon group include a group in which two hydrogen atoms have been removed from the aforementioned aromatic hydrocarbon ring (arylene group); and a group in which one hydrogen atom has been removed from the aforementioned aromatic hydrocarbon ring (aryl group) and one hydrogen atom has been substituted with an alkylene group (such as a benzyl group, a phenethyl group, a 1-naphthylmethyl group, a 2-naphthylmethyl group, a 1-naphthylethyl group, or a 2-naphthylethyl group). The alkylene group (alkyl chain within the arylalkyl group) preferably has 1 to 4 carbon atom, more preferably 1 or 2, and most preferably 1.

The aromatic hydrocarbon group may or may not have a substituent. For example, the hydrogen atom bonded to the aromatic hydrocarbon ring within the aromatic hydrocarbon group may be substituted with a substituent. Examples of substituents include an alkyl group, an alkoxy group, a halogen atom, a halogenated alkyl group, a hydroxyl group and an oxygen atom (=O).

The alkyl group as the substituent is preferably an alkyl group of 1 to 5 carbon atoms, and a methyl group, an ethyl group, a propyl group, an n-butyl group or a tert-butyl group is particularly desirable.

The alkoxy group as the substituent is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom as the substituent for the aromatic hydrocarbon group include a fluorine atom, a chlorine atom, a bromine atom and an iodine atom, and a fluorine atom is preferable.

Examples of the halogenated alkyl group for the substituent include groups in which part or all of the hydrogen atoms within the aforementioned alkyl groups has been substituted with the aforementioned halogen atoms.

With respect to a "divalent linking group containing a hetero atom", a hetero atom is an atom other than carbon and hydrogen, and examples thereof include an oxygen atom, a nitrogen atom, a sulfur atom and a halogen atom.

Examples of the divalent linking group containing a hetero atom include —O—, —C(=O)—O—, —C(=O)—, —O—C(=O)—O—, —C(=O)—NH—, —NH— (H may be substituted with a substituent such as an alkyl group or an acyl group), —S—, —S(=O)$_2$—, —S(=O)$_2$—O—, —NH—C(=O)—, =N—, and a group represented by general formula —Y$^{21}$—O—Y$^{22}$—, —[Y$^{21}$—C(=O)—O]$_{m'}$—Y$^{22}$— or —Y$^{21}$—O—C(=)—Y$^{22}$— [wherein Y$^{21}$ and Y$^{22}$ each independently represents a divalent hydrocarbon group which may have a substituent, O represents an oxygen atom, and m' represents an integer of 0 to 3.]

When Y$^2$ represents —NH—, H may be substituted with a substituent such as an alkyl group, an aryl group (an aromatic group) or the like. The substituent (an alkyl group, an aryl group or the like) preferably has 1 to 10 carbon atoms, more preferably 1 to 8, and most preferably 1 to 5.

In formula —Y$^{21}$—O—Y$^{22}$—, —[Y$^{21}$—C(=O)—O]$_{m'}$—Y$^{22}$— or —Y$^{21}$—O-C(=O)—Y$^{22}$—, Y$^{21}$ and Y$^{22}$ each independently represents a divalent hydrocarbon group which may have a substituent. As the divalent hydrocarbon group, the same groups as those described above for the "divalent hydrocarbon group which may have a substituent" for Y$^2$ can be mentioned.

As Y$^{21}$, a linear aliphatic hydrocarbon group is preferable, more preferably a linear alkylene group, still more preferably a linear alkylene group of 1 to 5 carbon atoms, and a methylene group or an ethylene group is particularly desirable.

As Y$^{22}$, a linear or branched aliphatic hydrocarbon group is preferable, and a methylene group, an ethylene group or an alkylmethylene group is more preferable. The alkyl group within the alkylmethylene group is preferably a linear alkyl group of 1 to 5 carbon atoms, more preferably a linear alkyl group of 1 to 3 carbon atoms, and most preferably a methyl group.

In the group represented by the formula —[Y$^{21}$—C(=O)—O]$_{m'}$—Y$^{22}$—, m' represents an integer of 0 to 3, preferably an integer of 0 to 2, more preferably 0 or 1, and most preferably 1. Namely, it is particularly desirable that the group represented by the formula —[Y$^{21}$—C(=O)—O]$_{m'}$—Y$^{22}$— is a group represented by the formula —Y$^{21}$—C(=O)—O—Y$^{22}$—. Among these, a group represented by the formula —(CH$_2$)$_{a'}$—C(=O)—O—(CH$_2$)$_{b'}$— is preferable. In the formula, a' is an integer of 1 to 10, preferably an integer of 1 to 8, more preferably an integer of 1 to 5, still more preferably 1 or 2, and most preferably 1. b' is an integer of 1 to 10, preferably an integer of 1 to 8, more preferably an integer of 1 to 5, still more preferably 1 or 2, and most preferably 1.

As the divalent linking group containing a hetero atom, a linear group containing an oxygen atom as the hetero atom e.g., a group containing an ether bond or an ester bond is preferable, and a group represented by the aforementioned formula —Y$^{21}$—O—Y$^{22}$—, —[Y$^{21}$—C(=O)—O]$_{m'}$—Y$^{22}$— or —Y$^{21}$—O-C(=O)—Y$^{22}$— is more preferable.

Among the aforementioned examples, as the divalent linking group for Y$^2$, an alkylene group, a divalent alicyclic hydrocarbon group or a divalent linking group containing a hetero atom is particularly desirable. Among these, an alkylene group or a divalent linking group containing a hetero atom is more preferable.

Specific examples of the structural unit represented by general formula (a1-0-1) and the structural unit represented by general formula (a1-0-2) include structural units represented by general formulas (a1-1) to (a1-4) shown below.

[Chemical Formula 15]

(a1-1)

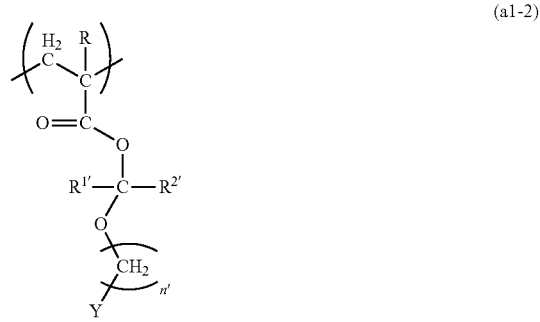

(a1-2)

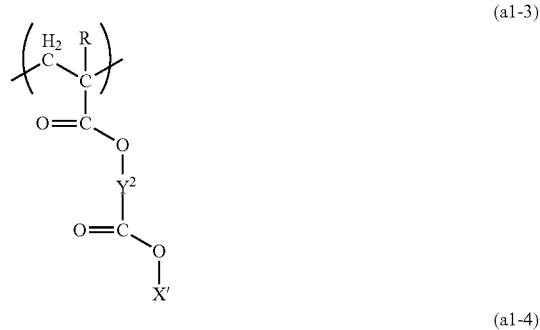

(a1-3)

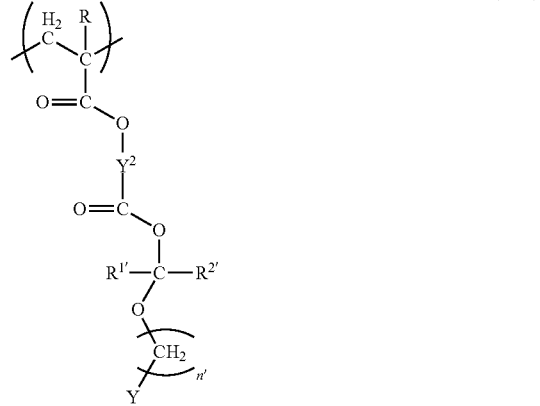

(a1-4)

In the formulas, R, R$^{1'}$, R$^{2'}$, n', Y and Y$^2$ are the same as defined above; and X' represents a tertiary alkyl ester-type acid dissociable group.

In the formulas, the tertiary alkyl ester-type acid dissociable group for X' include the same tertiary alkyl ester-type acid dissociable groups as those described above.

As $R^{1\prime}$, $R^{2\prime}$, n and Y are respectively the same as defined for $R^{1\prime}$, $R^{2\prime}$, n' and Y in general formula (p1) described above in connection with the "acetal-type acid dissociable group".

As examples of $Y^2$, the same groups as those described above for $Y^2$ in general formula (a1-0-2) can be given.

Specific examples of structural units represented by general formula (a1-1) to (a1-4) are shown below.

In the formulae shown below, $R^\alpha$ presents a hydrogen atom, a methyl group or a trifluoromethyl group.

[Chemical Formula 16]

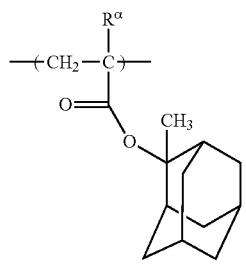 (a1-1-1)

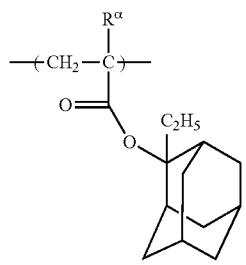 (a1-1-2)

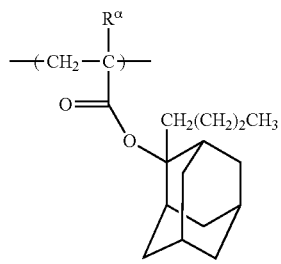 (a1-1-3)

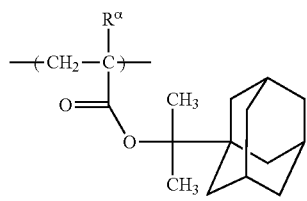 (a1-1-4)

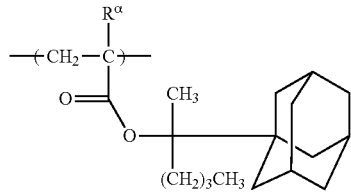 (a1-1-5)

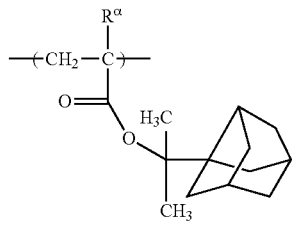 (a1-1-6)

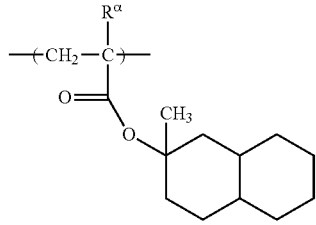 (a1-1-7)

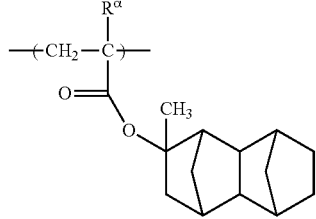 (a1-1-8)

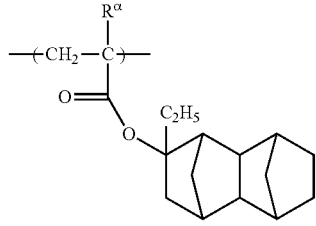 (a1-1-9)

[Chemical Formula 17]

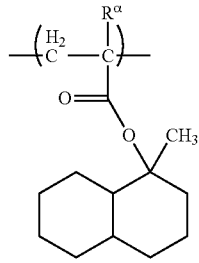 (a1-1-10)

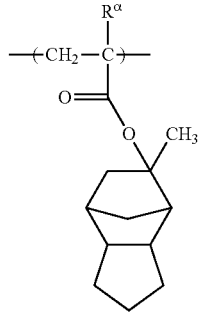 (a1-1-11)

(a1-1-12) 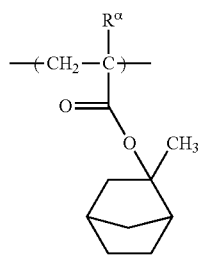
(a1-1-13) 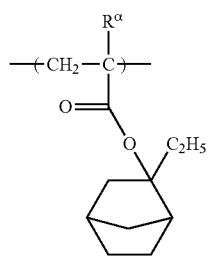
(a1-1-14) 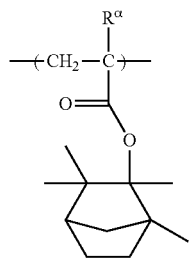
(a1-1-15) 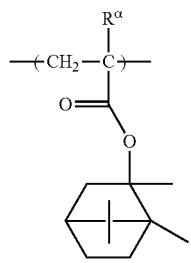
(a1-1-16) 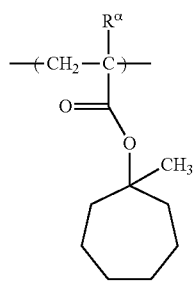
(a1-1-17) 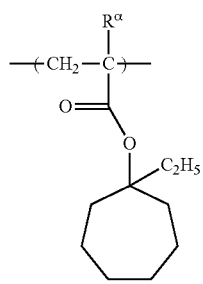
(a1-1-18) 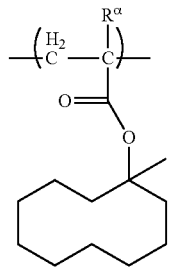
(a1-1-19) 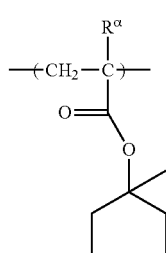
(a1-1-20) 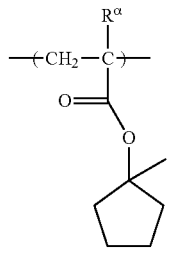
(a1-1-21) 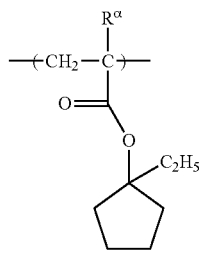
[Chemical Formula 18]
(a1-1-22) 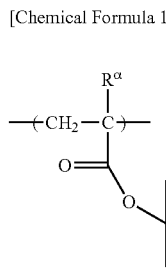
(a1-1-23) 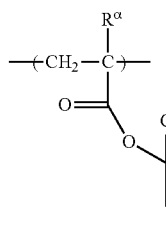

-continued
(a1-1-24) 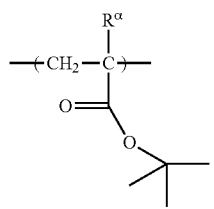
(a1-1-25) 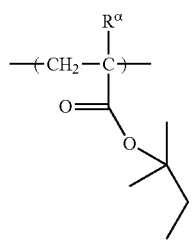
(a1-1-26) 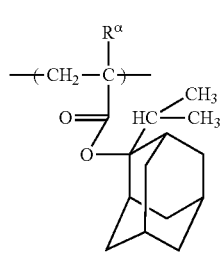
(a1-1-27) 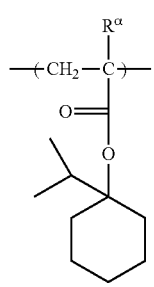
(a1-1-28) 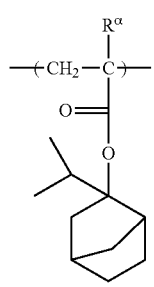
(a1-1-29) 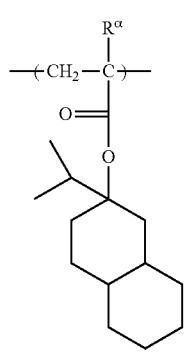
-continued
(a1-1-30) 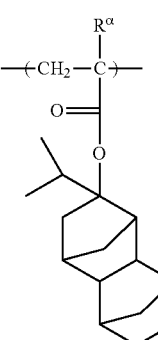
(a1-1-31) 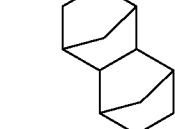
(a1-1-32) 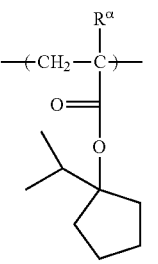
(a1-1-33) 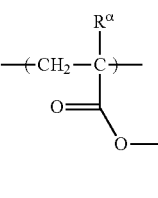
(a1-1-34) 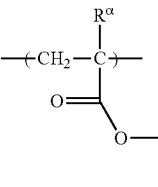

[Chemical Formula 19]
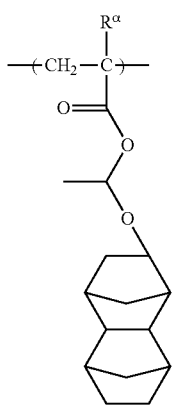
(a1-2-1)
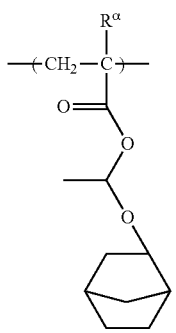
(a1-2-2)
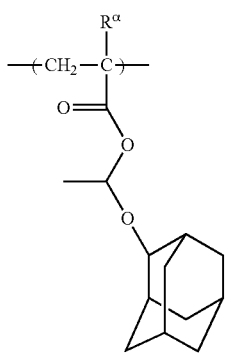
(a1-2-3)
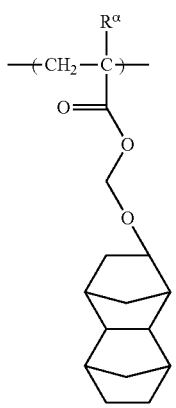
(a1-2-4)
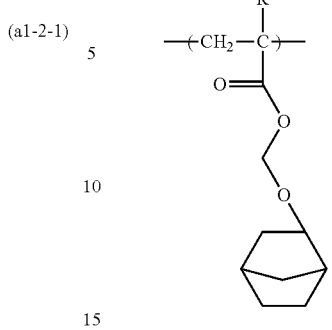
(a1-2-5)
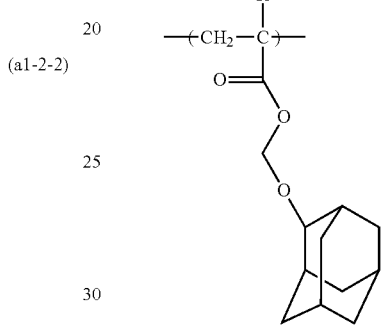
(a1-2-6)
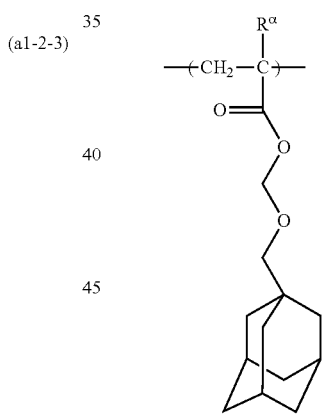
(a1-2-7)
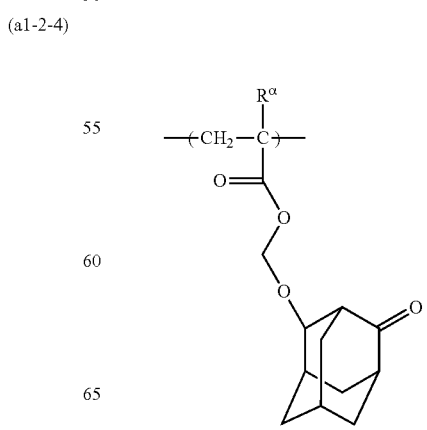
(a1-2-8)

(a1-2-9) 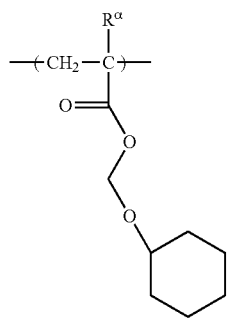
(a1-1-13) 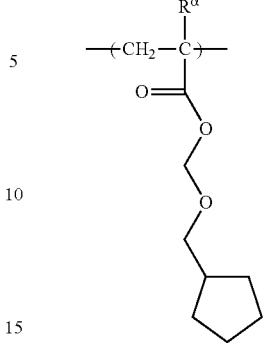
(a1-2-10) 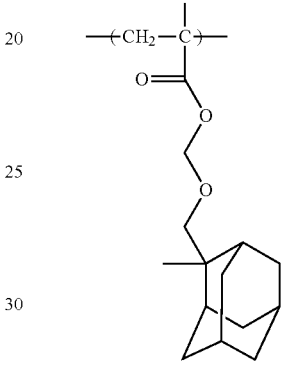
(a1-2-14) 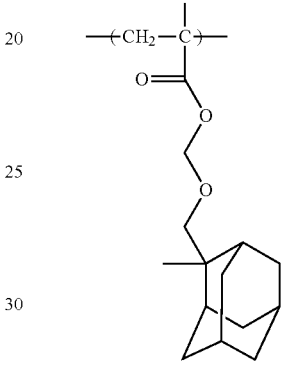
(a1-2-11) 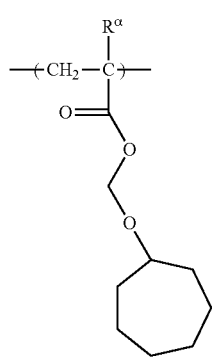
(a1-2-15) 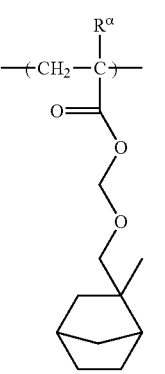
(a1-2-12) 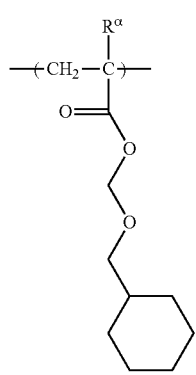
(a1-2-16) 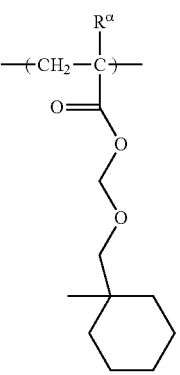

(a1-2-17) 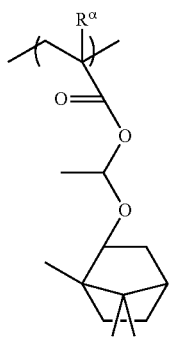
(a1-2-18) 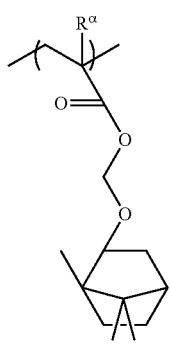
(a1-2-19) 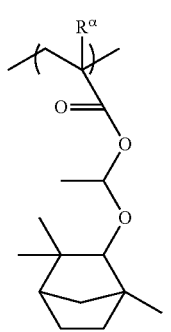
(a1-2-20) 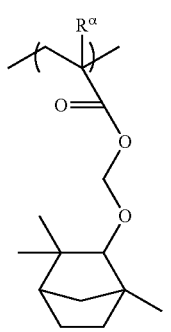
(a1-2-21) 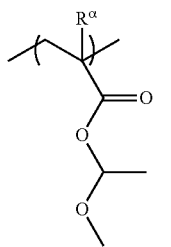
(a1-2-22) 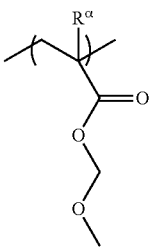
(a1-2-23) 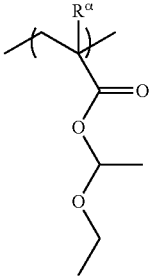
(a1-2-24) 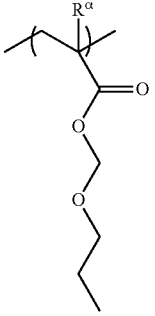
[Chemical Formula 20]
(a1-3-1) 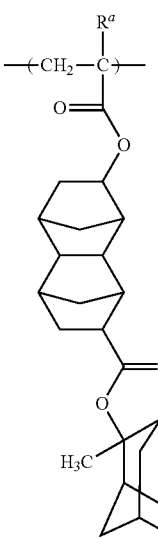

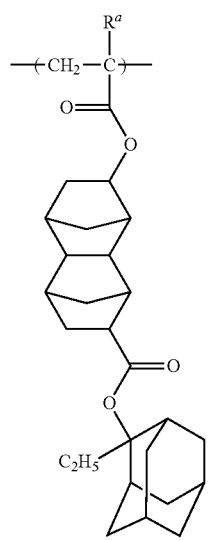 (a1-3-2)
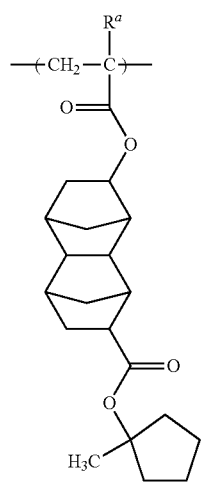 (a1-3-3)
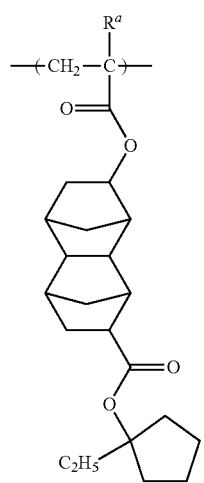 (a1-3-4)
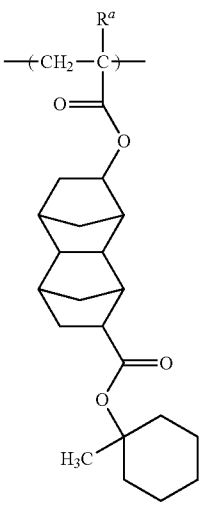 (a1-3-5)
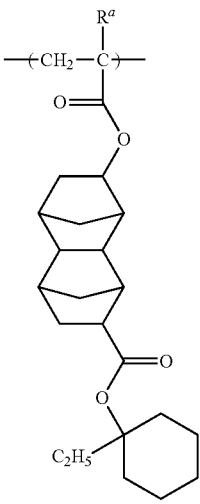 (a1-3-6)
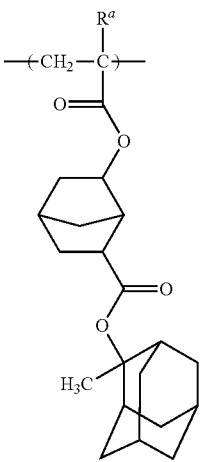 (a1-3-7)

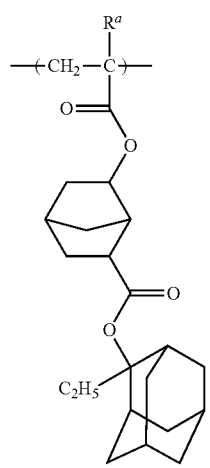 (a1-3-8)
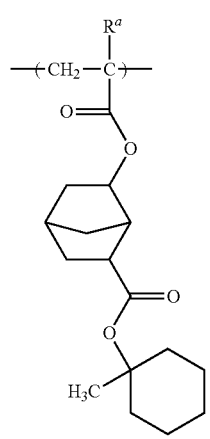 (a1-3-9)
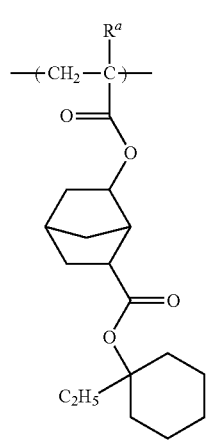 (a1-3-10)
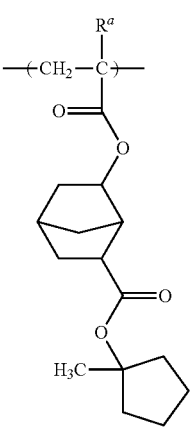 (a1-3-11)
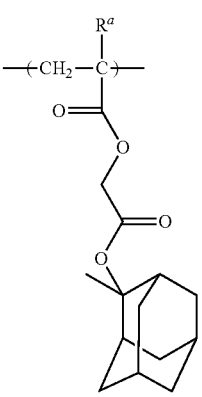 (a1-3-12)
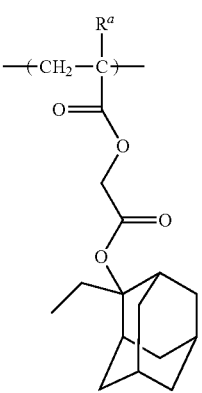 (a1-3-13)
(a1-3-14)

(a1-3-15)
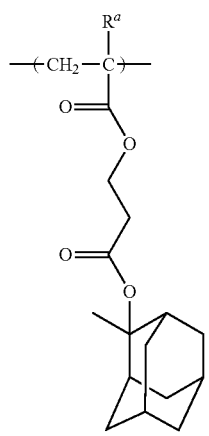
(a1-3-16)
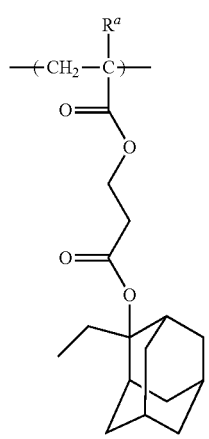
(a1-3-17)
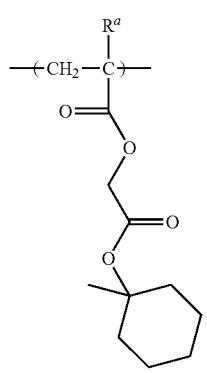
(a1-3-18)
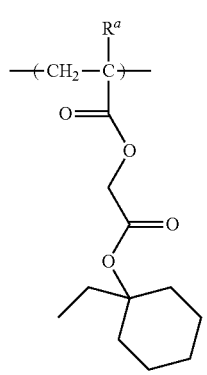
[Chemical Formula 21]
(a1-3-19)
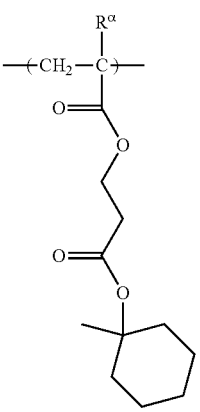
(a1-3-20)
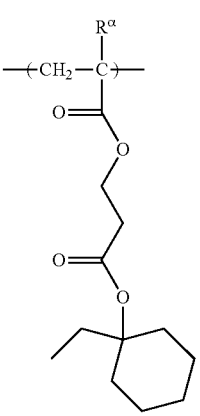
(a1-3-21)
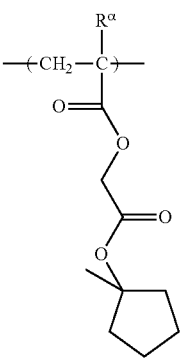
(a1-3-22)
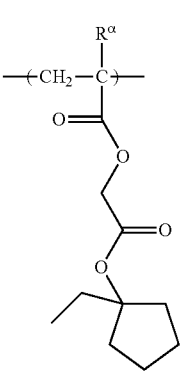

(a1-3-23) 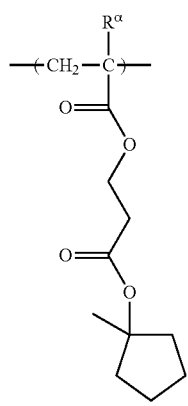
(a1-3-24) 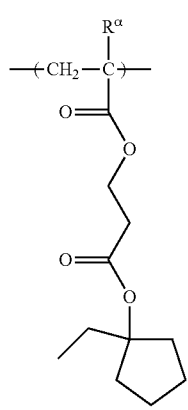
[Chemical Formula 22]
(a1-3-25) 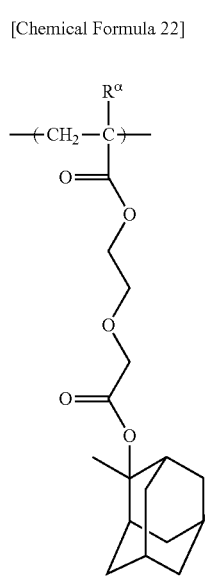
(a1-3-26) 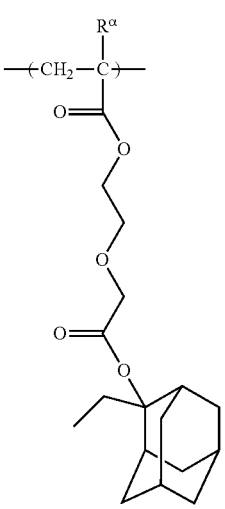
(a1-3-27) 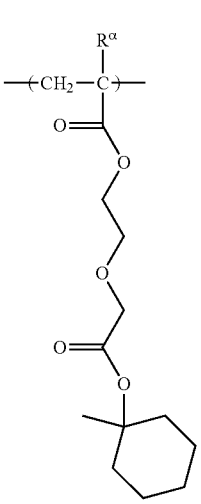
(a1-3-28) 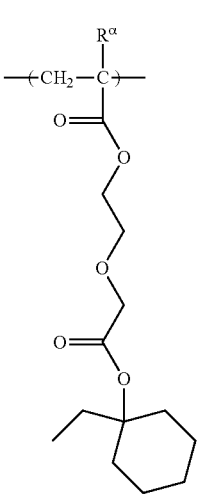

(a1-3-29)
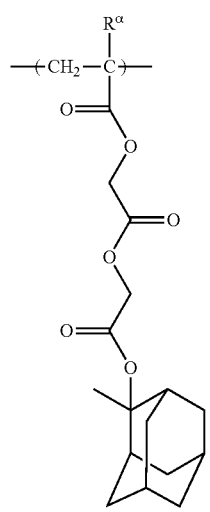
(a1-3-30)
(a1-3-31)
(a1-3-32)
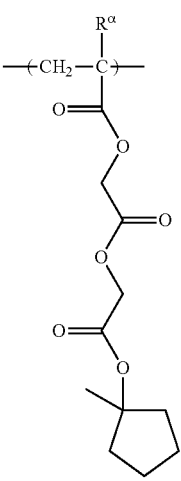
[Chemical Formula 23]
(a1-4-1)
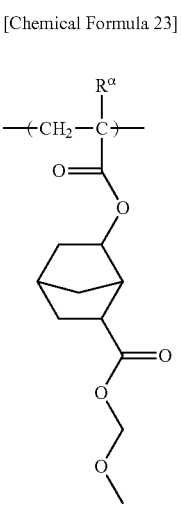
(a1-4-2)
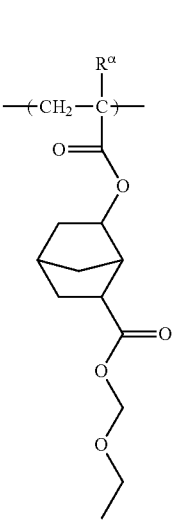

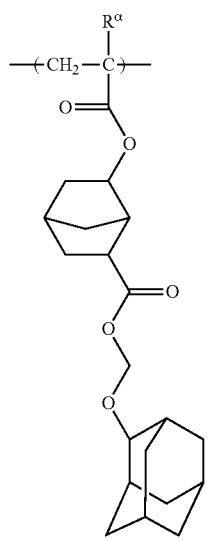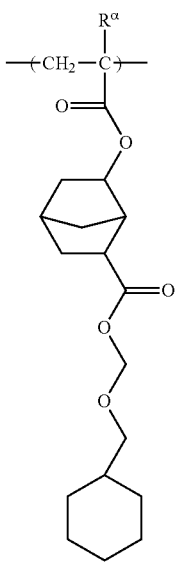

(a1-4-9)
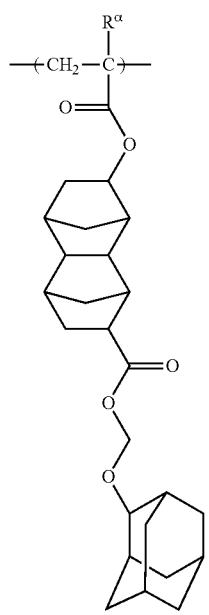
(a1-4-11)
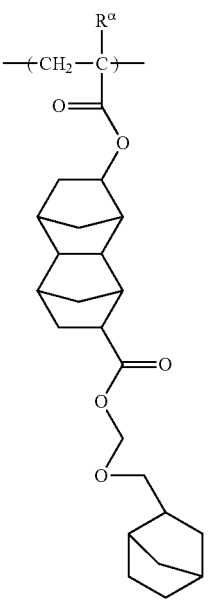
(a1-4-10)
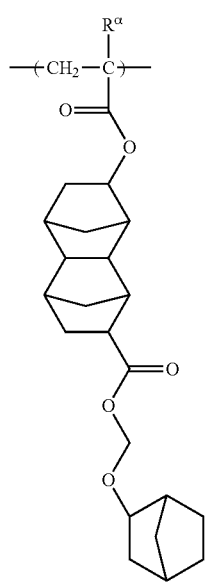
(a1-4-12)
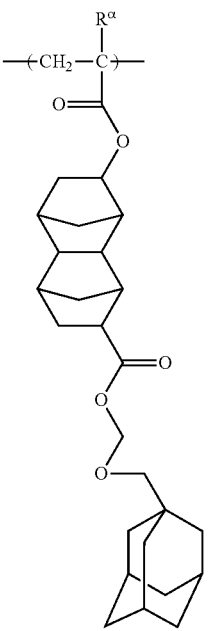

(a1-4-13)

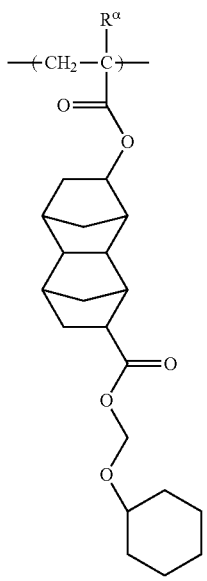

(a1-4-14)

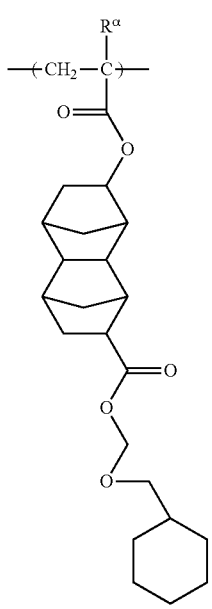

(a1-4-15)

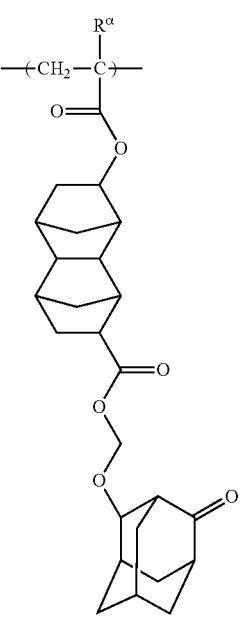

Among these, structural units represented by general formula (a1-1), (a1-2) or (a1-3) are preferable. More specifically, at least one structural unit selected from the group consisting of structural units represented by formulas (a1-1-1) to (a-1-1-4), (a1-1-20) to (a1-1-23), (a1-26), (a1-1-32) to (a1-1-34), (a1-2-1) to (a1-2-24) and (a1-3-25) to (a1-3-28) is more preferable.

Further, as the structural unit (a1), structural units represented by general formula (a1-1-01) shown below which includes the structural units represented by formulas (a1-1-1) to (a1-1-3) and (a1-1-26), structural units represented by general formula (a1-1-02) shown below which includes the structural units represented by formulas (a1-1-16), (a1-1-17) and (a1-1-20) to (a1-1-23), structural units represented by general formula (a1-3-01) shown below which include the structural units represented by formulas (a1-3-25) and (a1-3-26), and structural units represented by general formula (a1-3-02) shown below which include the structural units represented by formulas (a1-3-27) and (a1-3-28) are also preferable.

[Chemical Formula 24]

(a1-1-01)

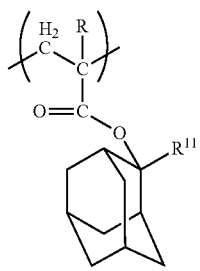

-continued

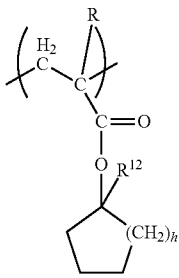
(a1-1-02)

In the formulas, each R independently represents a hydrogen atom, an alkyl group of 1 to 5 carbon atoms or a halogenated alkyl group of 1 to 5 carbon atoms; $R^{11}$ represents an alkyl group of 1 to 5 carbon atoms; $R^{12}$ represents an alkyl group of 1 to 7 carbon atoms; and h represents an integer of 1 to 6.

In general formula (a1-1-01), R is the same as defined above. The alkyl group of 1 to 5 carbon atoms for is the same as defined for the alkyl group of 1 to 5 carbon atoms for R, and a methyl group, an ethyl group or an isopropyl group is preferable.

In general formula (a1-1-02), R is the same as defined above. The alkyl group of 1 to 5 carbon atoms for $R^{12}$ is the same as defined for the alkyl group of 1 to 5 carbon atoms for R, and a methyl group, an ethyl group or an isopropyl group is preferable. h is preferably 1 or 2, and most preferably 2.

[Chemical Formula 25]

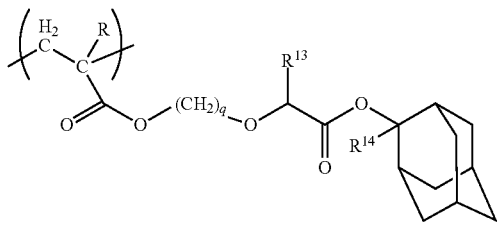
(a1-3-01)

In the formula, R represents a hydrogen atom, an alkyl group of 1 to 5 carbon atoms or a halogenated alkyl group of 1 to 5 carbon atoms; $R^{14}$ represents an alkyl group; $R^{13}$ represents a hydrogen atom or a methyl group; and q represents an integer of 1 to 10.

[Chemical Formula 26]

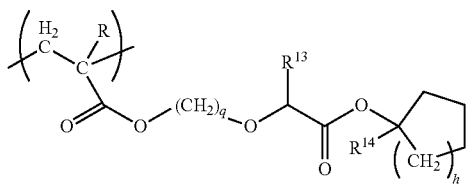
(a1-3-02)

In the formula, R represents a hydrogen atom, an alkyl group of 1 to 5 carbon atoms or a halogenated alkyl group of 1 to 5 carbon atoms; $R^{14}$ represents an alkyl group; $R^{13}$ represents a hydrogen atom or a methyl group; q represents an integer of 1 to 10; and h represents an integer of 1 to 6.

In general formulas (a1-3-01) and (a1-3-02), R is the same as defined above.

$R^{13}$ is preferably a hydrogen atom.

The alkyl group for $R^{14}$ is the same as defined for $R^{14}$ in the aforementioned formula (1-1) to (1-9), preferably an alkyl group of 1 to 5 carbon atoms, and most preferably a methyl group or an ethyl group.

h is preferably 1 or 2, and most preferably 2.

q is preferably an integer of 1 to 8, more preferably an integer of 2 to 5, and most preferably 2.

Furthermore, as the structural unit (a1), a structural unit represented by general formula (a1-5) is also preferable. By virtue of including such a structural unit, the film retention ratio and etching resistance at exposed portions are improved.

[Chemical Formula 27]

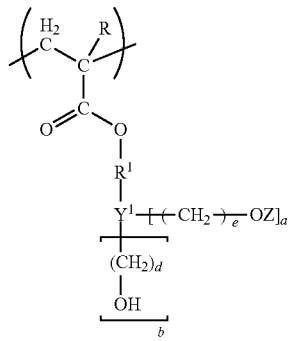
(a1-5)

In the formula, R represents a hydrogen atom, an alkyl group of 1 to 5 carbon atoms or a halogenated alkyl group of 1 to 5 carbon atoms; OZ represents an acid decomposable group; $Y^1$ represents an aliphatic hydrocarbon group which may have a substituent; $R^1$ represents a single bond or a divalent linking group; a represents an integer of 1 to 3, and b represents an integer of 0 to 2, provided that a+b=1 to 3; and d and e each independently represents an integer of 0 to 3.

In general formula (a1-5), the alkyl group and the halogenated alkyl group for R are respectively the same as defined for the alkyl group and the halogenated alkyl group for the substituent which may be bonded to the carbon atom on the α-position of the aforementioned substituted acrylate ester.

R is preferably a hydrogen atom, an alkyl group of 1 to 5 carbon atoms or a fluorinated alkyl group of 1 to 5 carbon atoms, and most preferably a hydrogen atom or a methyl group.

In formula (a1-5), examples of the acid decomposable group for OZ include a group in which the hydrogen atom of the alcoholic hydroxy group has been substituted with an acid dissociable group.

An "acid dissociable group" is a group in which at least the bond between the acid dissociable group and the adjacent carbon atom is cleaved by the action of acid (acid generated from the component (A1) (structural unit (a0)) upon exposure). In the present invention, it is necessary that the acid dissociable group exhibits a lower hydrophilicity than the alcoholic hydroxy group formed by the dissociation of the acid dissociable group. Namely, by substituting the hydrogen atom of the alcoholic hydroxy group with an acid dissociable group, when the acid dissociable group is dissociated, the alcoholic hydroxy group is formed, thereby increasing the hydrophilicity. As a result, the hydrophilicity of the entire component (A1) is increased, so that the solubility of the component (A1) in an organic developing solution is relatively decreased.

The acid dissociable group is not particularly limited, and any of the groups that have been conventionally proposed as acid dissociable groups for the base resins of chemically amplified resists can be used. For example, the same acid decomposable groups as those described above can be used.

As the acid dissociable group, particularly in terms of improvement in solubility in an organic solvent (resist solvent) for preparing a resist composition, an organic developing solution and the like, a tertiary alkyl group-containing acid dissociable group or an acetal-type acid dissociable group is preferable.

(Tertiary Alkyl Group-Containing Acid Dissociable Group)

The term "tertiary alkyl group" refers to an alkyl group having a tertiary carbon atom. As mentioned above, the term "alkyl group" refers to a monovalent saturated hydrocarbon group, and includes chain-like (linear or branched) alkyl groups and cyclic alkyl groups.

The term "tertiary alkyl group-containing acid dissociable group" refers to an acid dissociable group which includes a tertiary alkyl group in the structure thereof. The tertiary alkyl group-containing acid dissociable group may be either constituted of only a tertiary alkyl group, or constituted of a tertiary alkyl group and an atom or group other than a tertiary alkyl group.

Examples of the "atom or group other than a tertiary alkyl group" which constitutes the tertiary alkyl group-containing group with a tertiary alkyl group include a carbonyloxy group, a carbonyl group, an alkylene group and an oxygen atom (—O—).

As the tertiary alkyl group-containing acid dissociable group, a tertiary alkyl group-containing acid dissociable group which does not have a ring structure, and a tertiary alkyl group-containing acid dissociable group which has a ring structure can be mentioned.

"A tertiary alkyl group-containing acid dissociable group which does not have a ring structure" is an acid dissociable group which has a branched tertiary alkyl group as the tertiary alkyl group, and has no ring in the structure thereof.

As the branched tertiary alkyl group, for example, a group represented by general formula (I) shown below can be mentioned.

[Chemical Formula 28]

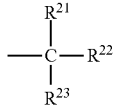

(I)

In formula (I), each of $R^{21}$ to $R^{23}$ independently represents a linear or branched alkyl group. The number of carbon atoms within the alkyl group is preferably from 1 to 5, and more preferably from 1 to 3.

Further, in the group represented by general formula (I), the total number of carbon atoms is preferably from 4 to 7, more preferably from 4 to 6, and most preferably 4 or 5.

Preferable examples of the group represented by general formula (I) include a tert-butyl group and a tert-pentyl group, and a tert-butyl group is more preferable.

Examples of tertiary alkyl group-containing acid dissociable groups which do not have a ring structure include the aforementioned branched tertiary alkyl group; a tertiary alkyl group-containing, chain-like alkyl group in which the aforementioned branched tertiary alkyl group is bonded to a linear or branched alkylene group; a tertiary alkyloxycarbonyl group which has the aforementioned branched tertiary alkyl group as the tertiary alkyl group; and a tertiary alkyloxycarbonylalkyl group which has the aforementioned branched tertiary alkyl group as the tertiary alkyl group.

As the alkylene group within the tertiary alkyl group-containing, chain-like alkyl group, an alkylene group of 1 to 5 carbon atoms is preferable, an alkylene group of 1 to 4 carbon atoms is more preferable, and an alkylene group of 2 carbon atoms is the most desirable.

As a chain-like tertiary alkyloxycarbonyl group, for example, a group represented by general formula (II) shown below can be mentioned.

In general formula (II), $R^{21}$ to $R^{23}$ are the same as defined for $R^{21}$ to $R^{23}$ in general formula (I).

As the chain-like tertiary alkyloxycarbonyl group, a tert-butyloxycarbonyl group (t-boc) and a tert-pentyloxycarbonyl group are preferable.

[Chemical Formula 29]

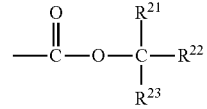

(II)

As a chain-like tertiary alkyloxycarbonylalkyl group, for example, a group represented by general formula (III) shown below can be mentioned.

In general formula (III), $R^{21}$ to $R^{23}$ are the same as defined for $R^{21}$ to $R^{23}$ in general formula (I).

f represents an integer of 1 to 3, and is preferably 1 or 2.

As the chain-like tertiary alkyloxycarbonylalkyl group, a tert-butyloxycarbonylmethyl group and a tert-butyloxycarbonyl ethyl group are preferable.

[Chemical Formula 30]

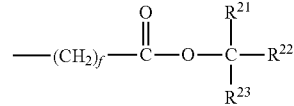

(III)

Among these, as the tertiary alkyl group-containing acid dissociable group which does not have a ring structure, in terms of the contrast to the organic developing solution prior to and after exposure, a tertiary alkyloxycarbonyl group or a tertiary alkyloxycarbonylalkyl group is preferable, a tertiary alkyloxycarbonyl group is more preferable, and a tert-butyloxycarbonyl group (t-boc) is most preferable.

A "tertiary alkyl group-containing acid dissociable group" which has a ring structure is an acid dissociable group which contains a tertiary carbon atom and a ring in the structure thereof.

In the tertiary alkyl group-containing acid dissociable group which has a ring structure, the ring structure preferably has 4 to 12 carbon atoms which constitute the ring, more preferably 5 to 10 carbon atoms, and most preferably 6 to 10 carbon atoms.

The ring structure is preferably an aliphatic cyclic group. The term "aliphatic cyclic group" refers to a monocyclic group or polycyclic group that has no aromaticity.

The aliphatic cyclic group may or may not have a substituent. Examples of the substituent include an alkyl group of 1 to 5 carbon atoms, an alkoxy group of 1 to 5 carbon atoms, a fluorine atom, a fluorinated alkyl group of 1 to 5 carbon atoms, and an oxygen atom (=O).

The basic ring of the "aliphatic cyclic group" exclusive of substituents is not limited to be constituted from only carbon and hydrogen (not limited to hydrocarbon groups), but is preferably a hydrocarbon group. Further, the "hydrocarbon group" may be either saturated or unsaturated, but is preferably saturated.

The aliphatic cyclic group may be either a monocyclic group or a polycyclic group.

As such aliphatic cyclic groups, groups in which one or more hydrogen atoms have been removed from a monocycloalkane or a polycycloalkane such as a bicycloalkane, tricycloalkane or tetracycloalkane which may or may not be substituted with a lower alkyl group, a fluorine atom or a fluorinated alkyl group, may be used. Specific examples of aliphatic cyclic hydrocarbon groups include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane. In these aliphatic cyclic hydrocarbon groups, part of the carbon atoms constituting the ring may be replaced with an ethereal oxygen atom (—O—).

As the tertiary alkyl group-containing acid dissociable group which has a ring structure, for example, a group represented by formula [1] or [2] shown below can be mentioned.

[1] A tertiary alkyl group in which a tertiary carbon atom is formed on the ring skeleton of a monovalent aliphatic cyclic group by an alkyl group being bonded to a carbon atom which is bonded to an atom adjacent to the tertiary alkyl group.

[2] A tertiary alkyl group which has a monovalent aliphatic cyclic group and an alkylene group having a tertiary carbon atom (branched alkylene group), and the tertiary carbon atom is bonded to an atom adjacent to the tertiary alkyl group.

As the monovalent aliphatic cyclic group within the group represented by formula [1] or [2], the same aliphatic cyclic groups as those described above for the ring structure can be used.

In the group represented by formula [1], the alkyl group bonded to the aliphatic cyclic group may be linear, branched or cyclic, and is preferably linear or branched.

The linear alkyl group preferably has 1 to 5 carbon atoms, more preferably 1 to 4, and still more preferably 1 or 2. Specific examples include a methyl group, an ethyl group, an n-propyl group, an n-butyl group and an n-pentyl group. Among these, a methyl group, an ethyl group or an n-butyl group is preferable, and a methyl group or an ethyl group is more preferable.

The branched alkyl group preferably has 3 to 10 carbon atoms, and more preferably 3 to 5. Specific examples of such branched alkyl groups include an isopropyl group, an isobutyl group, a tert-butyl group, an isopentyl group and a neopentyl group, and an isopropyl group is particularly desirable.

Specific examples of the group [1] include groups represented by the aforementioned general formulae (1-1) to (1-9).

Specific examples of the group [2] include groups represented the aforementioned by general formulae (2-1) to (2-6).

Examples of tertiary alkyl group-containing acid dissociable groups which have a ring structure include the aforementioned tertiary alkyl group having a ring structure; a tertiary alkyloxycarbonyl group having the aforementioned tertiary alkyl group having a ring structure; and an alkyloxycarbonylalkyl group having the aforementioned tertiary alkyl group having a ring structure.

Examples of the alkyl group having a ring structure include those represented by the aforementioned formula [1] or [2].

Specific examples of the tertiary alkyloxycarbonyl group include groups represented by the aforementioned general formula (II) in which —$C(R^{21})(R^{22})(R^{23})$ moiety has been substituted with a tertiary alkyl group having a ring structure.

Specific examples of the tertiary alkyloxycarbonylalkyl group include groups represented by the aforementioned general formula (III) in which —$C(R^{21})(R^{22})(R^{23})$ moiety has been substituted with a tertiary alkyl group having a ring structure.

Among the above-mentioned examples, as the tertiary alkyl group-containing acid dissociable group, a group represented by general formula (II) above is preferable, and a tert-butyloxycarbonyl group (t-boc) is most preferable.

(Acetal-Type Acid Dissociable Group)

In an acetal-type acid dissociable group, when acid is generated upon exposure, the generated acid acts to break the bond between the acetal-type acid dissociable group and the oxygen atom to which the acetal-type, acid dissociable group is bonded.

Examples of the acetal-type acid dissociable group include the same "acetal-type acid dissociable groups" as those described above.

In the structural unit represented by formula (a1-5), preferable examples of the acetal-type acid dissociable group include a methoxymethoy group, an ethoxymethoxy group, an n-butoxymethoxy group, a cyclohexyloxymethoxy group, an adamantyloxymethoxy group, a 1-ethoxyethoxy group, a 1-n-butoxyethoxy group, a 1-cyclohexyloxyethoxy group, a 1-adamatyloxyethoxy group.

In the formula (a5-1), $Y^1$ represents an aliphatic hydrocarbon group which may have a substituent.

An "aliphatic hydrocarbon group" refers to a hydrocarbon group that has no aromaticity.

The aliphatic hydrocarbon group for $Y^1$ may be either a saturated aliphatic hydrocarbon group, or an unsaturated aliphatic hydrocarbon group. Further, the aliphatic hydrocarbon group may be linear, branched or cyclic.

An aliphatic hydrocarbon group "may have a substituent" means that part of the carbon atoms constituting the aliphatic hydrocarbon group may be substituted with a substituent group containing a hetero atom, or part or all of the hydrogen atoms constituting the aliphatic hydrocarbon group may be substituted with a substituent group containing a hetero atom.

As the "hetero atom" for $Y^1$, there is no particular limitation as long as it is an atom other than carbon and hydrogen, and examples thereof include a halogen atom, an oxygen atom, a sulfur atom and a nitrogen atom.

Examples of the halogen atom include a fluorine atom, a chlorine atom, an iodine atom and a bromine atom.

The substituent group containing a hetero atom may consist of a hetero atom, or may be a group containing a hetero atom and a group or atom other than a hetero atom. Specific examples thereof include —O—, —C(=O)—O—, —C(=O)—, —O—C(=O)—O—, —C(=O)—NH—, —NH— (the H may be replaced with a substituent such as an alkyl group or an acyl group), —S—, —S(=O)$_2$— and —S(=O)$_2$—O—. When the aliphatic hydrocarbon group is cyclic, the aliphatic hydrocarbon group may contain any of these substituent groups in the ring structure.

Examples of the substituent group for substituting part or all of the hydrogen atoms constituting the aliphatic hydrocarbon group include an alkoxy group, a halogen atom, a halogenated alkyl group, a hydroxyl group, an oxygen atom (=O), a cyano group and an alkyl group.

The aforementioned alkoxy group is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the aforementioned halogen atom include a fluorine atom, a chlorine atom, a bromine atom and an iodine atom, and a fluorine atom is preferable.

Example of the aforementioned halogenated alkyl group includes a group in which part or all of the hydrogen atoms within an alkyl group of 1 to 5 carbon atoms (e.g., a methyl group, an ethyl group, a propyl group, an n-butyl group or a tert-butyl group) have been substituted with the aforementioned halogen atoms.

Examples of the alkyl group include alkyl groups of 1 to 5 carbon atoms such as a methyl group, an ethyl group, a propyl group, an n-butyl group and a tert-butyl group.

When $Y^1$ represents a linear or branched aliphatic hydrocarbon group, the linear or branched aliphatic hydrocarbon group preferably has 1 to 10 carbon atoms, more preferably 1 to 5, and most preferably 1 to 3. Specific examples of preferable linear or branched aliphatic hydrocarbon group include chain-like alkylene groups.

When $Y^1$ represents a cyclic aliphatic hydrocarbon group (aliphatic cyclic group), the basic ring of the "aliphatic cyclic group" exclusive of substituents (aliphatic ring) is not limited to be constituted from only carbon and hydrogen (not limited to hydrocarbon rings), and the ring (aliphatic ring) may contain a hetero atom (e.g., an oxygen atom or the like) in the structure thereof. Further, the "hydrocarbon ring" may be either saturated or unsaturated, but is preferably saturated.

The aliphatic cyclic group may be either a polycyclic group or a monocyclic group. Examples of aliphatic cyclic groups include groups in which two or more hydrogen atoms have been removed from a monocycloalkane or a polycycloalkane such as a bicycloalkane, tricycloalkane or tetracycloalkane which may or may not be substituted with a lower alkyl group, a fluorine atom or a fluorinated alkyl group. Specific examples include groups in which two or more hydrogen atoms have been removed from a monocycloalkane such as cyclopentane or cyclohexane; and groups in which two or more hydrogen atoms have been removed from a polycycloalkane such as adamantane, norbornane, isobornane, tricyclodecane or tetracyclododecane.

Further examples of the aliphatic cyclic group include groups in which two or more hydrogen atoms have been removed from tetrahydrofuran or tetrahydropyran which may or may not be substituted with a lower alkyl group, a fluorine atom or a fluorinated alkyl group.

The aliphatic cyclic group within the structural unit represented by formula (a1-5) is preferably a polycyclic group, and a group in which two or more hydrogen atoms have been removed from adamantane is particularly desirable.

In the formula (a1-5), the divalent linking group for $R^1$ is not particularly limited, and preferable examples thereof include a divalent hydrocarbon group which may have a substituent and a divalent linking group containing a hetero atom.

A hydrocarbon group "may have a substituent" means that part of the carbon atoms constituting the hydrocarbon group may be substituted with a substituent group containing a hetero atom, or part or all of the hydrogen atoms constituting the hydrocarbon group may be substituted with a substituent group containing a hetero atom.

The hydrocarbon group may be either an aliphatic hydrocarbon group or an aromatic hydrocarbon group.

The aliphatic hydrocarbon group may be saturated or unsaturated. In general, the aliphatic hydrocarbon group is preferably saturated.

As specific examples of the aliphatic hydrocarbon group, a linear or branched aliphatic hydrocarbon group, and an aliphatic hydrocarbon group containing a ring in the structure thereof can be given.

The linear or branched hydrocarbon group preferably has 1 to 10 carbon atoms, more preferably 1 to 8, still more preferably 1 to 5, and most preferably 1 or 2.

As the linear aliphatic hydrocarbon group, a linear alkylene group is preferable. Specific examples thereof include a methylene group [—$CH_2$—], an ethylene group [—$(CH_2)_2$—], a trimethylene group [—$(CH_2)_3$—], a tetramethylene group [—$(CH_2)_4$—] and a pentamethylene group [—$(CH_2)_5$—].

As the branched hydrocarbon group, branched alkylene groups are preferred, and specific examples include various alkylalkylene groups, including alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$— and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; alkyltrimethylene groups such as —$CH(CH_3)CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—. As the alkyl group within the alkylalkylene group, a linear alkyl group of 1 to 5 carbon atoms is preferable.

The linear or branched aliphatic hydrocarbon group may or may not have a substituent. Examples of the substituent which substitutes part or all of the hydrogen atoms of the aliphatic hydrocarbon group include a fluorine atom, a fluorinated alkyl group of 1 to 5 carbon atoms, and an oxygen atom (=O).

As examples of the hydrocarbon group containing a ring in the structure thereof, an alicyclic hydrocarbon group (a group in which two hydrogen atoms have been removed from an aliphatic hydrocarbon ring), and a group in which the alicyclic hydrocarbon group is bonded to the terminal of the aforementioned chain-like aliphatic hydrocarbon group or interposed within the aforementioned chain-like aliphatic hydrocarbon group, can be given.

The alicyclic hydrocarbon group preferably has 3 to 20 carbon atoms, and more preferably 3 to 12 carbon atoms.

The alicyclic hydrocarbon group may be either a monocyclic group or a polycyclic group. As the monocyclic aliphatic hydrocarbon group, a group in which 2 hydrogen atoms have been removed from a monocycloalkane is preferable.

The monocycloalkane preferably has 3 to 6 carbon atoms, and specific examples thereof include cyclopentane and cyclohexane. As the polycyclic group, a group in which two hydrogen atoms have been removed from a polycycloalkane is preferable, and the polycyclic group preferably has 7 to 12 carbon atoms. Examples of the polycycloalkane include adamantane, norbornane, isobornane, tricyclodecane and tetracyclododecane.

The alicyclic hydrocarbon group may or may not have a substituent. Examples of the substituent include an alkyl group of 1 to 5 carbon atoms, a fluorine atom, a fluorinated alkyl group of 1 to 5 carbon atoms, and an oxygen atom (=O).

The aromatic hydrocarbon group is a hydrocarbon group having an aromatic ring.

The aromatic hydrocarbon group for $R^1$ preferably has 3 to 30 carbon atoms, more preferably 5 to 30, still more preferably 5 to 20, still more preferably 6 to 15, and most preferably 6 to 12. Here, the number of carbon atoms within a substituent(s) is not included in the number of carbon atoms of the aromatic hydrocarbon group.

Specific examples of the aromatic hydrocarbon group include an aryl group which is an aromatic hydrocarbon ring having one hydrogen atom removed therefrom, such as a phenyl group, a biphenyl group, a fluorenyl group, a naphthyl group, an anthryl group or a phenanthryl group; and an alkylaryl group such as a benzyl group, a phenethyl group, a 1-naphthylmethyl group, a 2-naphthylmethyl group, a 1-naphthylethyl group, or a 2-naphthylethyl group. The alkyl chain within the arylalkyl group preferably has 1 to 4 carbon atom, more preferably 1 or 2, and most preferably 1.

The aromatic hydrocarbon group may have a substituent. For example, part of the carbon atoms constituting the aromatic ring within the aromatic hydrocarbon group may be substituted with a hetero atom, or a hydrogen atom bonded to the aromatic ring within the aromatic hydrocarbon group may be substituted with a substituent.

In the former example, a heteroaryl group in which part of the carbon atoms constituting the ring within the aforementioned aryl group has been substituted with a hetero atom such as an oxygen atom, a sulfur atom or a nitrogen atom, and a heteroarylalkyl group in which part of the carbon atoms constituting the aromatic hydrocarbon ring within the aforementioned arylalkyl group has been substituted with the aforementioned heteroatom can be used.

In the latter example, as the substituent for the aromatic hydrocarbon group, an alkyl group, an alkoxy group, a halogen atom, a halogenated alkyl group, a hydroxyl group, an oxygen atom (=O) or the like can be used.

The alkyl group as the substituent for the aromatic hydrocarbon group is preferably an alkyl group of 1 to 5 carbon atoms, and a methyl group, an ethyl group, a propyl group, an n-butyl group or a tert-butyl group is particularly desirable.

The alkoxy group as the substituent for the aromatic hydrocarbon group is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom as the substituent for the aromatic hydrocarbon group include a fluorine atom, a chlorine atom, a bromine atom and an iodine atom, and a fluorine atom is preferable.

Example of the halogenated alkyl group as the substituent for the aromatic hydrocarbon group includes a group in which part or all of the hydrogen atoms within the aforementioned alkyl group have been substituted with the aforementioned halogen atoms.

With respect to a "divalent linking group containing a hetero atom", a hetero atom is an atom other than carbon and hydrogen, and examples thereof include an oxygen atom, a nitrogen atom, a sulfur atom and a halogen atom.

Specific examples of the divalent linking group containing a hetero atom include non-hydrocarbon groups such as —O—, —C(=O)—, —C(=O)—O—, a carbonate bond (—O—C(=O)—O—), —S—, —S(=O)$_2$—, —S(=O)$_2$—O—, —NH—, —NR$^{06}$— (R$^{06}$ represents a substituent such as an alkyl group or an acyl group), —NH—C(=O)— and =N—; and a combination of any one of these non-hydrocarbon groups with a divalent hydrocarbon group. As examples of the divalent hydrocarbon group, the same groups as those described above for the divalent hydrocarbon group which may have a substituent can be given, and a linear or branched aliphatic hydrocarbon group is preferable.

As the divalent linking group for $R^1$, an alkylene group, a divalent alicyclic hydrocarbon group or a divalent linking group containing a hetero atom is preferable. Among these, an alkylene group or a divalent linking group containing a hetero atom is more preferable, and a linear alkylene group is particularly desirable.

When $R^1$ represents an alkylene group, it preferably has 1 to 10 carbon atoms, more preferably 1 to 6, still more preferably 1 to 4, and most preferably 1 to 3. Specific examples of alkylene groups include the aforementioned linear alkylene groups and branched alkylene groups.

When $R^1$ represents a divalent alicyclic hydrocarbon group, as the alicyclic hydrocarbon group, the same alicyclic hydrocarbon groups as those described above for the "aliphatic hydrocarbon group containing a ring in the structure thereof" can be used.

As the alicyclic hydrocarbon group, a group in which two or more hydrogen atoms have been removed from cyclopentane, cyclohexane, norbornane, isobornane, adamantane, tricyclodecane or tetracyclododecane is particularly desirable.

When $R^1$ represents a divalent linking group containing a hetero atom, preferable examples of the linking group include —O—, —C(=O)—O—, —C(=O)—, —O—C(=O)—O—, —C(=O)—NH—, —NH— (H may be substituted with a substituent such as an alkyl group or an acyl group), —S—, —S(=O)$_2$—, —S(=O)$_2$—O— and a group represented by general formula -A-O—B—, -[A-C(=O)—O]$_{m'}$—B— or -A-O—C(=O)—B— [in the formulas, each of A and B independently represents a divalent hydrocarbon group which may have a substituent, O represents an oxygen atom, and m' represents an integer of 0 to 3].

When $R^1$ represents —NH—, H may be substituted with a substituent such as an alkyl group, an aryl group (an aromatic group) or the like. The substituent (an alkyl group, an aryl group or the like) preferably has 1 to 10 carbon atoms, more preferably 1 to 8, and most preferably 1 to 5.

In the group represented by the formula -A-O—B—, -[A-C(=O)—O]$_{m'}$—B— or -A-O—C(=O)—B—, each of A and B independently represents a divalent hydrocarbon group which may have a substituent. As the divalent hydrocarbon group, the same groups as those described above for the "divalent hydrocarbon group which may have a substituent" for $R^1$ can be mentioned.

As A, a linear aliphatic hydrocarbon group is preferable, more preferably a linear alkylene group, still more preferably a linear alkylene group of 1 to 5 carbon atoms, and a methylene group or an ethylene group is particularly desirable.

As B, a linear or branched aliphatic hydrocarbon group is preferable, and a methylene group, an ethylene group or an alkylmethylene group is more preferable. The alkyl group within the alkylmethylene group is preferably a linear alkyl group of 1 to 5 carbon atoms, more preferably a linear alkyl group of 1 to 3 carbon atoms, and most preferably a methyl group.

In the group represented by the formula -[A-C(=O)—O]$_{m'}$—B—, m represents an integer of 0 to 3, preferably an integer of 0 to 2, more preferably 0 or 1, and most preferably 1. Namely, it is particularly desirable that the group represented by the formula -[A-C(=O)—O]$_{m'}$—B— is a group represented by the formula -A-C(=O)—O—B—. Among these, a group represented by the formula —(CH$_2$)$_{a'}$—C(=O)—O—(CH$_2$)$_{b'}$— is preferable. In the formula, a' is an integer of 1 to 10, preferably an integer of 1 to 8, more preferably an integer of 1 to 5, still more preferably 1 or 2, and most preferably 1. b' is an integer of 1 to 10, preferably an integer of 1 to 8, more preferably an integer of 1 to 5, still more preferably 1 or 2, and most preferably 1.

As the divalent linking group containing a hetero atom, a linear group containing an oxygen atom as the hetero atom e.g., a group containing an ether bond or an ester bond is preferable, and a group represented by the aforementioned formula -A-O—B—, -[A-C(=O)—O]$_{m'}$—B— or -A-O—C(=O)—B— is more preferable.

In the formula (a1-5), a represents an integer of 1 to 3, and b represents an integer of 0 to 2, provided that a+b=1 to 3.

a is preferably 1 or 2.

b is preferably 0.

a+b is preferably 1 or 2.

d represents an integer of 0 to 3, preferably 0 or 1, and more preferably 0.

e represents an integer of 0 to 3, preferably 0 or 1, and more preferably 0.

Among these, a structural unit represented by the aforementioned general formula (a1-5) in which $R^1$ is a single bond or a linear alkylene group of 1 to 3 carbon atoms is preferable. That is, a structural unit represented by general formula (a1-51) is preferable.

Among these, a structural unit represented by general formula (a1-511), (a1-512) or (a1-513) shown below is preferable.

[Chemical Formula 31]

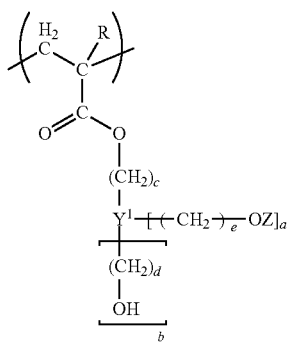

(a1-51)

In formula (a1-51), R, OZ, $Y^1$, a, b, d and e are the same as defined above; and c represents an integer of 0 to 3.

[Chemical Formula 32]

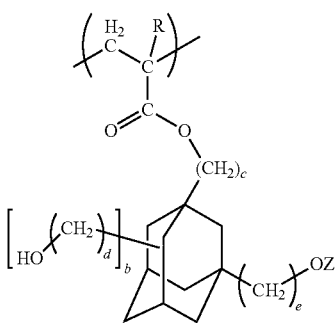

(a1-511)

In the formula, R, OZ, b, c, d and e are the same as defined above.

[Chemical Formula 33]

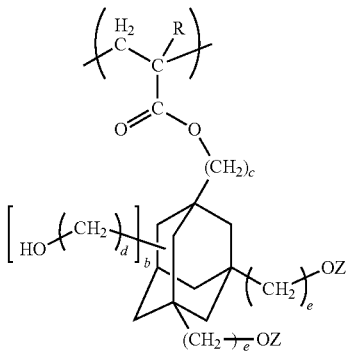

(a1-512)

In the formula, R, OZ, b, c, d and e are the same as defined above.

[Chemical Formula 34]

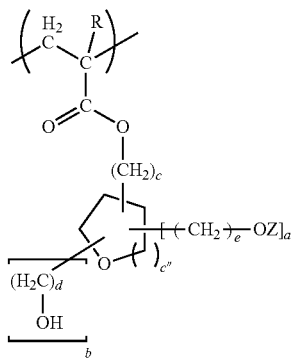

(a1-513)

In the formula, R, OZ, a, b, c, d and e are the same as defined above; and c" represents an integer of 1 to 3.

In formula (a1-51), c is an integer of 0 to 3, preferably 0 or 1, and more preferably 0.

In formula (a1-513), c" is an integer of 1 to 3, preferably 1 or 2, and more preferably 1.

When c represents 0 in formula (a1-513), the oxygen atom on the terminal of the carbonyloxy group within the acrylate ester is preferably not bonded to the carbon atom which is bonded to the oxygen atom within the cyclic group. That is, when c represents 0, it is preferable that there are at least two carbon atoms present between the terminal oxygen atom and the oxygen atom within the cyclic group (excluding the case where the number of such carbon atom is one (i.e., the case where an acetal bond is formed)).

As the structural unit (a1), one type of structural unit may be used alone, or two or more types of structural units may be used in combination.

In the component (A1), the amount of the structural unit (a1) based on the combined total of all structural units constituting the component (A1) is preferably 5 to 80 mol %, more preferably 10 to 80 mol %, and still more preferably 15 to 75 mol %. When the amount of the structural unit (a1) is at least as large as the lower limit of the above-mentioned range, a pattern can be easily formed using a resist composition prepared from the component (A1), and various lithography properties such as sensitivity, resolution, LWR, EL and the like are improved. On the other hand, when the amount of the structural unit (a0) is no more than the upper limit of the above-mentioned range, a good balance can be achieved with the other structural units.

(Structural Unit (a2))

The structural unit (a2) is a structural unit derived from an acrylate ester which may have the hydrogen atom bonded to the carbon atom on the α-position substituted with a substituent and contains a lactone-containing cyclic group.

The term "lactone-containing cyclic group" refers to a cyclic group including one ring containing a —O—C(=O)— structure (lactone ring). The term "lactone ring" refers to a single ring containing a —O—C(O)— structure, and this ring is counted as the first ring. A lactone-containing cyclic group in which the only ring structure is the lactone ring is referred to as a monocyclic group, and groups containing other ring structures are described as polycyclic groups regardless of the structure of the other rings.

When the component (A1) is used for forming a resist film, the lactone-containing cyclic group within the structural unit (a2) is effective in improving the adhesion between the resist film and the substrate.

As the structural unit (a2), there is no particular limitation, and an arbitrary structural unit may be used.

Specific examples of lactone-containing monocyclic groups include a group in which one hydrogen atom has been removed from a 4- to 6-membered lactone ring, such as a group in which one hydrogen atom has been removed from β-propionolatone, a group in which one hydrogen atom has been removed from γ-butyrolactone, and a group in which one hydrogen atom has been removed from δ-valerolactone. Further, specific examples of lactone-containing polycyclic groups include groups in which one hydrogen atom has been removed from a lactone ring-containing bicycloalkane, tricycloalkane or tetracycloalkane.

More specifically, examples of the structural unit (a2) include structural units represented by general formulas (a2-1) to (a2-5) shown below.

[Chemical Formula 35]

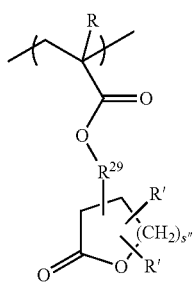

(a2-1)

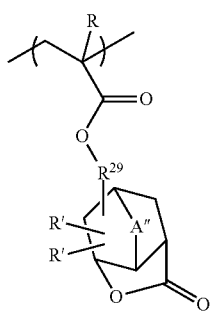

(a2-2)

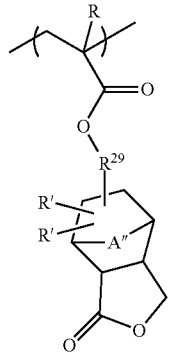

(a2-3)

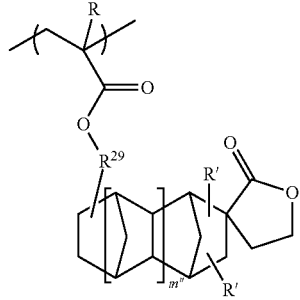

(a2-4)

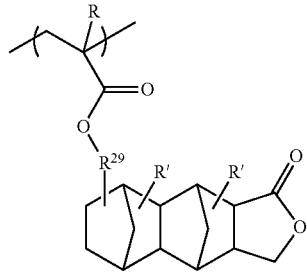

(a2-5)

In the formulas, R represents a hydrogen atom, a lower alkyl group or a halogenated lower alkyl group; each R' independently represents a hydrogen atom, an alkyl group of 1 to 5 carbon atoms, an alkoxy group of 1 to 5 carbon atoms or —COOR", wherein R" represents a hydrogen atom or an alkyl group; $R^{29}$ represents a single bond or a divalent linking group; s" represents an integer of 0 to 2; A" represents an oxygen atom, a sulfur atom or an alkylene group of 1 to 5 carbon atoms which may contain an oxygen atom or a sulfur atom; and m" represents 0 or 1.

In general formulas (a2-1) to (a2-5), R is the same as defined for R in the structural unit (a1).

Examples of the alkyl group of 1 to 5 carbon atoms for R' include a methyl group, an ethyl group, a propyl group, an n-butyl group and a tert-butyl group.

Examples of the alkoxy group of 1 to 5 carbon atoms for R' include a methoxy group, an ethoxy group, an n-propoxy group, an iso-propoxy group, an n-butoxy group and a tert-butoxy group In terms of industrial availability, R' is preferably a hydrogen atom.

R" preferably represents a hydrogen atom or a linear, branched or cyclic alkyl group of 1 to 15 carbon atoms.

When R" is a linear or branched alkyl group, it preferably has 1 to 10 carbon atoms, more preferably 1 to 5 carbon atoms.

When R" is a cyclic alkyl group (cycloalkyl group), it preferably has 3 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Examples of such groups include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane.

As A", an alkylene group of 1 to 5 carbon atoms or —O— is preferable, more preferably an alkylene group of 1 to 5 carbon atoms, and most preferably a methylene group.

$R^{29}$ represents a single bond or a divalent linking group. Examples of divalent linking groups include the same divalent linking groups as those described above for $Y^2$ in general formula (a1-0-2). Among these, an alkylene group, an ester bond (—C(=O)—O—) or a combination thereof is preferable. The alkylene group as a divalent linking group for $R^{29}$ is preferably a linear or branched alkylene group. Specific examples include the same linear alkylene groups and branched alkylene groups as those described above for the aliphatic hydrocarbon group represented by $Y^2$.

s" is preferably 1 or 2.

Specific examples of structural units represented by general formulas (a2-1) to (a2-5) are shown below.

In the formulae shown below, $R^\alpha$ represents a hydrogen atom, a methyl group or a trifluoromethyl group.

[Chemical Formula 36]

(a2-1-1)

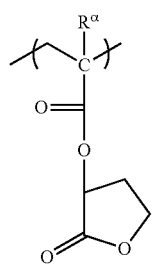

(a2-1-2)

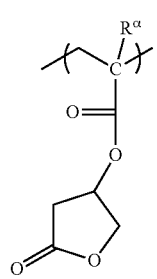

-continued (a2-1-3)

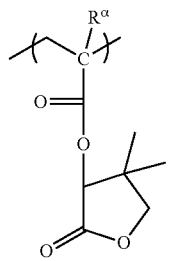

(a2-1-4)

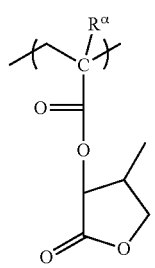

(a2-1-5)

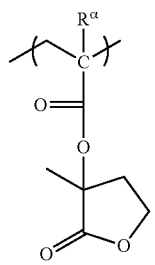

(a2-1-6)

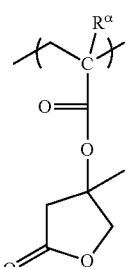

(a2-1-7)

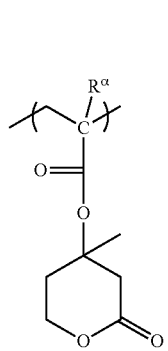

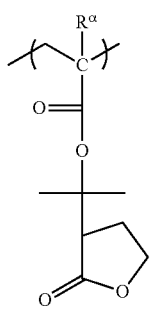 (a2-1-8)
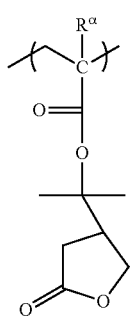 (a2-1-9)
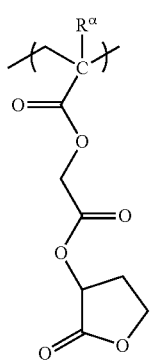 (a2-1-10)
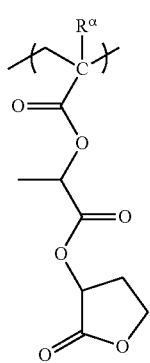 (a2-1-11)
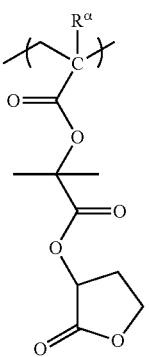 (a2-1-12)
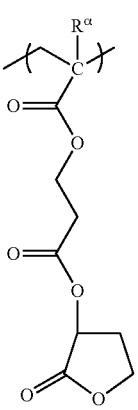 (a2-1-13)
[Chemical Formula 37]
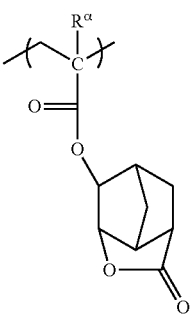 (a2-2-1)
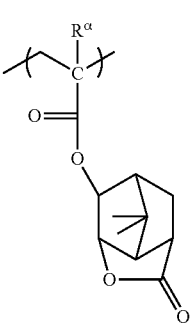 (a2-2-2)

-continued
(a2-2-3)
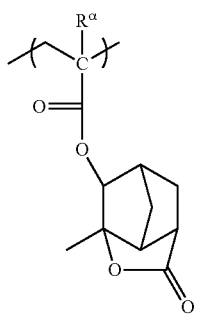
(a2-2-4)
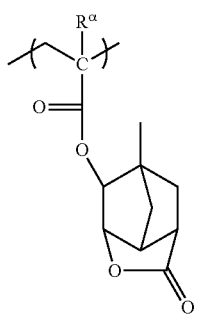
(a2-2-5)
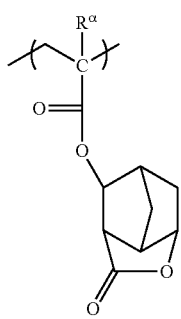
(a2-2-6)
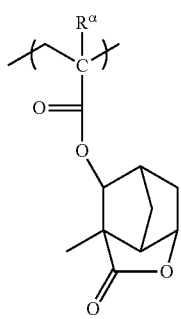
(a2-2-7)
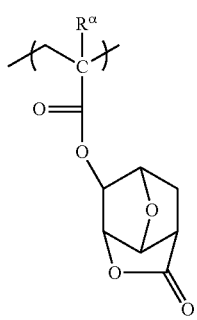
-continued
(a2-2-8)
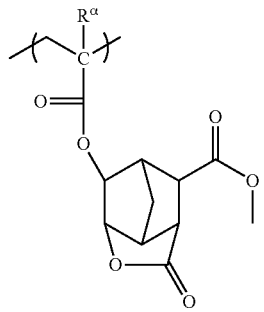
(a2-2-9)
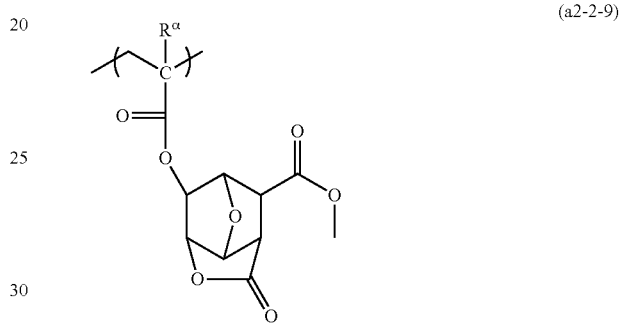
(a2-2-10)
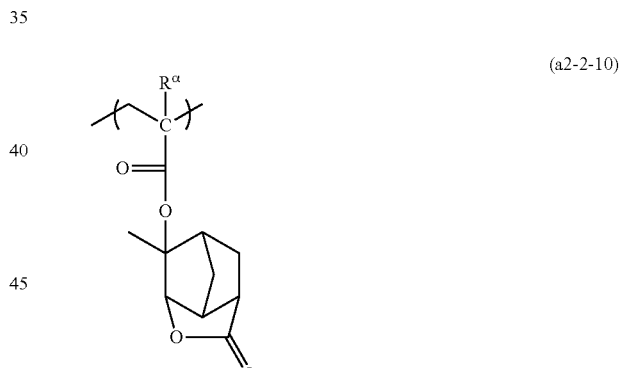
(a2-2-11)
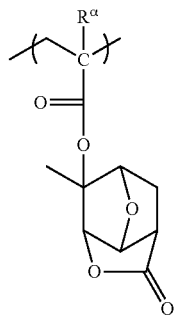

(a2-2-12)
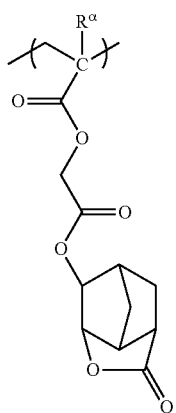
(a2-2-13)
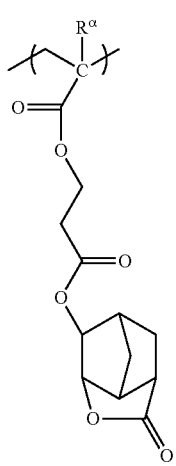
(a2-2-14)
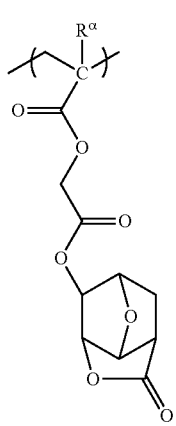
(a2-2-15)
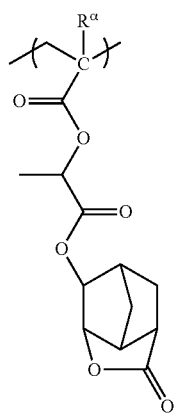
(a2-2-16)
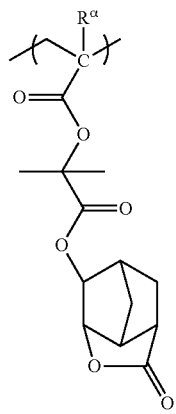
(a2-2-17)
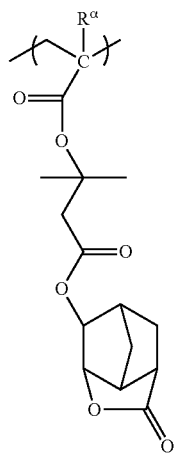
[Chemical Formula 38]
(a2-3-1)
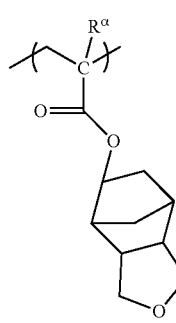

-continued
(a2-3-2)
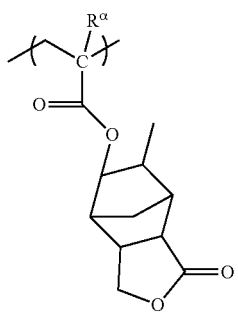
(a2-3-3)
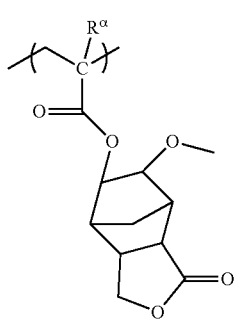
(a2-3-4)
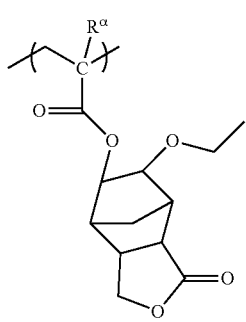
(a2-3-5)
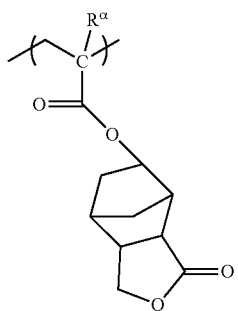
[Chemical Formula 39]
(a2-4-1)
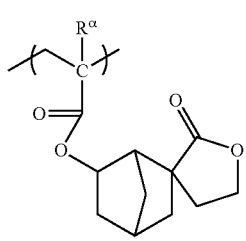
-continued
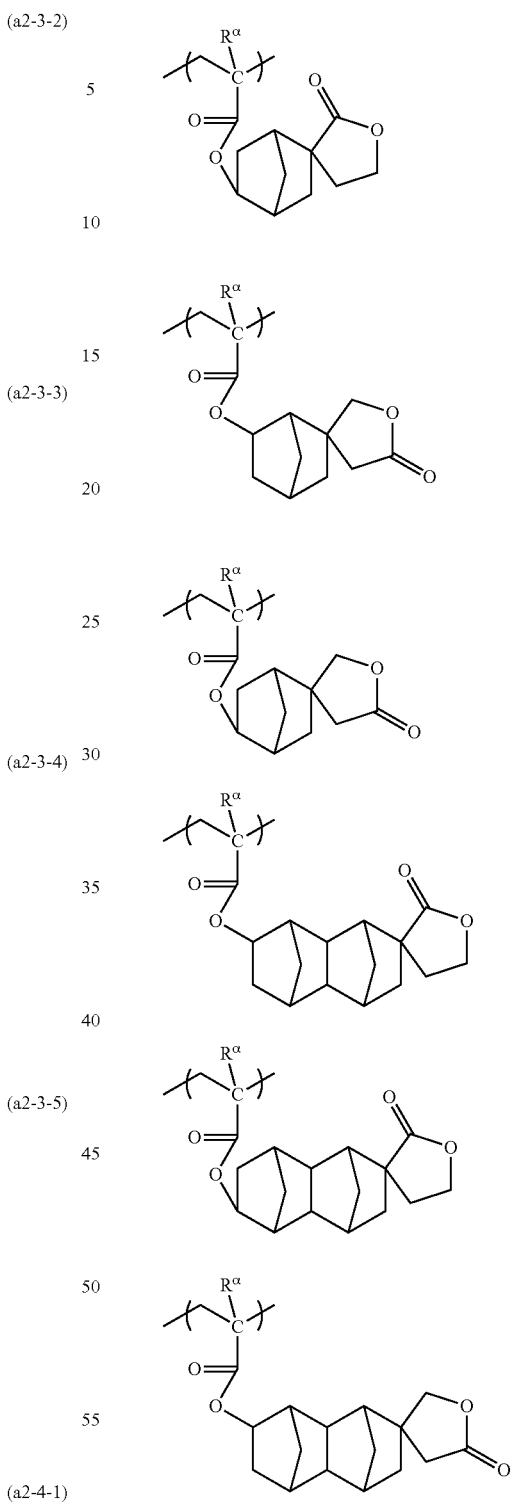
(a2-4-8)
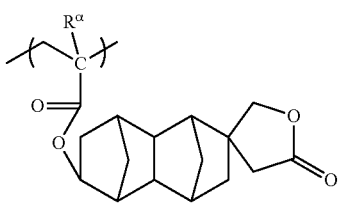

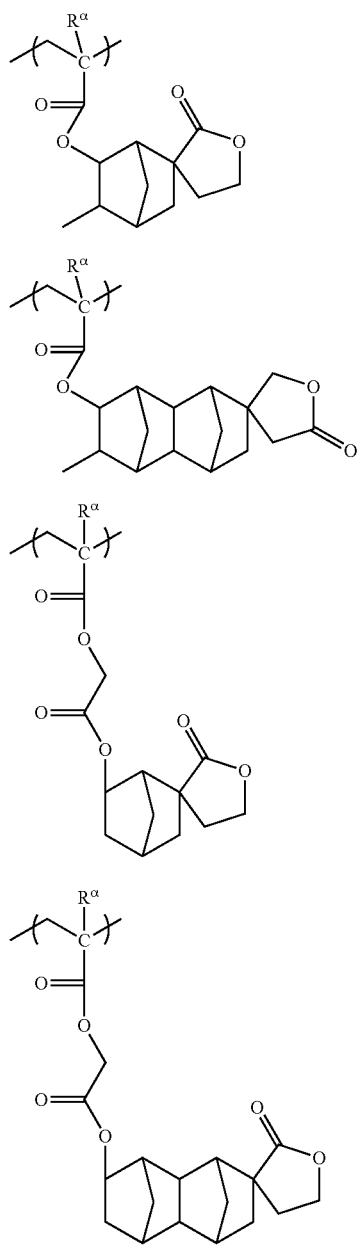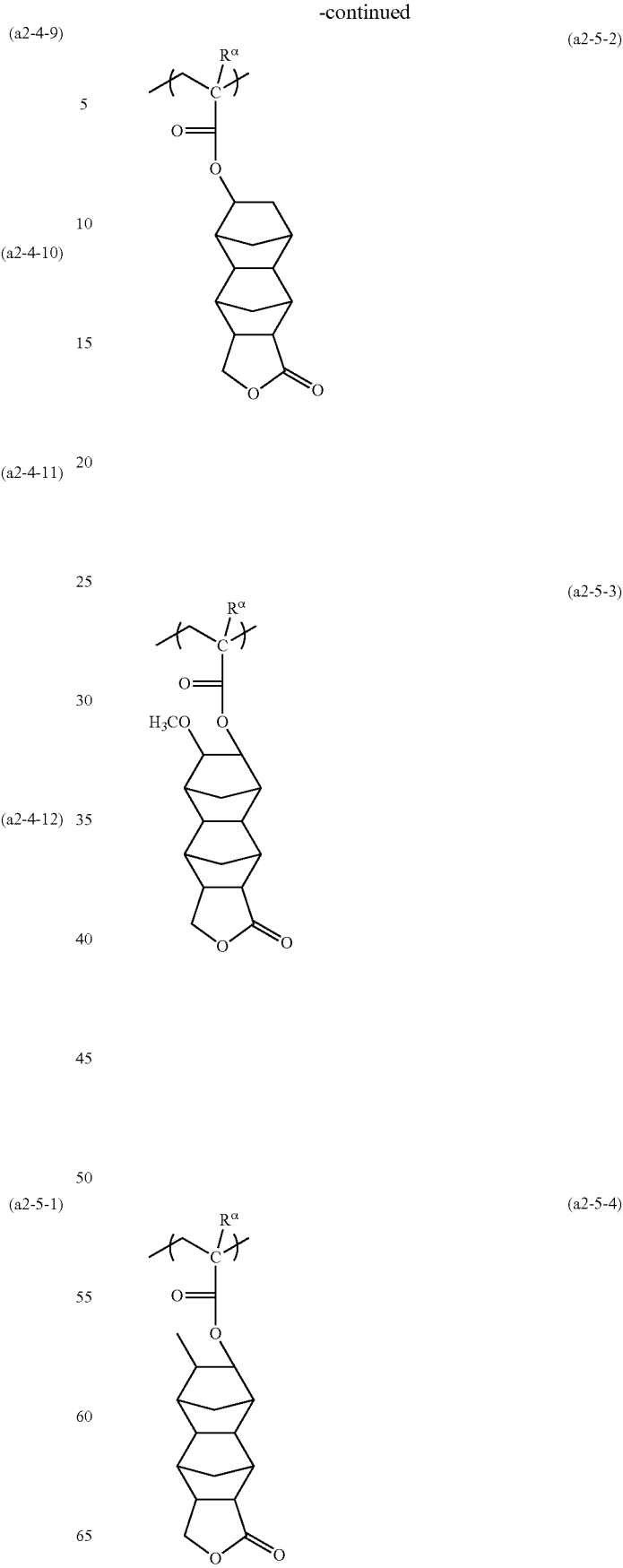

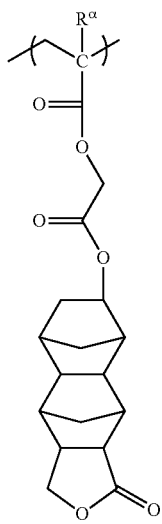

(a2-5-5)

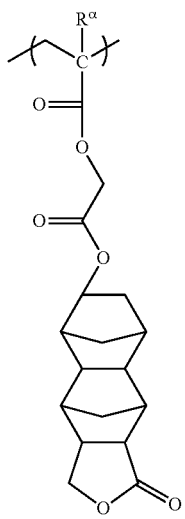

(a2-5-6)

As the structural unit (a2) contained in the component (A1), 1 type of structural unit may be used, or 2 or more types may be used.

As the structural unit (a2), at least one structural unit selected from the group consisting of formulas (a2-1) to (a2-5) is preferable, and at least one structural unit selected from the group consisting of formulas (a2-1) to (a2-3) is more preferable. Of these, it is preferable to use at least one structural unit selected from the group consisting of structural units represented by formulae (a2-1-1), (a2-1-2), (a2-2-1), (a2-2-7), (a2-2-12), (a2-2-14), (a2-3-1) and (a2-3-5).

In the component (A1), the amount of the structural unit (a2) based on the combined total of all structural units constituting the component (A1) is preferably 5 to 60 mol %, more preferably 10 to 50 mol %, and still more preferably 10 to 45 mol %. When the amount of the structural unit (a2) is at least as large as the lower limit of the above-mentioned range, the effect of using the structural unit (a2) can be satisfactorily achieved. On the other hand, when the amount of the structural unit (a2) is no more than the upper limit of the above-mentioned range, a good balance can be achieved with the other structural units.

(Structural Unit (a3))

The structural unit (a3) is a structural unit derived from an acrylate ester which may have the hydrogen atom bonded to the carbon atom on the α-position substituted with a substituent and contains a polar group-containing aliphatic hydrocarbon group (provided that the aforementioned structural units (a0), (a1) and (a2) are excluded from the structural unit (a3)).

When the component (A1) includes the structural unit (a3), the hydrophilicity of the component (A) at exposed portions is enhanced, such that the solubility of the component (A) in an organic developing solution is decreased, thereby contributing to improvement in resolution.

Examples of the polar group include a hydroxyl group, cyano group, carboxyl group, or hydroxyalkyl group in which part of the hydrogen atoms of the alkyl group have been substituted with fluorine atoms, although a hydroxyl group is particularly desirable.

Examples of the aliphatic hydrocarbon group include linear or branched hydrocarbon groups (preferably alkylene groups) of 1 to 10 carbon atoms, and cyclic aliphatic hydrocarbon groups (cyclic groups). These cyclic groups can be selected appropriately from the multitude of groups that have been proposed for the resins of resist compositions designed for use with ArF excimer lasers. The cyclic group is preferably a polycyclic group, more preferably a polycyclic group of 7 to 30 carbon atoms.

Of the various possibilities, structural units derived from an acrylate ester that include an aliphatic polycyclic group that contains a hydroxyl group, cyano group, carboxyl group or a hydroxyalkyl group in which part of the hydrogen atoms of the alkyl group have been substituted with fluorine atoms are particularly desirable. Examples of the polycyclic group include groups in which two or more hydrogen atoms have been removed from a bicycloalkane, tricycloalkane, tetracycloalkane or the like. Specific examples include groups in which two or more hydrogen atoms have been removed from a polycycloalkane such as adamantane, norbornane, isobornane, tricyclodecane or tetracyclododecane. Of these polycyclic groups, groups in which two or more hydrogen atoms have been removed from adamantane, norbornane or tetracyclododecane are preferred industrially.

When the aliphatic hydrocarbon group within the polar group-containing aliphatic hydrocarbon group is a linear or branched hydrocarbon group of 1 to 10 carbon atoms, the structural unit (a3) is preferably a structural unit derived from a hydroxyethyl ester of acrylic acid. On the other hand, when the hydrocarbon group is a polycyclic group, structural units represented by formulas (a3-1), (a3-2) and (a3-3) shown below are preferable.

[Chemical Formula 41]

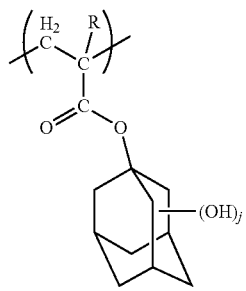

(a3-1)

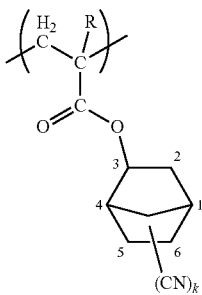
(a3-2)

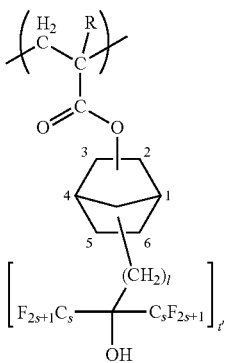
(a3-3)

In the formulas, R is the same as defined above; j is an integer of 1 to 3; k is an integer of 1 to 3; t' is an integer of 1 to 3; l is an integer of 1 to 5; and s is an integer of 1 to 3.

In formula (a3-1), j is preferably 1 or 2, and more preferably 1. When j is 2, it is preferable that the hydroxyl groups be bonded to the 3rd and 5th positions of the adamantyl group. When j is 1, it is preferable that the hydroxyl group be bonded to the 3rd position of the adamantyl group.

j is preferably 1, and it is particularly desirable that the hydroxyl group be bonded to the 3rd position of the adamantyl group.

In formula (a3-2), k is preferably 1. The cyano group is preferably bonded to the 5th or 6th position of the norbornyl group.

In formula (a3-3), t' is preferably 1. l is preferably 1. s is preferably 1. Further, it is preferable that a 2-norbornyl group or 3-norbornyl group be bonded to the terminal of the carboxy group of the acrylic acid. The fluorinated alkyl alcohol is preferably bonded to the 5th or 6th position of the norbornyl group.

As the structural unit (a3) contained in the component (A1), 1 type of structural unit may be used, or 2 or more types may be used.

The amount of the structural unit (a3) within the component (A1) based on the combined total of all structural units constituting the component (A1) is preferably 5 to 50 mol %, more preferably 5 to 40 mol %, and still more preferably 5 to 25 mol %. When the amount of the structural unit (a3) is at least as large as the lower limit of the above-mentioned range, the effect of using the structural unit (a3) can be satisfactorily achieved. On the other hand, when the amount of the structural unit (a3) is no more than the upper limit of the above-mentioned range, a good balance can be achieved with the other structural units.

(Other Structural Units)

The component (A1-1) may also include a structural unit other than the aforementioned structural units, as long as the effects of the present invention are not impaired.

As such a structural unit, any other structural unit which cannot be classified as the aforementioned structural units can be used without any particular limitation, and any of the multitude of conventional structural units used within resist resins for ArF excimer lasers or KrF excimer lasers (and particularly for ArF excimer lasers) can be used.

Examples of the other structural unit include a structural unit (a4) derived from an acrylate ester which may have the hydrogen atom bonded to the carbon atom on the α-position substituted with a substituent and contains an acid non-dissociable aliphatic polycyclic group, a structural unit (a5) derived from an acrylate ester which may have the hydrogen atom bonded to the carbon atom on the α-position substituted with a substituent and contains an —SO$_2$— containing cyclic group, a structural unit (a6) represented by general formula (a6-1) described later, and a structural unit (a7) represented by general formula (a7-1) described later.

—Structural Unit (a4)

The structural unit (a4) is a structural unit derived from an acrylate ester which may have the hydrogen atom bonded to the carbon atom on the α-position substituted with a substituent and contains an acid non-dissociable aliphatic polycyclic group.

In the structural unit (a4), examples of this polycyclic group include the same polycyclic groups as those described above in relation to the aforementioned structural unit (a1), and any of the multitude of conventional polycyclic groups used within the resin component of resist compositions for ArF excimer lasers or KrF excimer lasers (and particularly for ArF excimer lasers) can be used.

In consideration of industrial availability and the like, at least one polycyclic group selected from amongst a tricyclodecyl group, adamantyl group, tetracyclododecyl group, isobornyl group, and norbornyl group is particularly desirable. These polycyclic groups may be substituted with a linear or branched alkyl group of 1 to 5 carbon atoms.

Specific examples of the structural unit (a4) include units with structures represented by general formulas (a4-1) to (a4-5) shown below.

[Chemical Formula 42]

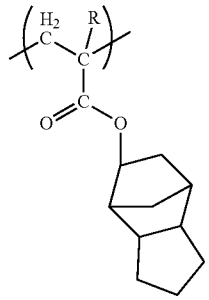
(a4-1)

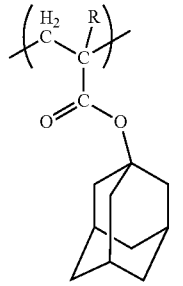
(a4-2)

(a4-3)

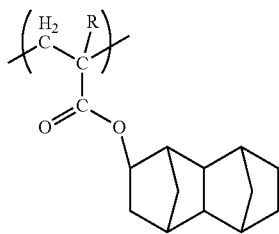

(a4-4)

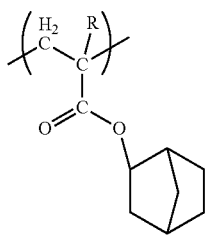

(a4-5)

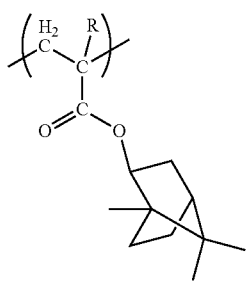

In the formulae, R is the same as defined above.

When the structural unit (a4) is included in the component (A1), the amount of the structural unit (a4) based on the combined total of all the structural units that constitute the component (A1) is preferably within the range from 1 to 30 mol %, and more preferably from 10 to 20 mol %.

—Structural Unit (a5)

The structural unit (a5) is a structural unit derived from an acrylate ester which may have the hydrogen atom bonded to the carbon atom on the α-position substituted with a substituent and contains an —SO$_2$— containing cyclic group.

By virtue of the structural unit (a5) containing a —SO$_2$— containing cyclic group, a resist composition containing the component (A1) including the structural unit (a5) is capable of improving the adhesion of a resist film to a substrate. Further, the —SO$_2$-containing cyclic group contributes to improvement in various lithography properties such as sensitivity, resolution, exposure latitude (EL margin), line width roughness (LWR), line edge roughness (LER) and mask reproducibility.

Here, an "—SO$_2$— containing cyclic group" refers to a cyclic group having a ring containing —SO$_2$— within the ring structure thereof, i.e., a cyclic group in which the sulfur atom (S) within —SO$_2$— forms part of the ring skeleton of the cyclic group.

In the —SO$_2$— containing cyclic group, the ring containing —SO$_2$— within the ring skeleton thereof is counted as the first ring. A cyclic group in which the only ring structure is the ring that contains —SO$_2$— in the ring skeleton thereof is referred to as a monocyclic group, and a group containing other ring structures is described as a polycyclic group regardless of the structure of the other rings.

The —SO$_2$— containing cyclic group may be either a monocyclic group or a polycyclic group.

As the —SO$_2$— containing cyclic group, a cyclic group containing —O—SO$_2$— within the ring skeleton thereof, i.e., a cyclic group containing a sultone ring in which —O—S— within the —O—SO$_2$— group forms part of the ring skeleton thereof is particularly desirable.

The —SO$_2$— containing cyclic group preferably has 3 to 30 carbon atoms, more preferably 4 to 20, still more preferably 4 to 15, and most preferably 4 to 12. Herein, the number of carbon atoms refers to the number of carbon atoms constituting the ring skeleton, excluding the number of carbon atoms within a substituent.

The —SO$_2$— containing cyclic group may be either a —SO$_2$— containing aliphatic cyclic group or a —SO$_2$— containing aromatic cyclic group. A —SO$_2$— containing aliphatic cyclic group is preferable.

Examples of the —SO$_2$— containing aliphatic cyclic group include aliphatic cyclic groups in which part of the carbon atoms constituting the ring skeleton has been substituted with a —SO$_2$— group or a —O—SO$_2$— group and has at least one hydrogen atom removed from the aliphatic hydrocarbon ring. Specific examples include an aliphatic hydrocarbon ring in which a —CH$_2$— group constituting the ring skeleton thereof has been substituted with a —SO$_2$— group and has at least one hydrogen atom removed therefrom; and an aliphatic hydrocarbon ring in which a —CH$_2$—CH$_2$— group constituting the ring skeleton has been substituted with a —O—SO$_2$— group and has at least one hydrogen atom removed therefrom.

The alicyclic hydrocarbon group preferably has 3 to 20 carbon atoms, and more preferably 3 to 12 carbon atoms.

The alicyclic hydrocarbon group may be either a monocyclic group or a polycyclic group. As the monocyclic group, a group in which two hydrogen atoms have been removed from a monocycloalkane of 3 to 6 carbon atoms is preferable. Examples of the monocycloalkane include cyclopentane and cyclohexane. As the polycyclic group, a group in which two hydrogen atoms have been removed from a polycycloalkane of 7 to 12 carbon atoms is preferable. Examples of the polycycloalkane include adamantane, norbornane, isobornane, tricyclodecane and tetracyclododecane.

The —SO$_2$— containing cyclic group may have a substituent. Examples of the substituent include an alkyl group, an alkoxy group, a halogen atom, a halogenated alkyl group, a hydroxy group, an oxygen atom (=O), —COOR", —OC(=O)R", a hydroxyalkyl group and a cyano group (wherein R" represents a hydrogen atom or an alkyl group).

The alkyl group for the substituent is preferably an alkyl group of 1 to 6 carbon atoms. Further, the alkyl group is preferably a linear alkyl group or a branched alkyl group. Specific examples include a methyl group, an ethyl group, a propyl group, an isopropyl group, an n-butyl group, an isobutyl group, a tert-butyl group, a pentyl group, an isopentyl group, a neopentyl group and a hexyl group. Among these, a methyl group or ethyl group is preferable, and a methyl group is particularly desirable.

As the alkoxy group for the substituent, an alkoxy group of 1 to 6 carbon atoms is preferable. Further, the alkoxy group is preferably a linear or branched alkoxy group. Specific examples of the alkoxy group include the aforementioned alkyl groups for the substituent having an oxygen atom (—O—) bonded thereto.

Examples of the halogen atom for the substituent include a fluorine atom, a chlorine atom, a bromine atom and an iodine atom, and a fluorine atom is preferable.

Examples of the halogenated alkyl group for the substituent include groups in which part or all of the hydrogen atoms within the aforementioned alkyl groups has been substituted with the aforementioned halogen atoms.

As examples of the halogenated alkyl group for the substituent, groups in which part or all of the hydrogen atoms of the aforementioned alkyl groups for the substituent have been substituted with the aforementioned halogen atoms can be given. As the halogenated alkyl group, a fluorinated alkyl group is preferable, and a perfluoroalkyl group is particularly desirable.

In the —COOR" group and the —OC(═O)R" group, R" preferably represents a hydrogen atom or a linear, branched or cyclic alkyl group of 1 to 15 carbon atoms.

When R" represents a linear or branched alkyl group, it is preferably an alkyl group of 1 to 10 carbon atoms, more preferably an alkyl group of 1 to 5 carbon atoms, and most preferably a methyl group or an ethyl group.

When R" is a cyclic alkyl group (cycloalkyl group), it preferably has 3 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane.

The hydroxyalkyl group for the substituent preferably has 1 to 6 carbon atoms, and specific examples thereof include the aforementioned alkyl groups for the substituent in which at least one hydrogen atom has been substituted with a hydroxy group.

More specific examples of the —SO$_2$— containing cyclic group include groups represented by general formulas (3-1) to (3-4) shown below.

[Chemical Formula 43]

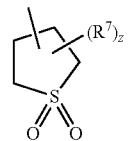

(3-1)

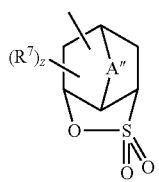

(3-2)

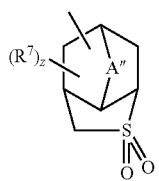

(3-3)

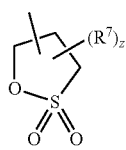

(3-4)

In the formulas, A" represents an oxygen atom, a sulfur atom or an alkylene group of 1 to 5 carbon atoms which may contain an oxygen atom or a sulfur atom; z represents an integer of 0 to 2; and R$^7$ represents an alkyl group, an alkoxy group, a halogenated alkyl group, a hydroxyl group, —COOR", —OC(═O)R", a hydroxyalkyl group or a cyano group, wherein R" represents a hydrogen atom or an alkyl group.

In general formulas (3-1) to (3-4) above, A" represents an oxygen atom (—O—), a sulfur atom (—S—) or an alkylene group of 1 to 5 carbon atoms which may contain an oxygen atom or a sulfur atom.

As the alkylene group of 1 to 5 carbon atoms for A", a linear or branched alkylene group is preferable, and examples thereof include a methylene group, an ethylene group, an n-propylene group and an isopropylene group.

Examples of alkylene groups that contain an oxygen atom or a sulfur atom include the aforementioned alkylene groups in which —O— or —S— is bonded to the terminal of the alkylene group or present between the carbon atoms of the alkylene group. Specific examples of such alkylene groups include —O—CH$_2$—, —CH$_2$—O—CH$_2$—, —S—CH$_2$—, —CH$_2$—S—CH$_2$—.

As A", an alkylene group of 1 to 5 carbon atoms or —O— is preferable, more preferably an alkylene group of 1 to 5 carbon atoms, and most preferably a methylene group.

z represents an integer of 0 to 2, and is most preferably 0.

When z is 2, the plurality of R$^7$ may be the same or different from each other.

As the alkyl group, alkoxy group, halogenated alkyl group, —COOR", —OC(═O)R" and hydroxyalkyl group for R$^7$, the same alkyl groups, alkoxy groups, halogenated alkyl groups, —COOR", —OC(═O)R" and hydroxyalkyl groups as those described above as the substituent for the —SO$_2$— containing cyclic group can be mentioned.

Specific examples of the cyclic groups represented by general formulas (3-1) to (3-4) are shown below. In the formulas shown below, "Ac" represents an acetyl group.

[Chemical Formula 44]

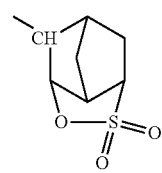

(3-1-1)

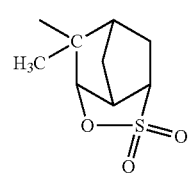

(3-1-2)

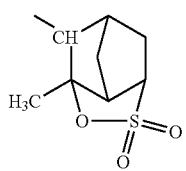
(3-1-3)
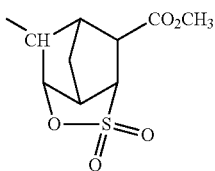
(3-1-10)
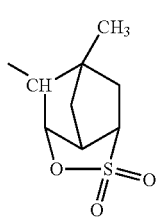
(3-1-4)
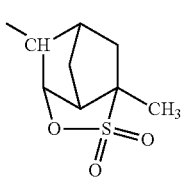
(3-1-11)
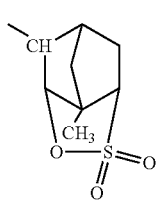
(3-1-5)
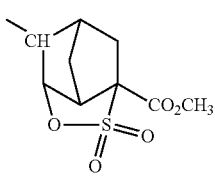
(3-1-12)
[Chemical Formula 45]
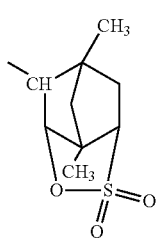
(3-1-6)
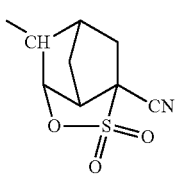
(3-1-13)
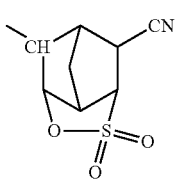
(3-1-14)
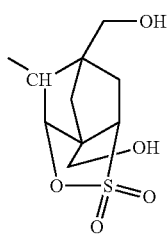
(3-1-7)
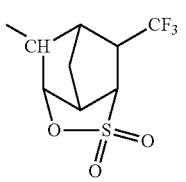
(3-1-15)
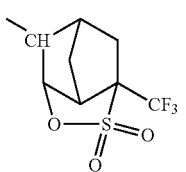
(3-1-16)
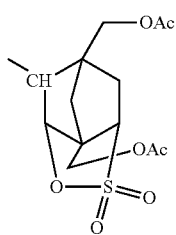
(3-1-8)
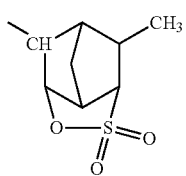
(3-1-9)
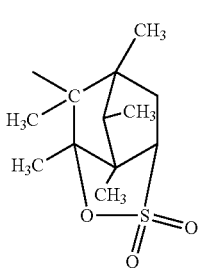
(3-1-17)

[Chemical Formula 46]
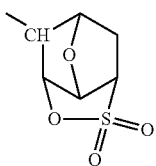 (3-1-18)
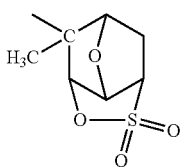 (3-1-19)
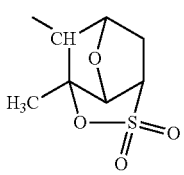 (3-1-20)
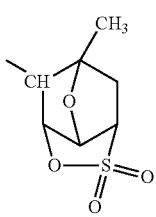 (3-1-21)
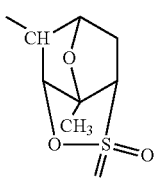 (3-1-22)
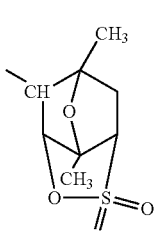 (3-1-23)
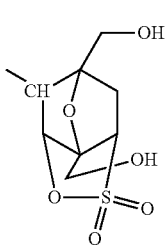 (3-1-24)
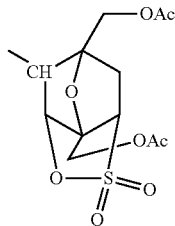 (3-1-25)
[Chemical Formula 47]
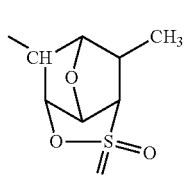 (3-1-26)
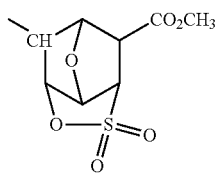 (3-1-27)
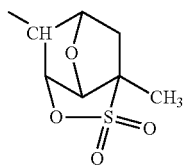 (3-1-28)
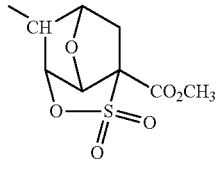 (3-1-29)
(3-1-30)
(3-1-31)
(3-1-32)

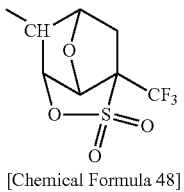

(3-1-33)

[Chemical Formula 48]

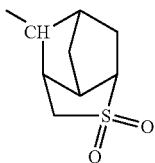

(3-2-1)

(3-2-2)

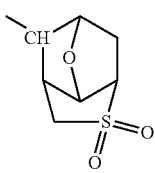

(3-3-1)

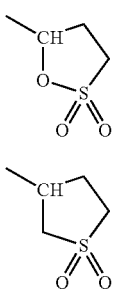

(3-4-1)

As the —$SO_2$— containing cyclic group, a group represented by the aforementioned general formula (3-1) is preferable, at least one member selected from the group consisting of groups represented by the aforementioned chemical formulas (3-1-1), (3-1-18), (3-3-1) and (3-4-1) is more preferable, and a group represented by chemical formula (3-1-1) is most preferable.

More specifically, examples of the structural unit (a5) include structural units represented by general formula (a5-0) shown below.

[Chemical Formula 49]

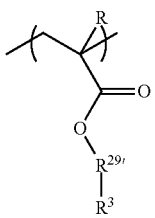

(a5-0)

In the formula, R represents a hydrogen atom, an alkyl group of 1 to 5 carbon atoms or a halogenated alkyl group of 1 to 5 carbon atoms; $R^3$ represents a —$SO_2$-containing cyclic group; and $R^{29'}$ represents a single bond or a divalent linking group.

In general formula (a5-0), R represents a hydrogen atom, an alkyl group of 1 to 5 carbon atoms or a halogenated alkyl group of 1 to 5 carbon atoms.

As the alkyl group of 1 to 5 carbon atoms for R, a linear or branched alkyl group of 1 to 5 carbon atoms is preferable, and specific examples thereof include a methyl group, an ethyl group, a propyl group, an isopropyl group, an n-butyl group, an isobutyl group, a tert-butyl group, a pentyl group, an isopentyl group and a neopentyl group.

The halogenated alkyl group for R is a group in which part or all of the hydrogen atoms of the aforementioned alkyl group of 1 to 5 carbon atoms has been substituted with halogen atoms. Examples of the halogen atom include a fluorine atom, a chlorine atom, a bromine atom and an iodine atom, and a fluorine atom is particularly desirable.

As R, a hydrogen atom, an alkyl group of 1 to 5 carbon atoms or a fluorinated alkyl group of 1 to 5 carbon atoms is preferable, and a hydrogen atom or a methyl group is particularly desirable in terms of industrial availability.

In formula (a5-0), $R^3$ is the same as defined for the aforementioned —$SO_2$— containing group.

$R^{29'}$ may be a single bond or a divalent linking group. In terms of the effects of the present invention, a divalent linking group is preferable.

As the divalent linking group for $R^{29}$, for example, the same divalent linking groups as those described for $Y^2$ in general formula (a1-0-2) explained above in relation to the structural unit (a1) can be mentioned.

As the divalent linking group for $R^{29'}$, an alkylene group, a divalent alicyclic hydrocarbon group or a divalent linking group containing a hetero atom is preferable. Among these, an alkylene group or a divalent linking group containing an ester bond (—C(=O)—O—) is preferable.

As the alkylene group, a linear or branched alkylene group is preferable. Specific examples include the same linear alkylene groups and branched alkylene groups as those described above for the aliphatic hydrocarbon group represented by $Y^2$.

As the divalent linking group containing an ester bond, a group represented by general formula: —$R^2$—C(=O)—O— (in the formula, $R^2$ represents a divalent linking group) is particularly desirable. Namely, the structural unit (a5) is preferably a structural unit represented by general formula (a5-0-1) shown below.

[Chemical Formula 50]

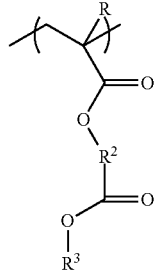

(a5-0-1)

In the formula, R represents a hydrogen atom, an alkyl group of 1 to 5 carbon atoms or a halogenated alkyl group of 1 to 5 carbon atoms; $R^2$ represents a divalent linking group; and $R^3$ represents an —$SO_2$— containing cyclic group.

$R^2$ is not particularly limited. For example, the same divalent linking groups as those described for $R^{29'}$ in general formula (a5-0) can be mentioned.

As the divalent linking group for $R^2$, an alkylene group, a divalent alicyclic hydrocarbon group or a divalent linking group containing a hetero atom is preferable.

As the linear or branched alkylene group, the divalent alicyclic hydrocarbon group and the divalent linking group containing a hetero atom, the same linear or branched alkylene group, divalent alicyclic hydrocarbon group and divalent linking group containing a hetero atom as those described above as preferable examples of $R^{29'}$ can be mentioned.

Among these, a linear or branched alkylene group, or a divalent linking group containing an oxygen atom as a hetero atom is more preferable.

As the linear alkylene group, a methylene group or an ethylene group is preferable, and a methylene group is particularly desirable.

As the branched alkylene group, an alkylmethylene group or an alkylethylene group is preferable, and —CH(CH$_3$)—, —C(CH$_3$)$_2$— or —C(CH$_3$)$_2$CH$_2$— is particularly desirable.

As the divalent linking group containing a hetero atom, a divalent linking group containing an ether bond or an ester bond is preferable, and a group represented by the aforementioned formula —Y$^{21}$—O—Y$^{22}$—, —[Y$^{21}$—C(=O)—O]$_{m'}$—Y$^{22}$— or —Y$^{21}$—O—C(=O)—Y$^{22}$— is more preferable. Y$^{21}$, Y$^{22}$ and a are the same as defined above.

Among these, a group represented by the formula —Y$^{21}$—O—C(=O)—Y$^{22}$—, and a group represented by the formula —(CH$_2$)$_c'$—O—C(=O)—(CH$_2$)$_d'$— is particularly desirable. c' represents an integer of 1 to 5, preferably an integer of 1 to 3, and more preferably 1 or 2. d' represents an integer of 1 to 5, preferably an integer of 1 to 3, and more preferably 1 or 2.

In particular, as the structural unit (a5), a structural unit represented by general formula (a5-0-11) or (a5-0-12) shown below is preferable, and a structural unit represented by general formula (a5-0-12) is more preferable.

[Chemical Formula 51]

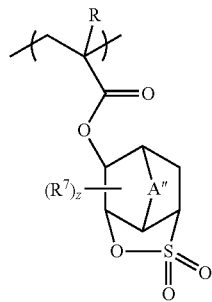

(a5-0-11)

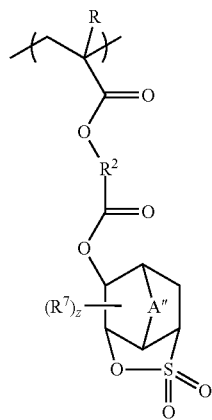

(a5-0-12)

In the formulas, R, A", $R^7$, z and $R^2$ are the same as defined above.

In general formula (a5-0-11), A" is preferably a methylene group, an ethylene group, an oxygen atom (—O—) or a sulfur atom (—S—).

As $R^2$, a linear or branched alkylene group or a divalent linking group containing an oxygen atom is preferable. As the linear or branched alkylene group and the divalent linking group containing an oxygen atom represented by $R^2$, the same linear or branched alkylene groups and the divalent linking groups containing an oxygen atom as those described above can be mentioned.

As the structural unit represented by general formula (a5-0-12), a structural unit represented by general formula (a5-0-12a) or (a5-0-12b) shown below is particularly desirable.

[Chemical Formula 52]

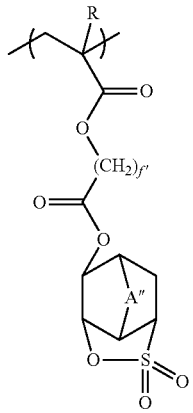

(a5-0-12a)

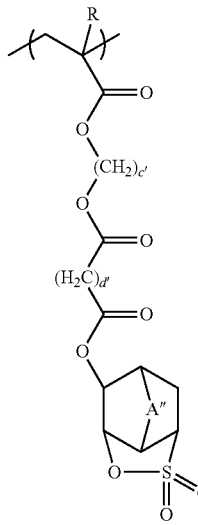

(a5-0-12b)

In the formulae, R and A" are the same as defined above; c' and d' are the same as defined above; and f' represents an integer of 1 to 3.

As the structural unit (a5) contained in the component (A1), 1 type of structural unit may be used, or 2 or more types may be used.

In terms of achieving an excellent shape for a resist pattern formed using a positive resist composition containing the component (A1) and excellent lithography properties such as EL margin, LWR and mask reproducibility, the amount of the structural unit (a5) within the component (A1), based on the combined total of all structural units constituting the component (A1) is preferably 1 to 60 mol %, more preferably 5 to 55 mol %, still more preferably 10 to 50 mol %, and most preferably 15 to 50 mol %.

—Structural Unit (a6)

The structural unit (a6) is a structural unit represented by general formula (a6-1) shown below.

[Chemical Formula 53]

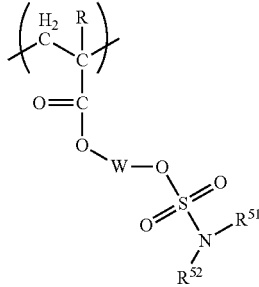

(a6-1)

In the formula, R represents a hydrogen atom, an alkyl group of 1 to 5 carbon atoms or a halogenated alkyl group of 1 to 5 carbon atoms; each of $R^{51}$ and $R^{52}$ independently represents a hydrogen atom or an alkyl group that may contain an oxygen atom at an arbitrary position, or $R^{51}$ and $R^{52}$ are bonded together to form an alkylene group; and W represents a cyclic alkylene group that may include an oxygen atom at an arbitrary position.

In general formula (a6-1), R represents a hydrogen atom, an alkyl group of 1 to 5 carbon atoms or a halogenated alkyl group of 1 to 5 carbon atoms, and is the same as defined for R described above in the explanation of the component (A).

Specific examples of the alkyl group of 1 to 5 carbon atoms for R include linear or branched alkyl groups such as a methyl group, an ethyl group, a propyl group, an isopropyl group, an n-butyl group, an isobutyl group, a tert-butyl group, a pentyl group, an isopentyl group and a neopentyl group.

Specific examples of the halogenated lower alkyl group for R include groups in which part or all of the hydrogen atoms of the aforementioned lower alkyl group have been substituted with halogen atoms. Examples of the halogen atom include a fluorine atom, a chlorine atom, a bromine atom and an iodine atom, and a fluorine atom is particularly desirable. The fluorinated alkyl group is preferably a linear or branched fluorinated alkyl group, and specific examples thereof include a monofluoromethyl group, a difluoromethyl group, a trifluoromethyl group, a perfluoroethyl group, a perfluoropropyl group, a perfluoroisopropyl group, a perfluorobutyl group, a perfluoroisobutyl group, a perfluoro-tert-butyl group, a perfluoropentyl group, a perfluoroisopentyl group and a perfluoroneopentyl group.

As R, a hydrogen atom, an alkyl group of 1 to 5 carbon atoms or a fluorinated alkyl group of 1 to 5 carbon atoms is preferable, a hydrogen atom, a methyl group or a trifluoromethyl group is more preferable, a hydrogen atom or a methyl group is still more preferable, and a methyl group is particularly desirable.

In general formula (a6-1), the alkyl groups for $R^{51}$ and $R^{52}$ may be linear, branched or cyclic groups.

As the linear or branched alkyl group, alkyl groups of 1 to 8 carbon atoms are preferable, and alkyl groups of 1 to 5 carbon atoms are more preferable. Specific examples thereof include a methyl group, an ethyl group, an n-propyl group, an i-propyl group, an n-butyl group, an i-butyl group, a t-butyl group, a 2-methyl-2-butyl group, a 3-methyl-2-butyl group, a 1-pentyl group, a 2-pentyl group, a 3-pentyl group and a branched tertiary alkyl group described later.

Examples of the cyclic alkyl group include a cyclopropyl group, a cyclobutyl group, a cyclopentyl group, a 1-methyl-1-cyclopentyl group, a 1-ethyl-1-cyclopentyl group, a cyclohexyl group, a 1-methyl-1-cyclohexyl group, a 1-ethyl-1-cyclohexyl group, a 1-methyl-1-cycloheptyl group, a 1-ethyl-1-cycloheptyl group, a 1-methyl-1-cyclooctyl group, a 1-ethyl-1-cyclooctyl group, a bicyclo[2.2.1]heptan-2-yl group, a 1-adamantyl group, a 2-adamantyl group, a 2-methyl-2-adamantyl group, and a 2-ethyl-2-adamantyl group.

The linear or branched alkyl groups for $R^{51}$ and $R^{52}$ may have a cyclic alkyl group as a substituent. Furthermore, the cyclic alkyl groups for $R^{51}$ and $R^{52}$ may include a linear or branched alkyl group, a fluorine atom, a fluorinated alkyl group of 1 to 5 carbon atoms, an oxygen atom (=O) or the like as a substituent. Examples of the cyclic alkyl group and the linear or branched alkyl group as the substituent include the same groups as those described above.

The alkyl groups for $R^{51}$ and $R^{52}$ may include an oxygen atom at an arbitrary position. The expression "include an oxygen atom" means that an oxygen atom (—O—) is introduced into the carbon chain of the alkyl group. Examples of alkyl groups that include an oxygen atom include acetal-type acid-dissociable groups such as the alkoxyalkyl groups described later.

In the structural unit (a6), at least one of $R^{51}$ and $R^{52}$ may be an acid dissociable group.

"The acid dissociable group" is the same as defined for the acid dissociable group in the aforementioned structural unit (a1). Examples of the acid dissociable group include a tertiary alkyl ester-type acid dissociable group (e.g., an aliphatic branched, acid dissociable group or an aliphatic cyclic group-containing acid dissociable group) and an acetal-type acid dissociable group. As the acid dissociable group, the same groups as those described above for the structural unit (a1) can be mentioned.

For example, in those cases where at least one of $R^{51}$ and $R^{52}$ in the structural unit (a6) is a tertiary alkyl group, the tertiary carbon atom of the tertiary alkyl group is bonded to the nitrogen atom at the terminal of the sulfamoyloxy group (—OSO$_2$N— group). In this tertiary alkyl group, the action of the acid generated from the component (A1) (structural unit (a0)) upon exposure during formation of a resist pattern causes a cleavage of the bond between the nitrogen atom at the terminal of the sulfamoyloxy group (—OSO$_2$N— group) and the tertiary carbon atom.

In those cases where at least one of $R^{51}$ and $R^{52}$ in the structural unit (a6) is an acetal-type acid dissociable group, the acetal-type acid dissociable group is bonded to the nitrogen atom at the terminal of the sulfamoyloxy group (—OSO$_2$N— group). In this acetal-type acid-dissociable group, the action of the acid generated from the component (A1) (structural unit (a0)) upon exposure during formation of a resist pattern using the resist composition causes a cleavage of the bond between the nitrogen atom and the acetal-type acid-dissociable group.

The alkylene group formed in those cases where $R^{51}$ and $R^{52}$ are bonded together is preferably a linear or branched alkylene group, and is more preferably a linear alkylene group. The alkylene group preferably contains 1 to 5 carbon atoms, and specific examples thereof include an ethanediyl group, a propane-1,3-diyl group and a butane-1,4-diyl group.

In the present invention, in terms of forming a resist pattern having an excellent shape, it is preferable that at least one of $R^{51}$ and $R^{52}$ (for example, $R^{51}$) is a hydrogen atom, and it is particularly desirable that $R^{51}$ and $R^{52}$ are both hydrogen atoms.

In general formula (a6-1), in terms of improvement in various lithography properties, the cyclic alkylene group represented by W, which may include an oxygen atom at an arbitrary position, may be either a monocyclic group or a polycyclic group. In terms of raising the Tg to improve lithography properties and improving the etching resistance, a polycyclic group is preferable, and a bi-, tri- or tetra-cyclic group is particularly desirable.

The number of carbon atoms within the alkylene group is preferably within a range from 3 to 20, and is more preferably from 5 to 12.

Specific examples of the alkylene group include a cyclopropanediyl group, a cyclobutane-1,2-diyl group, a cyclobutane-1,3-diyl group, a cyclopentane-1,2-diyl group, a cyclopentane-1,3-diyl group, a cyclohexane-1,2-diyl group, a cyclohexane-1,3-diyl group, a cyclohexane-1,4-diyl group, a bicyclo[2.2.1]heptane-2,3-diyl group, a bicyclo[2.2.1]heptane-2,5-diyl group, a 7-oxabicyclo[2.2.1]heptane-2,5-diyl group, a bicyclo[2.2.1]heptane-2,6-diyl group, a 7-oxabicyclo[2.2.1]heptane-2,6-diyl group, an adamantane-1,3-diyl group, and an adamantane-1,2-diyl group.

Specific examples of structural units represented by general formula (a6-1) are shown below.

In the following formulas, "Me" represents a methyl group.

[Chemical Formula 54]

(a6-1-1)

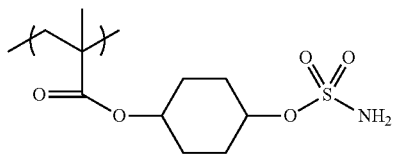

(a6-1-2)

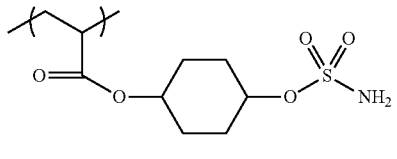

(a6-1-3)

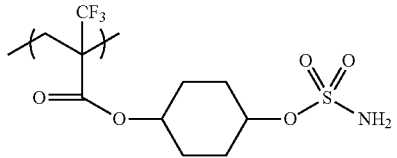

(a6-1-4)

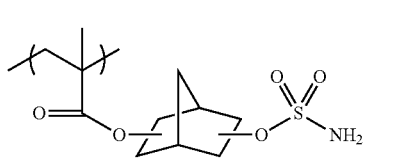

(a6-1-5)

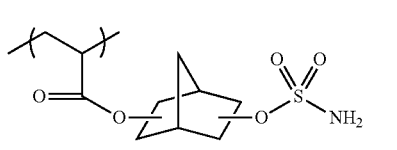

-continued (a6-1-6)

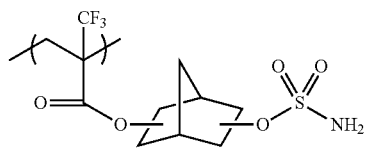

(a6-1-7)

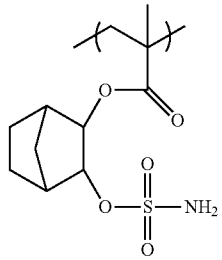

(a6-1-8)

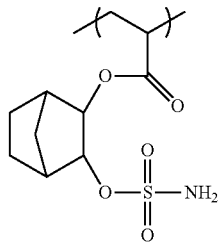

(a6-1-9)

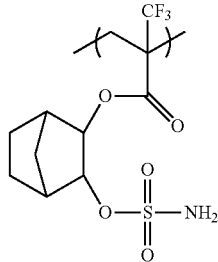

(a6-1-10)

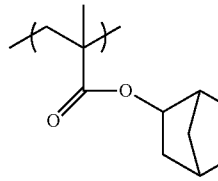

(a6-1-11)

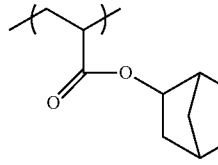

(a6-1-12)

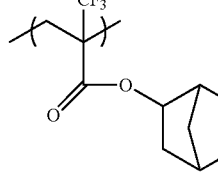

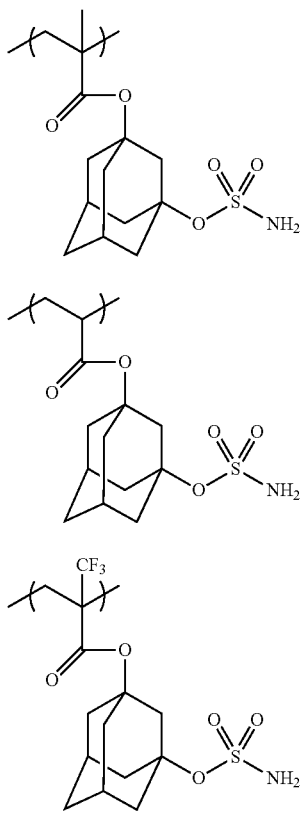
(a6-1-13)
(a6-1-14)
(a6-1-15)
[Chemical Formula 55]
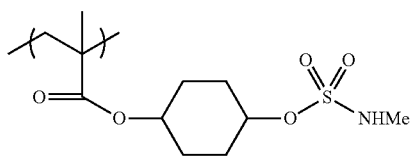
(a6-1-16)
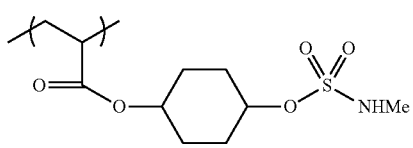
(a6-1-17)
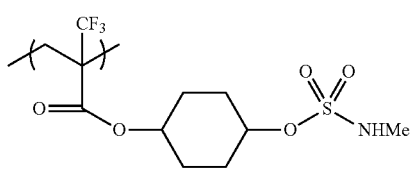
(a6-1-18)
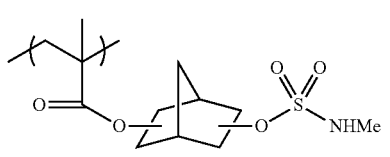
(a6-1-19)
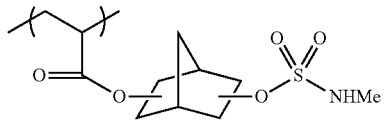
(a6-1-20)
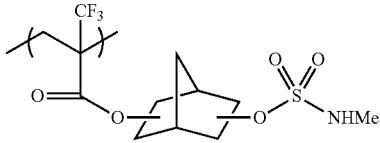
(a6-1-21)
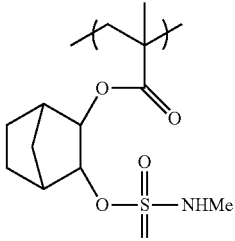
(a6-1-22)
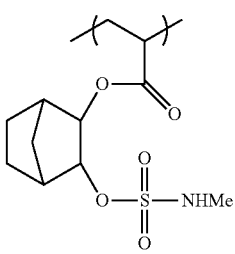
(a6-1-23)
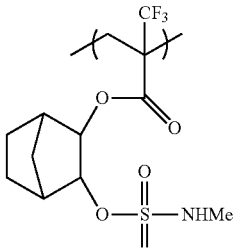
(a6-1-24)
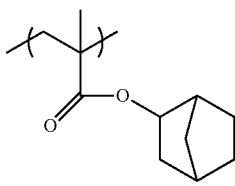
(a6-1-25)
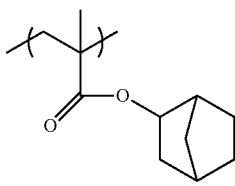
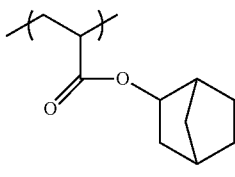
(a6-1-26)
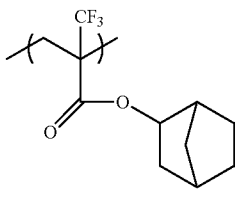
(a6-1-27)

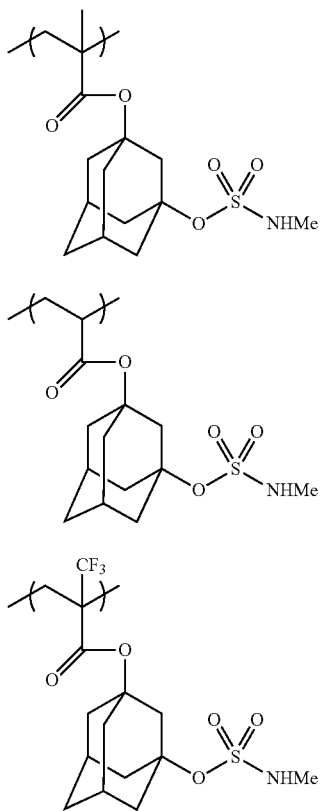
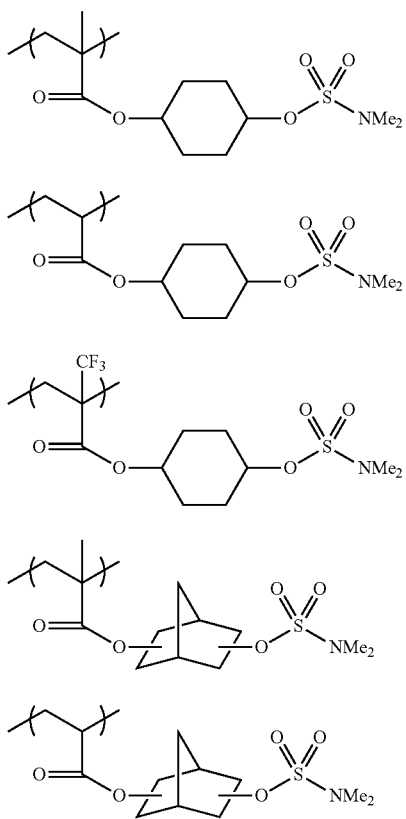
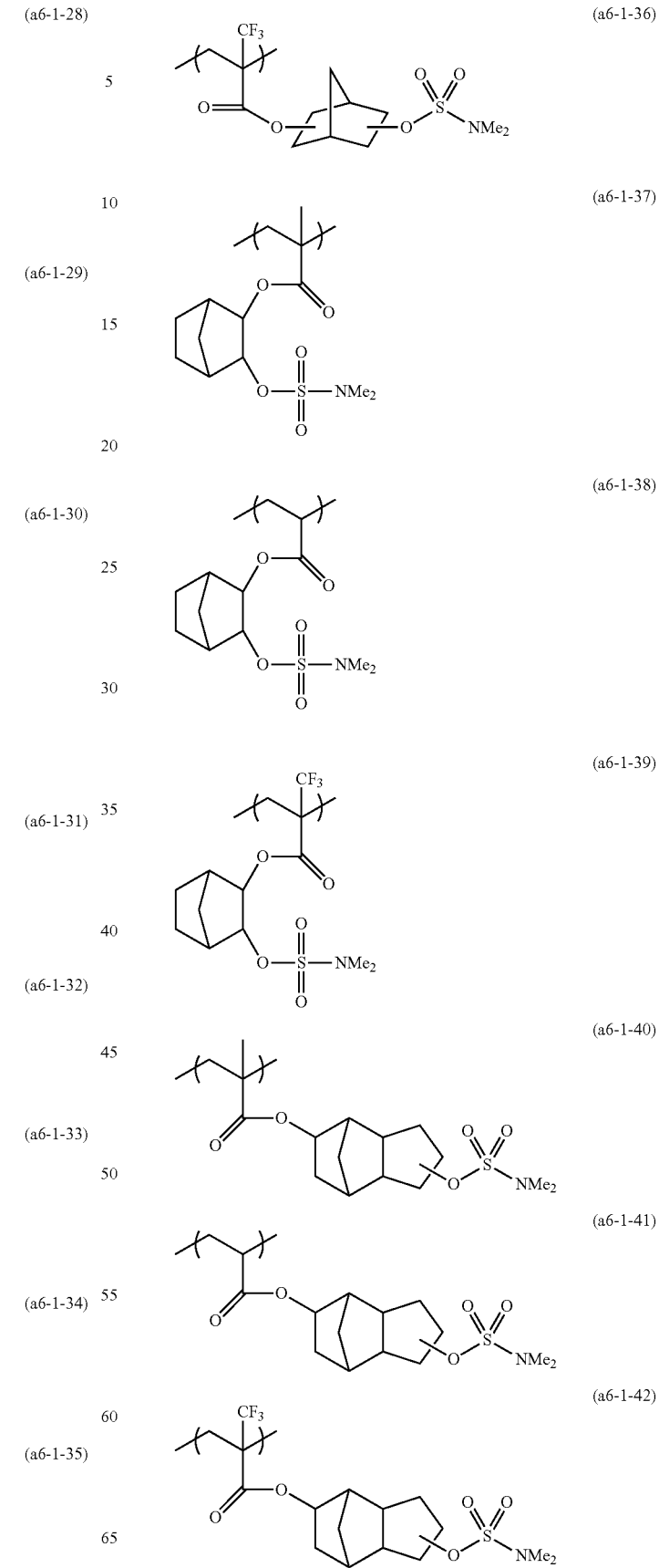

(a6-1-43)
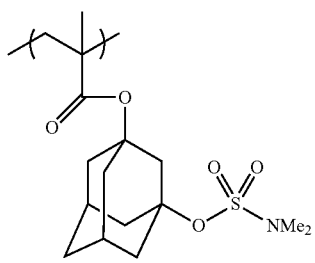
(a6-1-44)
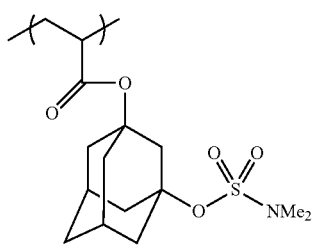
(a6-1-45)
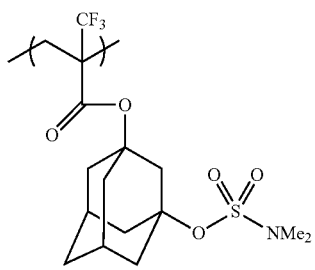
[Chemical Formula 57]
(a6-1-46)
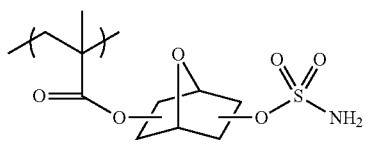
(a6-1-47)
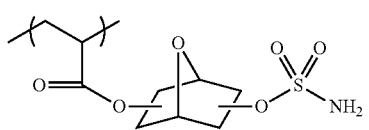
(a6-1-48)
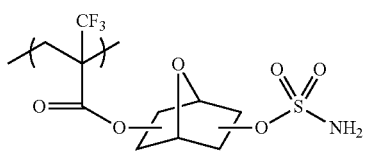
(a6-1-49)
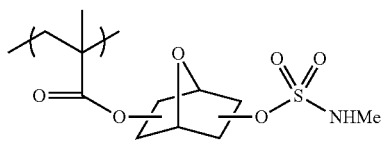
(a6-1-50)
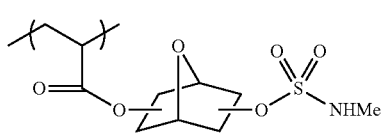
(a6-1-51)
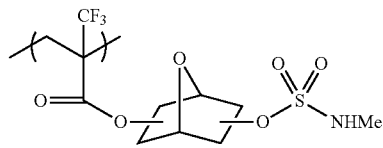
(a6-1-52)
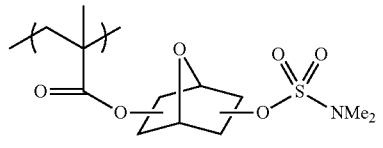
(a6-1-53)
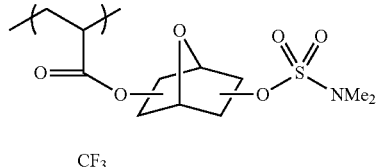
(a6-1-54)
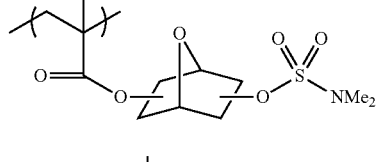
(a6-1-55)
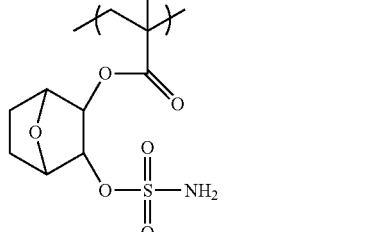
(a6-1-56)
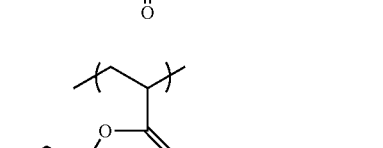
(a6-1-57)
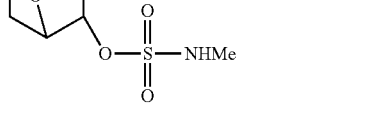
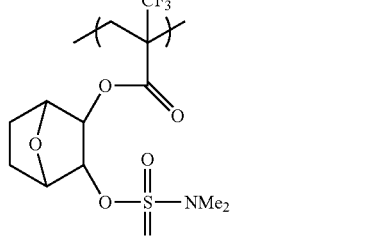
(a6-1-58)
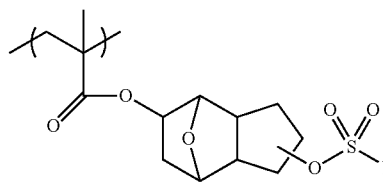

-continued (a6-1-59)
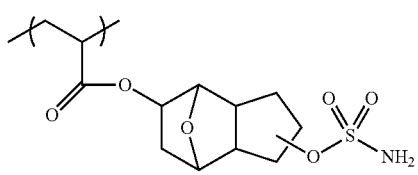

(a6-1-60)
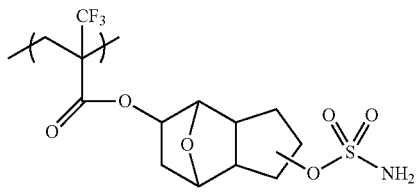

(a6-1-61)
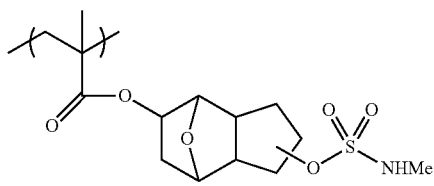

(a6-1-62)
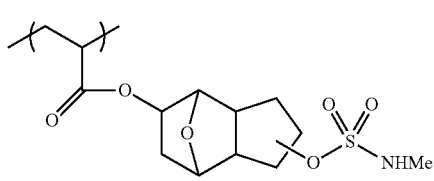

(a6-1-63)
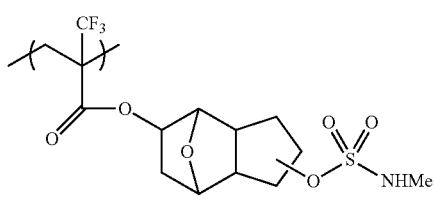

In the component (A1), as the structural unit (a6), one type of structural unit may be used, or two or more types may be used in combination.

In the component (A1), the amount of the structural unit (a6) based on the combined total of all structural units constituting the component (A1) is preferably 1 to 50 mol %, more preferably 1 to 40 mol %, and still more preferably 5 to 40 mol %.

When the amount of the structural unit (a6) is at least as large as the lower limit of the above-mentioned range, a resist pattern having can be reliably formed with a high resolution. Further, the solubility of the component (A1) in an alkali developing solution is enhanced, and as a result, a resist pattern having an excellent shape with reduced defects can be formed. On the other hand, when the amount of the structural unit is no more than the upper limit of the above-mentioned range, a good balance can be achieved with the other structural units.

—Structural Unit (a7)

The structural unit (a7) is represented by general formula (a7-1) shown below.

[Chemical Formula 58]

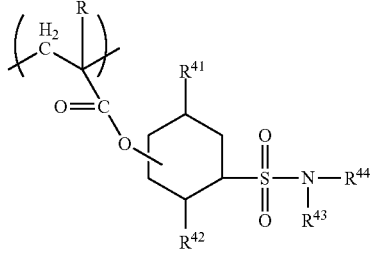

(a7-1)

In formula (a7-1), R represents a hydrogen atom, an alkyl group of 1 to 5 carbon atoms or a halogenated alkyl group of 1 to 5 carbon atoms; $R^{41}$ and $R^{42}$ each independently represents a hydrogen atom, an alkyl group, an alkoxy group, or $R^{41}$ and $R^{42}$ are mutually bonded to represent —O—, —S— or an alkylene group which may have an oxygen atom or a sulfur atom bonded at an arbitrary position; and $R^{43}$ and $R^{44}$ each independently represents a hydrogen atom, an alkyl group which may contain an oxygen atom at an arbitrary position, a cycloalkyl group which may contain an oxygen atom at an arbitrary position, or an alkoxycarbonyl group.

In general formula (a7-1), R represents a hydrogen atom, an alkyl group of 1 to 5 carbon atoms or a halogenated alkyl group of 1 to 5 carbon atoms.

Examples of the alkyl group of 1 to 5 carbon atoms for R include linear or branched lower alkyl groups such as a methyl group, an ethyl group, a propyl group, an isopropyl group, an n-butyl group, an isobutyl group, a tert-butyl group, a pentyl group, an isopentyl group and a neopentyl group.

Examples of the halogenated alkyl group of 1 to 5 carbon atoms for R include groups in which part or all of the hydrogen atoms within the aforementioned alkyl groups of 1 to 5 carbon atoms has been substituted with a halogen atom. Examples of the halogen atom include a fluorine atom, a chlorine atom, a bromine atom and an iodine atom, and a fluorine atom is particularly desirable.

From the viewpoint of industrial availability, R is preferably a hydrogen atom, a methyl group or a trifluoromethyl group, and a hydrogen atom or a methyl group is particularly desirable.

In formula (a7-1), $R^{41}$ and $R^{42}$ each independently represents a hydrogen atom, an alkyl group, an alkoxy group, or $R^{41}$ and $R^{42}$ are mutually bonded to represent —O—, —S— or an alkylene group which may have an oxygen atom or a sulfur atom bonded at an arbitrary position.

The alkyl group for $R^{41}$ and $R^{42}$ is a linear, branched or cyclic, monovalent saturated hydrocarbon group, preferably a saturated hydrocarbon group of 1 to 10 carbon atoms, more preferably a saturated hydrocarbon group of 1 to 6 carbon atoms, and most preferably a saturated hydrocarbon group of 1 to 4 carbon atoms.

With respect to the alkoxy group for $R^{41}$ and $R^{42}$, the alkyl group is a linear, branched or cyclic, monovalent saturated hydrocarbon group, preferably a saturated hydrocarbon group of 1 to 10 carbon atoms, more preferably a saturated hydrocarbon group of 1 to 6 carbon atoms, and most preferably a saturated hydrocarbon group of 1 to 4 carbon atoms.

$R^{41}$ and $R^{42}$ is preferably an alkylene group which may have an oxygen atom or a sulfur atom bonded at an arbitrary position, —O—, or —S—.

The alkylene group formed by $R^{41}$ and $R^{42}$ being mutually bonded is a linear, branched or cyclic, divalent saturated hydrocarbon group, preferably having 1 to 4 carbon atoms, more preferably 1 or 2 carbon atoms, and most preferably 1 carbon atom (methylene group).

In the case where $R^{41}$ and $R^{42}$ are mutually bonded to represent —O—, —S— or an alkylene group which may have an oxygen atom or a sulfur atom bonded at an arbitrary position, the structural unit (a7) is represented by general formula (a7-1-1), (a7-1-2) or (a7-1-3) shown below.

[Chemical Formula 59]

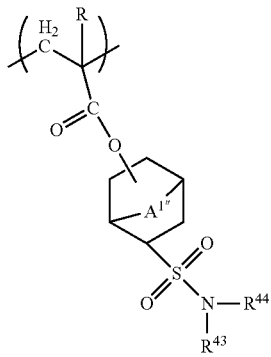

(a7-1-1)

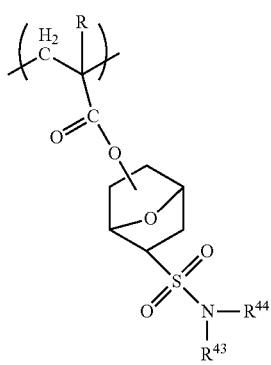

(a7-1-2)

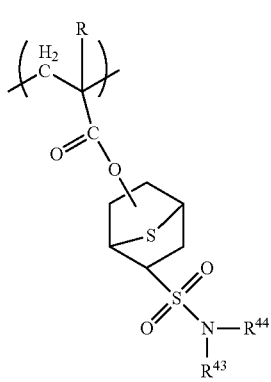

(a7-1-3)

In the formulae (a7-1-1), (a7-1-2) and (a7-1-3), R, $R^{43}$ and $R^{44}$ are the same as defined for R, $R^{43}$ and $R^{44}$ in the aforementioned formula (a7-1), respectively.

In formula (a7-1-1), $A^{1\prime\prime\prime}$ represents an alkylene group which may contain an oxygen atom or a sulfur atom at an arbitrary position, preferably an alkylene group of 1 to 5 carbon atoms which may contain an oxygen atom or a sulfur atom at an arbitrary position. Specific examples thereof include a methylene group, an ethylene group, an n-propylene group, an isopropylene group, —$CH_2$—O—$CH_2$—, —$CH_2$—O—$(CH_2)_2$— and —$CH_2$—S—$CH_2$—, —$CH_2$—S—$(CH_2)_2$—.

In formula (a7-1), $R^{43}$ and $R^{44}$ each independently represents a hydrogen atom, an alkyl group which may contain an oxygen atom at an arbitrary position, a cycloalkyl group which may contain an oxygen atom at an arbitrary position, or an alkoxycarbonyl group.

The alkyl group for $R^{43}$ and $R^{44}$ is preferably a linear or branched, monovalent saturated hydrocarbon group. The alkyl group is preferably a saturated hydrocarbon group of 1 to 10 carbon atoms, more preferably a saturated hydrocarbon group of 1 to 6 carbon atoms, and most preferably a saturated hydrocarbon group of 1 to 4 carbon atoms. The alkyl group for $R^{43}$ and $R^{44}$ may contain an oxygen atom at an arbitrary position. Examples of such alkyl group include an alkoxy group and an alkoxyalkyl group.

The cycloalkyl group for $R^{43}$ and $R^{44}$ is preferably a cyclic, monovalent saturated hydrocarbon group, preferably a saturated hydrocarbon group of 3 to 20 carbon atoms, more preferably a saturated hydrocarbon group of 4 to 15 carbon atoms, and most preferably a saturated hydrocarbon group of 5 to 12 carbon atoms. The cycloalkyl group for $R^{43}$ and $R^{44}$ may contain an oxygen atom at an arbitrary position.

With respect to the alkoxycarbonyl group for $R^{43}$ and $R^{44}$, the alkyl group is a linear, branched or cyclic, monovalent saturated hydrocarbon group, preferably a saturated hydrocarbon group of 1 to 10 carbon atoms, and more preferably a saturated hydrocarbon group of 1 to 6 carbon atoms. As the alkoxycarbonyl group for $R^{43}$ and $R^{44}$, a chain-like tertiary alkoxycarbonyl group such as a tert-butoxycarbonyl group or a tert-pentyloxycarbonyl group is particularly desirable.

As the structural unit (a7), a structural unit in which either or both of $R^{43}$ and $R^{44}$ represent an acid dissociable group can also be mentioned.

For example, in the case where either of $R^{43}$ and $R^{44}$ represents an acid dissociable group, specific examples of the structural unit (a7) include a structural unit represented by general formula (a7-1-4) shown below.

[Chemical Formula 60]

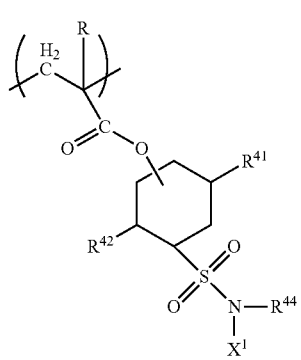

(a7-1-4)

In formula (a7-1-4), R, $R^{41}$, $R^{42}$ and $R^{44}$ are the same as defined for R, $R^{41}$ $R^{42}$ and $R^{44}$ in the aforementioned formula (a7-1); and $X^1$ represents an acid dissociable group.

In the structural unit (a7), the acid dissociable group for $R^{43}$ and $R^{44}$ (e.g., $X^1$ in the aforementioned formula (a7-1-4)) is the same as defined for the acid dissociable group for $X^1$ in the aforementioned formula (a1-0-1), and any of those which have been proposed as acid dissociable groups for a base resin of a chemically amplified resist may be used. Specific examples thereof include a tertiary alkyl ester-type acid dissociable group, an acetal-type acid dissociable group and an alkoxycarbonyl group.

In the structural unit (a7), the "tertiary alkyl ester-type acid dissociable group" for $R^{43}$ and $R^{44}$ has a tertiary carbon atom of a chain-like or cyclic alkyl group bonded to the terminal nitrogen atom of the sulfonamide group ($SO_2N$ group). When the resist composition is used in the formation of a resist pattern, when acid acts on the tertiary alkyl ester-type acid dissociable group, the bond is cleaved between the terminal nitrogen atom of the sulfonamide group ($SO_2N$ group) and the tertiary carbon atom.

As the tertiary alkyl ester-type acid dissociable group for $R^{43}$ and $R^{44}$, an aliphatic branched tertiary alkyl group is preferable.

The term "aliphatic branched" refers to a branched structure having no aromaticity.

As the aliphatic branched tertiary alkyl group for $R^{43}$ and $R^{44}$, a tertiary alkyl group of 4 to 8 carbon atoms is more preferable, and specific examples thereof include a tert-butyl group, a tert-pentyl group and a tert-heptyl group. Among these, a tert-butyl group is particularly desirable.

Examples of the cyclic tertiary alkyl ester-type acid dissociable group for $R^{43}$ and $R^{44}$ include a tertiary alkyl group containing an aliphatic cyclic group.

The term "aliphatic cyclic group" refers to a monocyclic group or polycyclic group that has no aromaticity.

Specific examples of the aliphatic cyclic group include a lower alkyl group, and a group in which one or more hydrogen atoms have been removed from a monocycloalkane or a polycycloalkane such as a bicycloalkane, a tricycloalkane or a tetracycloalkane. Examples of such groups include groups in which one or more hydrogen atoms have been removed from a monocycloalkane such as cyclohexane, cyclopentane or cyclohexane; and groups in which one or more hydrogen atoms have been removed from a polycycloalkane such as adamantane, norbornane, isobornane, tricyclodecane or tetracyclododecane.

As the tertiary alkyl group containing an aliphatic cyclic group, for example, a group which has a tertiary carbon atom on the ring structure of a cycloalkyl group can be used. Specific examples thereof include a 2-methyl-2-adamantyl group and a 2-ethyl-2-adamantyl group. Alternative examples include a group which has a branched alkylene group containing a tertiary carbon atom, and a monovalent aliphatic cyclic group to which the tertiary carbon atom is bonded.

In the structural unit (a7), the "acetal-type acid dissociable group" for $R^{43}$ and $R^{44}$ is bonded to the terminal nitrogen atom of the sulfonamide group ($SO_2N$ group). In this acetal-type acid dissociable group, the action of the acid generated upon exposure during formation of a resist pattern using the resist composition causes a cleavage of the bond between the nitrogen atom and the acetal-type acid dissociable group.

The acetal-type acid dissociable group is the same as defined for the acetal-type acid dissociable group described for the structural unit (a1).

In the structural unit (a7), the "alkoxycarbonyl group" for $R^{43}$ and $R^{44}$ is bonded to the terminal nitrogen atom of the sulfonamide group ($SO_2N$ group). In this alkoxycarbonyl group, the action of the acid generated upon exposure during formation of a resist pattern using the resist composition causes a cleavage of the bond between the nitrogen atom and the alkoxycarbonyl group.

Examples of the alkoxycarbonyl group include a methoxycarbonyl group, an ethoxycarbonyl group, a propyloxycarbonyl group, a butoxycarbonyl group and a pentyloxycarbonyl group. Among these examples, a chain-like tertiary alkoxycarbonyl group such as a tert-butoxycarbonyl group or a tert-pentyloxycarbonyl group is preferable.

More specific examples of the structural unit (a7) include structural units represented by formulae (a7-1-11) and (a7-1-12) shown below.

[Chemical Formula 61]

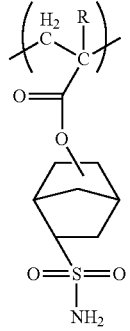

(a7-1-11)

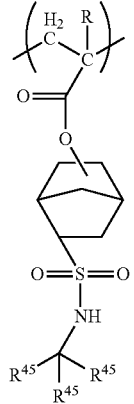

(a7-1-12)

In formulae (a7-1-11) and (a7-1-12), R is the same as defined for R in the aforementioned formula (a7-1); at least one of $R^{45}$ represents a linear or branched alkyl group of 1 to 4 carbon atoms, and the or each remaining $R^{45}$ independently represents a linear or branched alkyl group of 1 to 4 carbon atoms or a monovalent aliphatic cyclic group of 4 to 20 carbon atoms, or the or each remaining $R^{45}$ may be mutually bonded to form a divalent aliphatic cyclic group of 4 to 20 carbon atoms together with the carbon atoms bonding each other; and the plurality of $R^{45}$ may be the same or different from each other.

The monovalent aliphatic cyclic group of 4 to 20 carbon atoms for $R^{45}$ is the same as defined for the "aliphatic cyclic group" described in relation to the tertiary alkyl ester-type acid dissociable group for $R^{43}$ and $R^{44}$, and examples thereof include a cyclopentyl group, a cyclohexyl group, a norbornyl group and an adamantyl group.

Examples of linear or branched alkyl groups of 1 to 4 carbon atoms include a methyl group, an ethyl group, a propyl group, an isopropyl group, an n-butyl group, an isobutyl group and a tert-butyl group.

When the plurality of $R^{45}$ each independently represents a linear or branched alkyl group of 1 to 4 carbon atoms, examples of the group represented by —$C(R^{45})_3$ in formula (a7-1-12) include a tert-butyl group, a tert-pentyl group and a tert-hexyl group.

When one of the plurality of $R^{45}$ represents a linear or branched alkyl group of 1 to 4 carbon atoms, and the remaining two of $R^{45}$ each independently represents a linear or branched alkyl group of 1 to 4 carbon atoms or a monovalent aliphatic cyclic group of 4 to 20 carbon atoms, examples of the group represented by —C(R$^{45}$)$_3$ in formula (a7-1-12) include a 1-(1-adamantyl)-1-methylethyl group, a 1-(1-adamantyl)-1-methylpropyl group, a 1-(1-adamantyl)-1-methylbutyl group, a 1-(1-adamantyl)-1-methylpentyl group, a 1-(1-cyclopentyl)-1-methylethyl group, a 1-(1-cyclopentyl)-1-methylpropyl group, a 1-(1-cyclopentyl)-1-methylbutyl group, a 1-(1-cyclopentyl)-1-methylpentyl group, a 1-(1-cyclohexyl)-1-methylethyl group, a 1-(1-cyclohexyl)-1-methylpropyl group, a 1-(1-cyclohexyl)-1-methylbutyl group, and a 1-(1-cyclohexyl)-1-methylpentyl group.

When one of the plurality of R$^{45}$ represents a linear or branched alkyl group of 1 to 4 carbon atoms, and the remaining two R$^{45}$ are mutually bonded to form a divalent aliphatic cyclic group of 4 to 20 carbon atoms together with the carbon atom to which the two R$^{45}$ are bonded, examples of the group represented by —C(R$^{45}$)$_3$ in the formula (a7-1-12) include a 2-methyl-2-adamantyl group, a 2-ethyl-2-adamantyl group, a 1-methyl-1-cyclopentyl group, a 1-ethyl-1-cyclopentyl group, a 1-methyl-1-cyclohexyl group, and a 1-ethyl-1-cyclohexyl group.

In the component (A1), as the structural unit (a7), one type of structural unit may be used, or two or more types may be used in combination.

In the component (A1), the amount of the structural unit (a7) based on the combined total of all structural units constituting the component (A1) is preferably 1 to 50 mol %, more preferably 5 to 40 mol %, and still more preferably 5 to 30 mol %.

When the amount of the structural unit (a7) is at least as large as the lower limit of the above-mentioned range, a pattern can be easily formed using a resist composition prepared from the component (A1). On the other hand, when the amount of the structural unit (a7) is no more than the upper limit of the above-mentioned range, a good balance can be achieved with the other structural units.

In the negative-tone development resist composition of the present invention, the component (A) contains a resin component (A1) having the structural units (a0) and (a1).

Preferable examples of the component (A1) include a polymeric compound having the structural units (a0) and (a1). Specific examples of such polymeric compound include a polymeric compound consisting of the structural units (a0), (a1), (a2) and (a3); a polymeric compound consisting of the structural units (a0), (a1), (a2) and (a5); a polymeric compound consisting of the structural units (a0), (a1), (a2), (a3) and (a5); a polymeric compound consisting of the structural units (a0), (a1) and (a2); a polymeric compound consisting of the structural units (a0), (a1), (a2) and (a6); a polymeric compound consisting of the structural units (a0), (a1), (a3) and (a5); and a polymeric compound consisting of the structural units (a0), (a1), (a5) and (a7).

In the component (A), as the component (A1), one type may be used alone, or two or more types may be used in combination.

The weight average molecular weight (Mw) (the polystyrene equivalent value determined by gel permeation chromatography) of the component (A1) is not particularly limited, but is preferably 1,000 to 50,000, more preferably 1,500 to 30,000, and most preferably 2,000 to 20,000. When the weight average molecular weight is no more than the upper limit of the above-mentioned range, the resist composition exhibits a satisfactory solubility in a resist solvent. On the other hand, when the weight average molecular weight is at least as large as the lower limit of the above-mentioned range, dry etching resistance and the cross-sectional shape of the resist pattern becomes satisfactory.

Further, the dispersity (Mw/Mn) is not particularly limited, but is preferably 1.0 to 5.0, more preferably 1.0 to 3.0, and most preferably 1.0 to 2.5. Here, Mn is the number average molecular weight.

The component (A1) can be obtained, for example, by a conventional radical polymerization or the like of the monomers corresponding with each of the structural units, using a radical polymerization initiator such as azobisisobutyronitrile (AIBN).

Furthermore, in the component (A1), by using a chain transfer agent such as HS—CH$_2$—CH$_2$—CH$_2$—C(CF$_3$)$_2$—OH, a —C(CF$_3$)$_2$—OH group can be introduced at the terminals of the component (A1). Such a copolymer having introduced a hydroxyalkyl group in which some of the hydrogen atoms of the alkyl group are substituted with fluorine atoms is effective in reducing developing defects and LER (line edge roughness: unevenness of the side walls of a line pattern).

As the monomers for deriving the corresponding structural units, commercially available monomers may be used, or the monomers may be synthesized by a conventional method.

In the negative-tone development resist composition of the present invention, the component (A) may further contain "a base component which exhibits decreased solubility in an organic solvent under action of acid" other than the component (A1).

Such base component other than the component (A1) is not particularly limited, and any of the multitude of conventional base components used within chemically amplified resist compositions (e.g., a polymeric compound essentially including the structural unit (a1), and optionally including any of the structural units (a2) to (a4); a novolak resin; a polyhydroxystyrene-based resin (PHS) or a low molecular weight component) can be appropriately selected for use.

Examples of the low molecular weight component include low molecular weight compounds that have a molecular weight of at least 500 and less than 2,000, contains a hydrophilic group, and also contains an acid dissociable group described above in connection with the component (A1). Specific examples of the low molecular weight compound include compounds containing a plurality of phenol skeletons in which a part of the hydrogen atoms within hydroxyl groups have been substituted with the aforementioned acid dissociable groups.

In the component (A), the amount of the component (A1) based on the total weight of the component (A) is preferably 25% by weight or more, more preferably 50% by weight or more, still more preferably 75% by weight or more, and may be even 100% by weight. When the amount of the component (A1) is 25% by weight or more, a resist pattern exhibiting a high resolution and a high rectangularity can be formed.

In the negative-tone development resist composition of the present invention, the amount of the component (A) can be appropriately adjusted depending on the thickness of the resist film to be formed, and the like.

<Other Components>

The negative-tone development resist composition of the present invention may further include an acid generator component (B) (hereafter, referred to as "component (B)") which generates acid upon exposure, and does not fall under the definition of the component (A).

Examples of the component (B) are numerous, and include onium salt acid generators such as iodonium salts and sulfonium salts; oxime sulfonate acid generators; diazomethane acid generators such as bisalkyl or bisaryl sulfonyl diazomethanes and poly(bis-sulfonyl)diazomethanes; nitrobenzylsulfonate acid generators; iminosulfonate acid generators; and disulfone acid generators.

As an onium salt acid generator, a compound represented by general formula (b-1) or (b-2) shown below can be used.

[Chemical Formula 62]

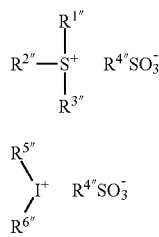

In the formulae, $R^{1\prime\prime}$ to $R^{3\prime\prime}$, $R^{5\prime\prime}$ and $R^{6\prime\prime}$ each independently represents an aryl group which may have a substituent, an alkyl group which may have a substituent or an alkenyl group which may have a substituent, provided that, in formula (b-1), two of $R^{1\prime\prime}$ to $R^{3\prime\prime}$ may be mutually bonded to form a ring with the sulfur atom; and $R^{4\prime\prime}$ represents an alkyl group which may have a substituent, a halogenated alkyl group which may have a substituent, an aryl group which may have a substituent or an alkenyl group which may have a substituent.

In formula (b-1), $R^{1\prime\prime}$ to $R^{3\prime\prime}$ each independently represents an aryl group which may have a substituent or an alkyl group which may have a substituent. Two of $R^{1\prime\prime}$ to $R^{3\prime\prime}$ may be mutually bonded to form a ring with the sulfur atom.

In terms of improvement in lithography properties and resist pattern shape, it is preferable that at least one of $R^{1\prime\prime}$ to $R^{3\prime\prime}$ is an aryl group, it is more preferable that two or more of $R^{1\prime\prime}$ to $R^{3\prime\prime}$ are aryl groups, and it is most preferable that all of $R^{1\prime\prime}$ to $R^{3\prime\prime}$ are aryl groups.

Examples of the aryl group for $R^{1\prime\prime}$ to $R^{3\prime\prime}$ include an unsubstituted aryl group of 6 to 20 carbon atoms; a substituted aryl group in which part or all of the hydrogen atoms of the aforementioned unsubstituted aryl group has been substituted with an alkyl group, an alkoxy group, a halogen atom, a hydroxy group, an oxo group (=O), an aryl group, an alkoxyalkyloxy group, an alkoxycarbonylalkyloxy group, $—C(=O)—O—R^{6\prime}$, $—O—C(=O)—R^{7\prime}$ or $—O—R^{8\prime}$. Each of $R^{6\prime}$, $R^{7\prime}$ and $R^{8\prime}$ independently represents a linear or branched saturated hydrocarbon group of 1 to 25 atoms, a cyclic saturated hydrocarbon group of 3 to 20 carbon atoms or a linear or branched, aliphatic unsaturated hydrocarbon group of 2 to 5 carbon atoms.

The unsubstituted aryl group for $R^{1\prime\prime}$ to $R^{3\prime\prime}$ is preferably an aryl group having 6 to 10 carbon atoms because it can be synthesized at a low cost. Specific examples thereof include a phenyl group and a naphthyl group.

The alkyl group as the substituent for the substituted aryl group represented by $R^{1\prime\prime}$ to $R^{3\prime\prime}$ is preferably an alkyl group having 1 to 5 carbon atoms, and a methyl group, an ethyl group, a propyl group, an n-butyl group, or a tert-butyl group is particularly desirable.

The alkoxy group as the substituent for the substituted aryl group is preferably an alkoxy group having 1 to 5 carbon atoms, and a methoxy group, an ethoxy group, an n-propoxy group, an iso-propoxy group, an n-butoxy group or a tert-butoxy group is particularly desirable.

The halogen atom as the substituent for the substituted aryl group is preferably a fluorine atom.

As the aryl group as the substituent for the substituted aryl group, the same aryl groups as those described above for $R^{1\prime\prime}$ to $R^{3\prime\prime}$ can be mentioned, and an aryl group of 6 to 20 carbon atoms is preferable, an aryl group of 6 to 10 carbon atoms is more preferable, and a phenyl group or a naphthyl group is still more preferable.

Examples of alkoxyalkyloxy groups as the substituent for the substituted aryl group include groups represented by a general formula shown below:

general formula: $—O—C(R^{47})(R^{48})—O—R^{49}$ (in the formula, each of $R^{47}$ and $R^{48}$ independently represent a hydrogen atom or a linear or branched alkyl group; and $R^{49}$ represents an alkyl group).

The alkyl group for $R^{47}$ and $R^{48}$ preferably has 1 to 5 carbon atoms, and may be either linear or branched. As the alkyl group, an ethyl group or a methyl group is preferable, and a methyl group is most preferable.

It is preferable that at least one of $R^{47}$ and $R^{48}$ be a hydrogen atom. It is particularly desirable that at least one of $R^{47}$ and $R^{48}$ be a hydrogen atom, and the other be a hydrogen atom or a methyl group.

The alkyl group for $R^{49}$ preferably has 1 to 15 carbon atoms, and may be linear, branched or cyclic.

The linear or branched alkyl group for $R^{49}$ preferably has 1 to 5 carbon atoms. Examples thereof include a methyl group, an ethyl group, a propyl group, an n-butyl group and a tert-butyl group.

The cyclic alkyl group for $R^{49}$ preferably has 4 to 15 carbon atoms, more preferably 4 to 12, and most preferably 5 to 10. Specific examples thereof include groups in which one or more hydrogen atoms have been removed from a monocycloalkane or a polycycloalkane such as a bicycloalkane, tricycloalkane or tetracycloalkane, and which may or may not be substituted with an alkyl group of 1 to 5 carbon atoms, a fluorine atom or a fluorinated alkyl group. Examples of the monocycloalkane include cyclopentane and cyclohexane. Examples of polycycloalkanes include adamantane, norbornane, isobornane, tricyclodecane and tetracyclododecane. Among these, a group in which one or more hydrogen atoms have been removed from adamantane is preferable.

Examples of the alkoxycarbonylalkyloxy group as the substituent for the substituted aryl group include groups represented by a general formula shown below:

a group represented by a general formula $—O—R^{55}—C(=O)—O—R^{56}$ (in the formula, $R^{55}$ represents a linear or branched alkylene group; and $R^{56}$ represents a tertiary alkyl group.)

The linear or branched alkylene group for $R^{55}$ preferably has 1 to 5 carbon atoms, and examples thereof include a methylene group, an ethylene group, a trimethylene group, a tetramethylene group and a 1,1-dimethylethylene group.

Examples of the tertiary alkyl group for $R^{56}$ include a 2-methyl-2-adamantyl group, a 2-ethyl-2-adamantyl group, a 1-methyl-1-cyclopentyl group, a 1-ethyl-1-cyclopentyl group, a 1-methyl-1-cyclohexyl group, a 1-ethyl-1-cyclohexyl group, a 1-(1-adamantyl)-1-methylethyl group, a 1-(1-adamantyl)-1-methylpropyl group, a 1-(1-adamantyl)-1-methylbutyl group, a 1-(1-adamantyl)-1-methylpentyl group, a 1-(1-cyclopentyl)-1-methylethyl group, a 1-(1-cyclopentyl)-1-methylpropyl group, a 1-(1-cyclopentyl)-1-methylbutyl group, a 1-(1-cyclopentyl)-1-methylpentyl group, a 1-(1-cyclohexyl)-1-methylethyl group, a 1-(1-cyclohexyl)-1-methylpropyl group, a 1-(1-cyclohexyl)-1-methylbutyl group, a 1-(1-cyclohexyl)-1-methylpentyl group, a tert-butyl group, a tert-pentyl group and a tert-hexyl group.

Further, a group in which $R^{56}$ in the group represented by the aforementioned general formula: —O—$R^{55}$—C(=O)—O—$R^{56}$ has been substituted with $R^{56'}$ can also be mentioned. $R^{56'}$ represents a hydrogen atom, an alkyl group, a fluorinated alkyl group or an aliphatic cyclic group which may contain a hetero atom.

The alkyl group for $R^{56'}$ is the same as defined for the alkyl group for the aforementioned $R^{49}$.

Examples of the fluorinated alkyl group for $R^{56'}$ include groups in which part or all of the hydrogen atoms within the alkyl group for $R^{49}$ has been substituted with a fluorine atom.

Examples of the aliphatic cyclic group for $R^{56'}$ which may contain a hetero atom include an aliphatic cyclic group which does not contain a hetero atom, an aliphatic cyclic group containing a hetero atom in the ring structure, and an aliphatic cyclic group in which a hydrogen atom has been substituted with a hetero atom.

As an aliphatic cyclic group for $R^{56'}$ which does not contain a hetero atom, a group in which one or more hydrogen atoms have been removed from a monocycloalkane or a polycycloalkane such as a bicycloalkane, a tricycloalkane or a tetracycloalkane can be mentioned. Examples of the monocycloalkane include cyclopentane and cyclohexane. Examples of polycycloalkanes include adamantane, norbornane, isobornane, tricyclodecane and tetracyclododecane. Among these, a group in which one or more hydrogen atoms have been removed from adamantane is preferable.

Specific examples of the aliphatic cyclic group for $R^{56'}$ containing a hetero atom in the ring structure include groups represented by formulas (L1) to (L6) and (S1) to (S4) described later.

As the aliphatic cyclic group for $R^{56'}$ in which a hydrogen atom has been substituted with a hetero atom, an aliphatic cyclic group in which a hydrogen atom has been substituted with an oxygen atom (=O) can be mentioned.

In formulae —C(=O)—O—$R^{6'}$, —O—C(=O)—$R^{7'}$ and —O—$R^{8'}$, $R^{6'}$, $R^{7'}$ and $R^{8'}$ each independently represents a linear or branched saturated hydrocarbon group of 1 to 25 atoms, a cyclic saturated hydrocarbon group of 3 to 20 carbon atoms or a linear or branched, aliphatic unsaturated hydrocarbon group of 2 to 5 carbon atoms.

The linear or branched, saturated hydrocarbon group preferably has 1 to 25 carbon atoms, more preferably 1 to 15, and still more preferably 4 to 10.

Examples of the linear, saturated hydrocarbon group include a methyl group, an ethyl group, a propyl group, a butyl group, a pentyl group, a hexyl group, a heptyl group, an octyl group, a nonyl group and a decyl group.

Examples of the branched, saturated hydrocarbon group include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group, but excluding tertiary alkyl groups.

The linear or branched, saturated hydrocarbon group may have a substituent. Examples of the substituent include an alkoxy group, a halogen atom, a halogenated alkyl group, a hydroxyl group, an oxygen atom (=O), a cyano group and a carboxy group.

The alkoxy group as the substituent for the linear or branched saturated hydrocarbon group is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

Examples of the halogen atom as the substituent for the linear or branched, saturated alkyl group include a fluorine atom, a chlorine atom, a bromine atom and an iodine atom, and a fluorine atom is preferable.

Example of the halogenated alkyl group as the substituent for the linear or branched, saturated hydrocarbon group includes a group in which part or all of the hydrogen atoms within the aforementioned linear or branched, saturated hydrocarbon group have been substituted with the aforementioned halogen atoms.

The cyclic saturated hydrocarbon group of 3 to 20 carbon atoms for $R^{6'}$, $R^{7'}$ and $R^{8'}$ may be either a polycyclic group or a monocyclic group, and examples thereof include groups in which one hydrogen atom has been removed from a monocycloalkane, and groups in which one hydrogen atom has been removed from a polycycloalkane (e.g., a bicycloalkane, a tricycloalkane or a tetracycloalkane). More specific examples include groups in which one hydrogen atom has been removed from a monocycloalkane such as cyclopentane, cyclohexane, cycloheptane or cyclooctane; and groups in which one or more hydrogen atoms have been removed from a polycycloalkane such as adamantane, norbornane, isobornane, tricyclodecane or tetracyclododecane.

The cyclic, saturated hydrocarbon group may have a substituent. For example, part of the carbon atoms constituting the ring within the cyclic alkyl group may be substituted with a hetero atom, or a hydrogen atom bonded to the ring within the cyclic alkyl group may be substituted with a substituent.

In the former example, a heterocycloalkane in which part of the carbon atoms constituting the ring within the aforementioned monocycloalkane or polycycloalkane has been substituted with a hetero atom such as an oxygen atom, a sulfur atom or a nitrogen atom, and one hydrogen atom has been removed therefrom, can be used. Further, the ring may contain an ester bond (—C(=O)—O—). More specific examples include a lactone-containing monocyclic group, such as a group in which one hydrogen atom has been removed from γ-butyrolactone; and a lactone-containing polycyclic group, such as a group in which one hydrogen atom has been removed from a bicycloalkane, tricycloalkane or tetracycloalkane containing a lactone ring.

In the latter example, as the substituent, the same substituent groups as those for the aforementioned linear or branched alkyl group, or a lower alkyl group can be used.

Alternatively, $R^{6'}$, $R^{7'}$ and $R^{8'}$ may be a combination of a linear or branched alkyl group and a cyclic group.

Examples of the combination of a linear or branched alkyl group with a cyclic alkyl group include groups in which a cyclic alkyl group as a substituent is bonded to a linear or branched alkyl group, and groups in which a linear or branched alkyl group as a substituent is bonded to a cyclic alkyl group.

Examples of the linear aliphatic unsaturated hydrocarbon group for $R^{6'}$, $R^{7'}$ and $R^{8'}$ include a vinyl group, a propenyl group (an allyl group) and a butynyl group.

Examples of the branched aliphatic unsaturated hydrocarbon group for $R^{6'}$, $R^{7'}$, and $R^{8'}$ include a 1-methylpropenyl group and a 2-methylpropenyl group.

The aforementioned linear or branched, aliphatic unsaturated hydrocarbon group may have a substituent. Examples of substituents include the same substituents as those which the aforementioned linear or branched alkyl group may have.

Among the aforementioned examples, as $R^{7\prime}$ and $R^{8\prime}$, in terms of improvement in lithography properties and shape of the resist pattern, a linear or branched, saturated hydrocarbon group of 1 to 15 carbon atoms or a cyclic saturated hydrocarbon group of 3 to 20 carbon atoms is preferable.

The aryl group for each of $R^{1\prime\prime}$ to $R^{3\prime\prime}$ is preferably a phenyl group or a naphthyl group.

Examples of the alkyl group for $R^{1\prime\prime}$ to $R^{3\prime\prime}$ include linear, branched or cyclic alkyl groups of 1 to 10 carbon atoms. Among these, alkyl groups of 1 to 5 carbon atoms are preferable as the resolution becomes excellent. Specific examples thereof include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decyl group, and a methyl group is most preferable because it is excellent in resolution and can be synthesized at a low cost.

The alkenyl group for $R^{1\prime\prime}$ to $R^{3\prime\prime}$ preferably has 2 to 10 carbon atoms, more preferably 2 to 5, and still more preferably 2 to 4. Specific examples thereof include a vinyl group, a propenyl group (an allyl group), a butynyl group, a 1-methylpropenyl group and a 2-methylpropenyl group.

When two of $R^{1\prime\prime}$ to $R^{3\prime\prime}$ are bonded to each other to form a ring with the sulfur atom, it is preferable that the two of $R^{1\prime\prime}$ to $R^{3\prime\prime}$ form a 3 to 10-membered ring including the sulfur atom, and it is particularly desirable that the two of $R^{1\prime\prime}$ to $R^{3\prime\prime}$ form a 5 to 7-membered ring including the sulfur atom.

When two of $R^{1\prime\prime}$ to $R^{3\prime\prime}$ are bonded to each other to form a ring with the sulfur atom, the remaining one of $R^{1\prime\prime}$ to $R^{3\prime\prime}$ is preferably an aryl group. As examples of the aryl group, the same as the above-mentioned aryl groups for $R^{1\prime\prime}$ to $R^{3\prime\prime}$ can be given.

Specific examples of cation moiety of the compound represented by general formula (b-1) include triphenylsulfonium, (3,5-dimethylphenyl)diphenylsulfonium, (4-(2-adamantoxymethyloxy)-3,5-dimethylphenyl) diphenylsulfonium, (4-(2-adamantoxymethyloxy)phenyl) diphenylsulfonium, (4-(tert-butoxycarbonylmethyloxy) phenyl)diphenylsulfonium, (4-(tert-butoxycarbonylmethyloxy)-3,5-dimethylphenyl) diphenylsulfonium, (4-(2-methyl-2-adamantyloxycarbonylmethyloxy)phenyl)diphenyl sulfonium, (4-(2-methyl-2-adamantyloxycarbonylmethyloxy)-3,5-dimethylphenyl) diphenylsulfonium, tri(4-methylphenyl)sulfonium, dimethyl(4-hydroxynaphthyl)sulfonium, monophenyldimethylsulfonium, diphenylmonomethylsulfonium, (4-methylphenyl)diphenylsulfonium, (4-methoxyphenyl)diphenylsulfonium, tri(4-tert-butyl)phenylsulfonium, diphenyl(1-(4-methoxy)naphthyl) sulfonium, di(1-naphthyl)phenylsulfonium, 1-phenyltetrahydrothiophenium, 1-(4-methylphenyl)tetrahydrothiophenium, 1-(3,5-dimethyl-4-hydroxyphenyl)tetrahydrothiophenium, 1-(4-methoxynaphthalene-1-yl)tetrahydrothiophenium, 1-(4-ethoxynaphthalene-1-yl) tetrahydrothiophenium, 1-(4-n-butoxynaphthalene-1-yl) tetrahydrothiophenium, 1-phenyltetrahydrothiopyranium, 1-(4-hydroxyphenyl)tetrahydrothiopyranium, 1-(3,5-dimethyl-4-hydroxyphenyl)tetrahydrothiopyranium and 1-(4-methylphenyl)tetrahydrothiopyranium.

Preferable examples of the cation moiety of the compound represented by the aforementioned formula (b-1) are shown below.

[Chemical Formula 63]

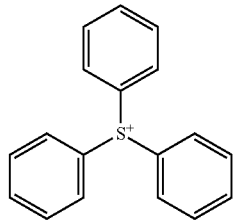

(b-1-1)

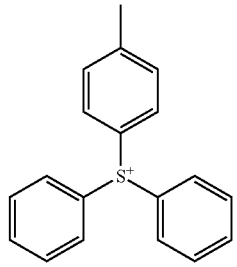

(b-1-2)

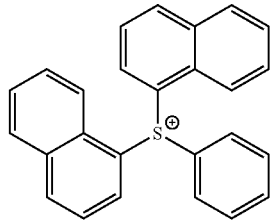

(b-1-3)

[Chemical Formula 64]

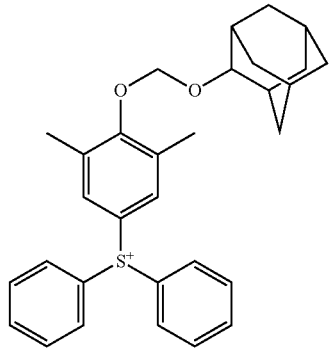

(b-1-4)

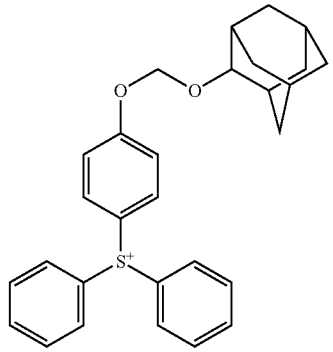

(b-1-5)

(b-1-6)
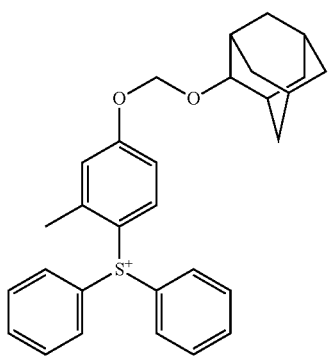
[Chemical Formula 65]
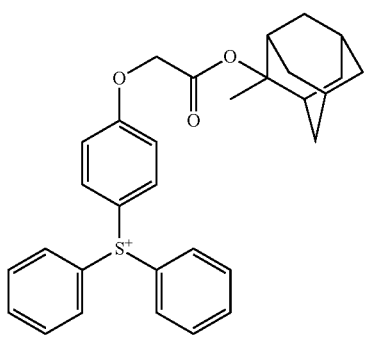
(b-1-8)
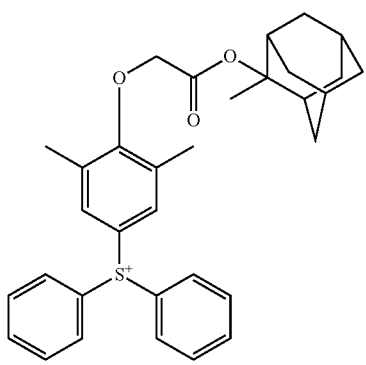
(b-1-9)
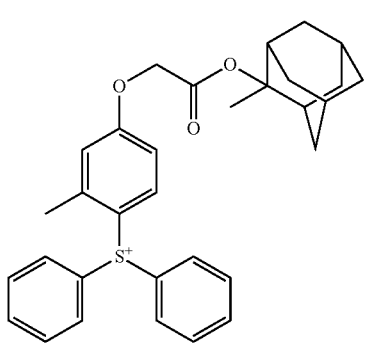
(b-1-10)
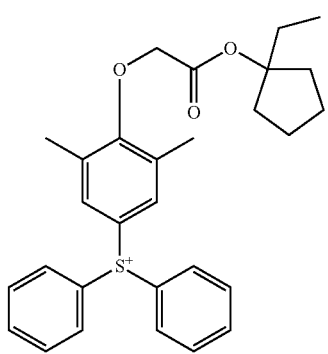
(b-1-11)
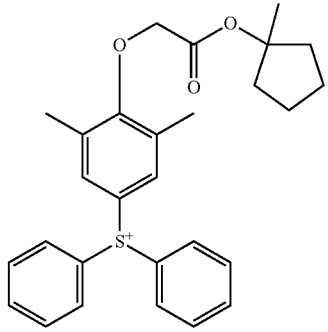
(b-1-12)
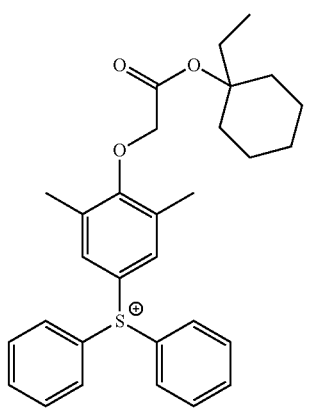
(b-1-13)
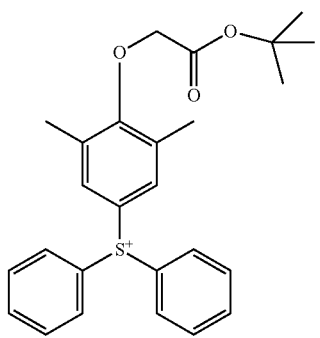

-continued
[Chemical Formula 66]
(b-1-14)
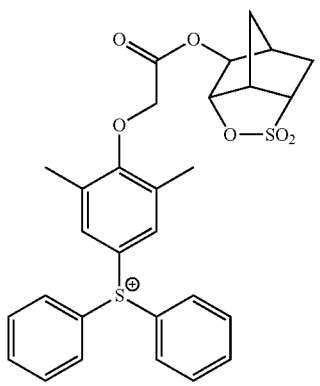
(b-1-15)
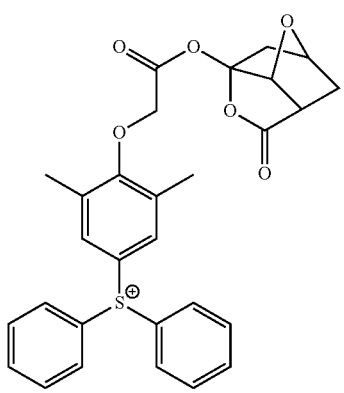
(b-1-16)
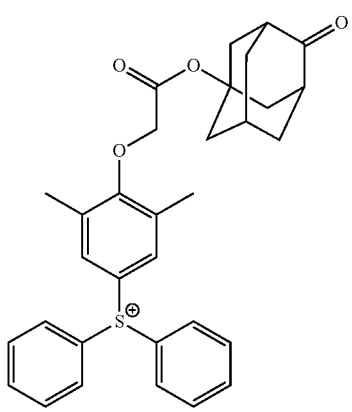
(b-1-17)
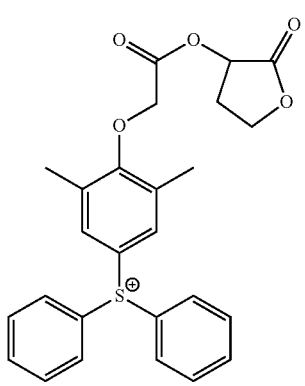
-continued
(b-1-18)
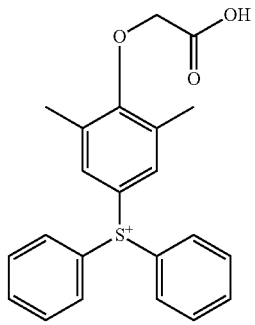
(b-1-19)
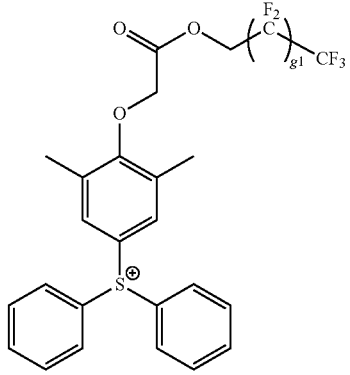
In the formula, g1 represents a recurring number, and is an integer of 1 to 5.
[Chemical Formula 67]
(b-1-20)
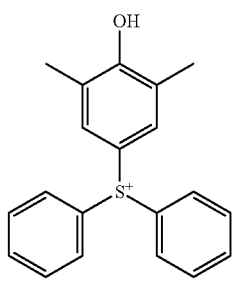
(b-1-21)
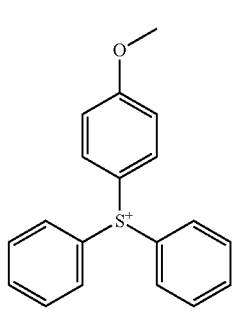

(b-1-22)
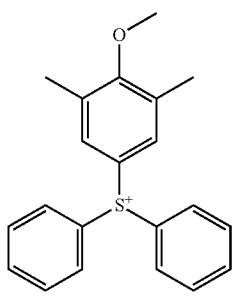
[Chemical Formula 68]
(b-1-23)
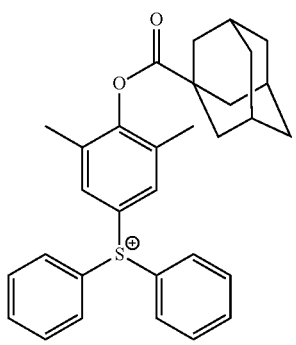
(b-1-24)
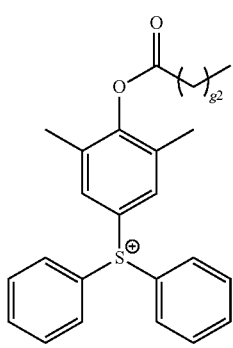
(b-1-25)
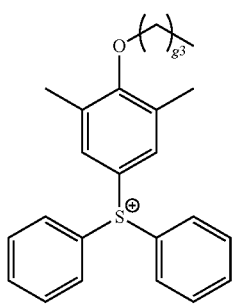
In the formula, g2 and g3 represent recurring numbers, wherein g2 is an integer of 0 to 20, and g3 is an integer of 0 to 20.
[Chemical Formula 69]
(b-1-26)
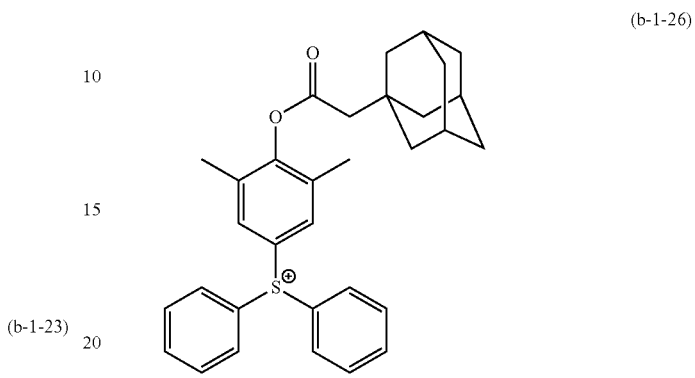
(b-1-27)
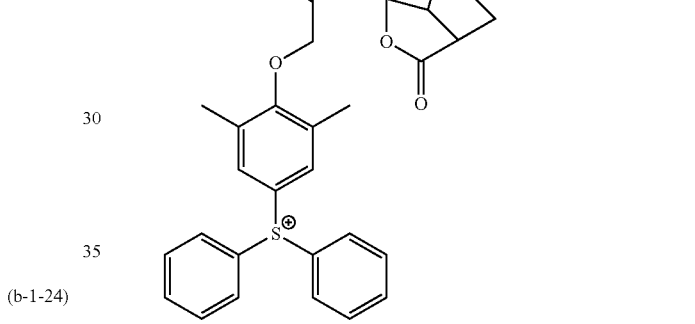
(b-1-28)
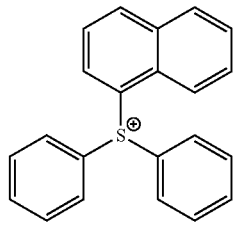
[Chemical Formula 70]
(b-1-29)
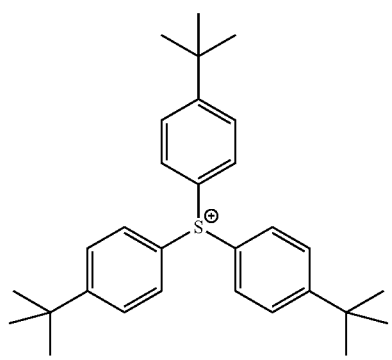

-continued

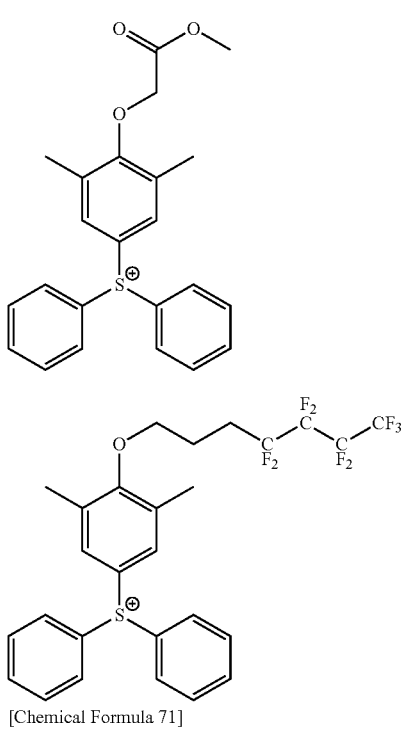

(b-1-30)

(b-1-31)

[Chemical Formula 71]

(b-1-32)

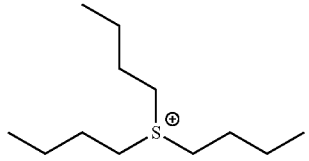

(b-1-33)

In formula (b-1), $R^{4'''}$ represents an alkyl group, a halogenated alkyl group, an aryl group or an alkenyl group which may have a substituent.

The alkyl group for $R^{4'''}$ may be any of linear, branched or cyclic.

The linear or branched alkyl group preferably has 1 to 10 carbon atoms, more preferably 1 to 8 carbon atoms, and most preferably 1 to 4 carbon atoms.

The cyclic alkyl group preferably has 4 to 15 carbon atoms, more preferably 4 to 10 carbon atoms, and most preferably 6 to 10 carbon atoms.

As an example of the halogenated alkyl group for $R^{4'''}$, a group in which part of or all of the hydrogen atoms of the aforementioned linear, branched or cyclic alkyl group have been substituted with halogen atoms can be given. Examples of the aforementioned halogen atom include a fluorine atom, a chlorine atom, a bromine atom and an iodine atom, and a fluorine atom is preferable.

In the halogenated alkyl group, the percentage of the number of halogen atoms based on the total number of halogen atoms and hydrogen atoms (halogenation ratio (%)) is preferably 10 to 100%, more preferably 50 to 100%, and most preferably 100%. Higher halogenation ratios are preferable, as they result in increased acid strength.

The aryl group for $R^{4'''}$ is preferably an aryl group of 6 to 20 carbon atoms.

The alkenyl group for $R^{4'''}$ is preferably an alkenyl group of 2 to 10 carbon atoms.

With respect to $R^{4'''}$, the expression "may have a substituent" means that part of or all of the hydrogen atoms within the aforementioned alkyl group, halogenated alkyl group, aryl group or alkenyl group may be substituted with substituents (atoms other than hydrogen atoms, or groups).

$R^{4'''}$ may have one substituent, or two or more substituents.

Examples of the substituent include a halogen atom, a hetero atom, an alkyl group, and a group represented by the formula $X^b$-$Q^1$- (in the formula, $Q^1$ represents a divalent linking group containing an oxygen atom; and $X^b$ represents a hydrocarbon group of 3 to 30 carbon atoms which may have a substituent).

Examples of halogen atoms and alkyl groups include the same halogen atoms and alkyl groups as those described above with respect to the halogenated alkyl group for $R^{4'''}$.

Examples of hetero atoms include an oxygen atom, a nitrogen atom, and a sulfur atom.

In the group represented by formula $X^b$-$Q^1$-, $Q^1$ represents a divalent linking group containing an oxygen atom.

$Q^1$ may contain an atom other than oxygen. Examples of atoms other than oxygen include a carbon atom, a hydrogen atom, a sulfur atom and a nitrogen atom.

Examples of divalent linking groups containing an oxygen atom include non-hydrocarbon, oxygen atom-containing linking groups such as an oxygen atom (an ether bond; —O—), an ester bond (—C(=O)—O—), an amido bond (—C(=O)—NH—), a carbonyl group (—C(=O)—) and a carbonate bond (—O—C(=O)—O—); and combinations of the aforementioned non-hydrocarbon, hetero atom-containing linking groups with an alkylene group.

Specific examples of the combinations of the aforementioned non-hydrocarbon, hetero atom-containing linking groups and an alkylene group include —$R^{91}$—O—, —$R^{92}$—O—C(=O)—, —C(=O)—O—$R^{93}$—O—C(=O)— (in the formulas, each of $R^{91}$ to $R^{93}$ independently represents an alkylene group).

The alkylene group for $R^{91}$ to $R^{93}$ is preferably a linear or branched alkylene group, and preferably has 1 to 12 carbon atoms, more preferably 1 to 5, and most preferably 1 to 3.

Specific examples of alkylene groups include a methylene group [—CH$_2$—]; alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)— and —C(CH$_2$CH$_3$)$_2$—; an ethylene group [—CH$_2$CH$_2$—]; alkylethylene groups such as —CH(CH$_3$)CH$_2$—, —CH(CH$_3$)CH (CH$_3$)—, —C(CH$_3$)$_2$CH$_2$— and —CH(CH$_2$CH$_3$)CH$_2$—; a trimethylene group (n-propylene group) [—CH$_2$CH$_2$CH$_2$—]; alkyltrimethylene groups such as —CH (CH$_3$)CH$_2$CH$_2$— and —CH$_2$CH(CH$_3$)CH$_2$—; a tetramethylene group [—CH$_2$CH$_2$CH$_2$CH$_2$—]; alkyltetramethylene groups such as —CH(CH$_3$)CH$_2$CH$_2$CH$_2$— and —CH$_2$CH (CH$_3$)CH$_2$CH$_2$—; and a pentamethylene group [—CH$_2$CH$_2$CH$_2$CH$_2$CH$_2$—].

$Q^1$ is preferably a divalent linking group containing an ester linkage or ether linkage, and more preferably a group of —$R^{91}$—O—, —$R^{92}$—O—C(=O)— or —C(=O)—O—$R^{93}$—O—C(=O)—.

In the group represented by the formula $X^b$-$Q^1$-, the hydrocarbon group for $X^b$ may be either an aromatic hydrocarbon group or an aliphatic hydrocarbon group.

The aromatic hydrocarbon group is a hydrocarbon group having an aromatic ring. The aromatic hydrocarbon ring preferably has 3 to 30 carbon atoms, more preferably 5 to 30, still more preferably 5 to 20, still more preferably 6 to 15, and most preferably 6 to 12. Here, the number of carbon atoms within a substituent(s) is not included in the number of carbon atoms of the aromatic hydrocarbon group.

Specific examples of aromatic hydrocarbon groups include an aryl group which is an aromatic hydrocarbon ring having one hydrogen atom removed therefrom, such as a phenyl group, a biphenyl group, a fluorenyl group, a naphthyl group, an anthryl group or a phenanthryl group; and an alkylaryl group such as a benzyl group, a phenethyl group, a 1-naphthylmethyl group, a 2-naphthylmethyl group, a 1-naphthylethyl group, or a 2-naphthylethyl group. The alkyl chain within the arylalkyl group preferably has 1 to 4 carbon atom, more preferably 1 or 2, and most preferably 1.

The aromatic hydrocarbon group may have a substituent. For example, part of the carbon atoms constituting the aromatic ring within the aromatic hydrocarbon group may be substituted with a hetero atom, or a hydrogen atom bonded to the aromatic ring within the aromatic hydrocarbon group may be substituted with a substituent.

In the former example, a heteroaryl group in which part of the carbon atoms constituting the ring within the aforementioned aryl group has been substituted with a hetero atom such as an oxygen atom, a sulfur atom or a nitrogen atom, and a heteroarylalkyl group in which part of the carbon atoms constituting the aromatic hydrocarbon ring within the aforementioned arylalkyl group has been substituted with the aforementioned heteroatom can be used.

In the latter example, as the substituent for the aromatic hydrocarbon group, an alkyl group, an alkoxy group, a halogen atom, a halogenated alkyl group, a hydroxyl group, an oxygen atom (=O) or the like can be used.

The alkyl group as the substituent for the aromatic hydrocarbon group is preferably an alkyl group of 1 to 5 carbon atoms, and a methyl group, an ethyl group, a propyl group, an n-butyl group or a tert-butyl group is particularly desirable.

The alkoxy group as the substituent for the aromatic hydrocarbon group is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom as the substituent for the aromatic hydrocarbon group include a fluorine atom, a chlorine atom, a bromine atom and an iodine atom, and a fluorine atom is preferable.

Example of the halogenated alkyl group as the substituent for the aromatic hydrocarbon group includes a group in which part or all of the hydrogen atoms within the aforementioned alkyl group have been substituted with the aforementioned halogen atoms.

The aliphatic hydrocarbon group for $X^b$ may be either a saturated aliphatic hydrocarbon group, or an unsaturated aliphatic hydrocarbon group. Further, the aliphatic hydrocarbon group may be linear, branched or cyclic.

In the aliphatic hydrocarbon group for $X^b$, part of the carbon atoms constituting the aliphatic hydrocarbon group may be substituted with a substituent group containing a hetero atom, or part or all of the hydrogen atoms constituting the aliphatic hydrocarbon group may be substituted with a substituent group containing a hetero atom.

As the "hetero atom" for $X^b$, there is no particular limitation as long as it is an atom other than carbon and hydrogen. Examples of the halogen atom include a fluorine atom, a chlorine atom, an iodine atom and a bromine atom.

The substituent group containing a hetero atom may consist of a hetero atom, or may be a group containing a group or atom other than a hetero atom.

Specific examples of the substituent group for substituting part of the carbon atoms include —O—, —C(=O)—O—, —C(=O)—, —O—C(=O)—O—, —C(=O)—NH—, —NH— (the H may be replaced with a substituent such as an alkyl group or an acyl group), —S—, —S(=O)$_2$— and —S(=O)$_2$—O—. When the aliphatic hydrocarbon group is cyclic, the aliphatic hydrocarbon group may contain any of these substituent groups in the ring structure.

Examples of the substituent group for substituting part or all of the hydrogen atoms include an alkoxy group, a halogen atom, a halogenated alkyl group, a hydroxyl group, an oxygen atom (=O) and a cyano group.

The aforementioned alkoxy group is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the aforementioned halogen atom include a fluorine atom, a chlorine atom, a bromine atom and an iodine atom, and a fluorine atom is preferable.

Example of the aforementioned halogenated alkyl group includes a group in which part or all of the hydrogen atoms within an alkyl group of 1 to 5 carbon atoms (e.g., a methyl group, an ethyl group, a propyl group, an n-butyl group or a tert-butyl group) have been substituted with the aforementioned halogen atoms.

As the aliphatic hydrocarbon group, a linear or branched saturated hydrocarbon group, a linear or branched monovalent unsaturated hydrocarbon group, or a cyclic aliphatic hydrocarbon group (aliphatic cyclic group) is preferable.

The linear saturated hydrocarbon group (alkyl group) preferably has 1 to 20 carbon atoms, more preferably 1 to 15, and most preferably 1 to 10. Specific examples include a methyl group, an ethyl group, a propyl group, a butyl group, a pentyl group, a hexyl group, a heptyl group, an octyl group, a nonyl group, a decyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group.

The branched saturated hydrocarbon group (alkyl group) preferably has 3 to 20 carbon atoms, more preferably 3 to 15, and most preferably 3 to 10. Specific examples include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group.

The unsaturated hydrocarbon group preferably has 2 to 10 carbon atoms, more preferably 2 to 5, still more preferably 2 to 4, and most preferably 3. Examples of linear monovalent unsaturated hydrocarbon groups include a vinyl group, a propenyl group (an allyl group) and a butynyl group. Examples of branched monovalent unsaturated hydrocarbon groups include a 1-methylpropenyl group and a 2-methylpropenyl group.

Among the above-mentioned examples, as the unsaturated hydrocarbon group, a propenyl group is particularly desirable.

The aliphatic cyclic group may be either a monocyclic group or a polycyclic group. The aliphatic cyclic group preferably has 3 to 30 carbon atoms, more preferably 5 to 30, still more preferably 5 to 20, still more preferably 6 to 15, and most preferably 6 to 12.

As the aliphatic cyclic group, a group in which one or more hydrogen atoms have been removed from a monocycloalkane or a polycycloalkane such as a bicycloalkane, tricycloalkane or tetracycloalkane can be used. Specific examples include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane.

When the aliphatic cyclic group does not contain a hetero atom-containing substituent group in the ring structure thereof, the aliphatic cyclic group is preferably a polycyclic group, more preferably a group in which one or more hydrogen atoms have been removed from a polycycloalkane, and a group in which one or more hydrogen atoms have been removed from adamantane is particularly desirable.

When the aliphatic cyclic group contains a hetero atom-containing substituent group in the ring structure thereof, the hetero atom-containing substituent group is preferably —O—, —C(=O)—O—, —S—, —S(=O)$_2$— or —S(=O)$_2$—O—. Specific examples of such aliphatic cyclic groups include groups represented by formulas (L1) to (L6) and (S1) to (S4) shown below.

[Chemical Formula 72]

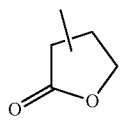
(L1)

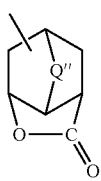
(L2)

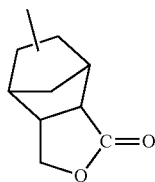
(L3)

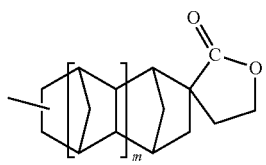
(L4)

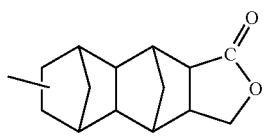
(L5)

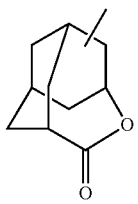
(L6)

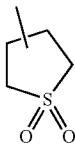
(S1)

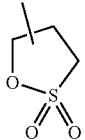
(S2)

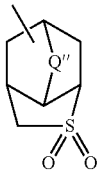
(S3)

(S4)

In the formula, Q″ represents an alkylene group of 1 to 5 carbon atoms, —O—, —, —R$^{94}$— or —S—R$^{95}$— (wherein each of R$^{94}$ and R$^{95}$ independently represents an alkylene group of 1 to 5 carbon atoms); and m represents 0 or 1.

As the alkylene group for Q″, R$^{94}$ and R$^{95}$, the same alkylene groups as those described above for R$^{91}$ to R$^{93}$ can be used.

In these aliphatic cyclic groups, part of the hydrogen atoms bonded to the carbon atoms constituting the ring structure may be substituted with a substituent. Examples of substituents include an alkyl group, an alkoxy group, a halogen atom, a halogenated alkyl group, a hydroxyl group and an oxygen atom (=O).

As the alkyl group, an alkyl group of 1 to 5 carbon atoms is preferable, and a methyl group, an ethyl group, a propyl group, an n-butyl group or a tert-butyl group is particularly desirable.

As the alkoxy group and the halogen atom, the same groups as the substituent groups for substituting part or all of the hydrogen atoms can be used.

Among the examples described above, as X$^b$, a cyclic group which may have a substituent is preferable. The cyclic group may be either an aromatic hydrocarbon group which may have a substituent, or an aliphatic cyclic group which may have a substituent, and an aliphatic cyclic group which may have a substituent is preferable.

As the aromatic hydrocarbon group, a naphthyl group which may have a substituent, or a phenyl group which may have a substituent is preferable.

As the aliphatic cyclic group which may have a substituent, an aliphatic polycyclic group which may have a substituent is preferable. As the aliphatic polycyclic group, the aforementioned group in which one or more hydrogen atoms have been removed from a polycycloalkane, and groups represented by formulas (L2) to (L5), (S3) and (S4) are preferable.

Further, it is particularly desirable that $X^b$ have a polar moiety, because it results in improved lithographic properties and resist pattern shape.

Specific examples of $X^b$ having a polar moiety include those in which a part of the carbon atoms constituting the aliphatic hydrocarbon group for $X^3$ is substituted with a substituent group containing a hetero atom such as —O—, —C(=O)—O—, —C(=O)—, —C(=O)—NH—, —NH— (wherein H may be substituted with a substituent such as an alkyl group or an acyl group), —S—, —S(=O)$_2$— and —S(=O)$_2$—O—.

Among the above, $R^{4'''}$ preferably has $X^b$-$Q^1$- as a substituent. In such a case, $R^{4'''}$ is preferably a group represented by the formula $X^b$-$Q^1$-$Y^3$— (in the formula, $Q^1$ and $X^b$ are the same as defined above; and $Y^3$ represents an alkylene group of 1 to 4 carbon atoms which may have a substituent, or a fluorinated alkylene group of 1 to 4 carbon atoms which may have a substituent).

In the group represented by the formula: $X^b$-$Q^1$-$Y^3$—, examples of the alkylene group for $Y^3$ include the same alkylene groups as those described above for $Q^1$ which has 1 to 4 carbon atoms.

As the fluorinated alkylene group for $Y^3$, the aforementioned alkylene group in which part or all of the hydrogen atoms has been substituted with fluorine atoms can be used.

Specific examples of $Y^3$ include —CF$_2$—, —CF$_2$CF$_2$—, —CF$_2$CF$_2$CF$_2$—, —CF(CF$_3$)CF$_2$—, —CF(CF$_2$CF$_3$)—, —C(CF$_3$)$_2$—, —CF$_2$CF$_2$CF$_2$CF$_2$—, —CF(CF$_3$)CF$_2$CF$_2$—, —CF$_2$CF(CF$_3$)CF$_2$—, —CF(CF$_3$)CF(CF$_3$)—, —C(CF$_3$)$_2$CF$_2$—, —CF(CF$_2$CF$_3$)CF$_2$—, —CF(CF$_2$CF$_2$CF$_3$)—, —C(CF$_3$)(CF$_2$CF$_3$)—; —CHF—, —CH$_2$CF$_2$—, —CH$_2$CH$_2$CF$_2$—, —CH$_2$CF$_2$CF$_2$—, —CH(CF$_3$)CH$_2$—, —CH(CF$_2$CF$_3$)—, —C(CH$_3$)(CF$_3$)—, —CH$_2$CH$_2$CH$_2$CF$_2$—, —CH$_2$CH$_2$CF$_2$CF$_2$—, —CH(CF$_3$)CH$_2$CH$_2$—, —CH$_2$CH(CF$_3$)CH$_2$—, —CH(CF$_3$)CH(CF$_3$)—, —C(CF$_3$)$_2$CH$_2$—; —CH$_2$—, —CH$_2$CH$_2$—, —CH$_2$CH$_2$CH$_2$—, —CH(CH$_3$)CH$_2$—, —CH(CH$_2$CH$_3$)—, —C(CH$_3$)$_2$—, —CH$_2$CH$_2$CH$_2$CH$_2$—, —CH(CH$_3$)CH$_2$CH$_2$—, —CH$_2$CH(CH$_3$)CH$_2$—, —CH(CH$_3$)CH(CH$_3$)—, —C(CH$_3$)$_2$CH$_2$—, —CH(CH$_2$CH$_3$)CH$_2$—, —CH(CH$_2$CH$_2$CH$_3$)—, and —C(CH$_3$)(CH$_2$CH$_3$)—.

$Y^3$ is preferably a fluorinated alkylene group, and most preferably a fluorinated alkylene group in which the carbon atom bonded to the adjacent sulfur atom is fluorinated. Examples of such fluorinated alkylene groups include —CF$_2$—, —CF$_2$CF$_2$—, —CF$_2$CF$_2$CF$_2$—, —CF(CF$_3$)CF$_2$—, —CF$_2$CF$_2$CF$_2$CF$_2$—, —CF(CF$_3$)CF$_2$CF$_2$—, —CF$_2$CF(CF$_3$)CF$_2$—, —CF(CF$_3$)CF(CF$_3$)—, —C(CF$_3$)$_2$CF$_2$—, —CF(CF$_2$CF$_3$)CF$_2$—; —CH$_2$CF$_2$—, —CH$_2$CH$_2$CF$_2$—, —CH$_2$CF$_2$CF$_2$—; —CH$_2$CH$_2$CH$_2$CF$_2$—, —CH$_2$CH$_2$CF$_2$CF$_2$—, and —CH$_2$CF$_2$CF$_2$CF$_2$—.

Of these, —CF$_2$—, —CF$_2$CF$_2$—, —CF$_2$CF$_2$CF$_2$— or CH$_2$CF$_2$CF$_2$— is preferable, —CF$_2$—, —CF$_2$CF$_2$— or —CF$_2$CF$_2$CF$_2$— is more preferable, and —CF$_2$— is particularly desirable.

The alkylene group or fluorinated alkylene group may have a substituent. The alkylene group or fluorinated alkylene group "has a substituent" means that part or all of the hydrogen atoms or fluorine atoms in the alkylene group or fluorinated alkylene group has been substituted with groups other than hydrogen atoms and fluorine atoms.

Examples of substituents which the alkylene group or fluorinated alkylene group may have include an alkyl group of 1 to 4 carbon atoms, an alkoxy group of 1 to 4 carbon atoms, and a hydroxyl group.

In formula (b-2), $R^{5'''}$ and $R^{6'''}$ each independently represents an aryl group which may have a substituent or an alkyl group which may have a substituent.

In terms of improvement in lithography properties and resist pattern shape, it is preferable that at least one of $R^{5'''}$ and $R^{6'''}$ is an aryl group, and it is more preferable that both $R^{5'''}$ and $R^{6'''}$ represent an aryl group.

As the aryl group for $R^{5'''}$ and $R^{6'''}$, the same aryl groups as those described above for $R^{1'''}$ to $R^{3'''}$ can be used.

As the alkyl group for $R^{5'''}$ and $R^{6'''}$, the same alkyl groups as those described above for $R^{1'''}$ to $R^{3'''}$ can be used.

As the alkenyl group for $R^{5'''}$ and $R^{6'''}$, the same as the alkenyl groups for $R^{1'''}$ to $R^{3'''}$ can be used.

It is particularly desirable that both of $R^{5'''}$ and $R^{6'''}$ represents a phenyl group.

Specific examples of the cation moiety of the compound represented by general formula (b-2) include diphenyliodonium and bis(4-tert-butylphenyl)iodonium.

As $R^{4'''}$ in formula (b-2), the same groups as those mentioned above for $R^{4'''}$ in formula (b-1) can be used.

Specific examples of suitable onium salt acid generators represented by formula (b-1) or (b-2) include diphenyliodonium trifluoromethanesulfonate or nonafluorobutanesulfonate; bis(4-tert-butylphenyl)iodonium trifluoromethanesulfonate or nonafluorobutanesulfonate; triphenylsulfonium trifluoromethanesulfonate, heptafluoropropanesulfonate or nonafluorobutanesulfonate; tri(4-methylphenyl)sulfonium trifluoromethanesulfonate, heptafluoropropanesulfonate or nonafluorobutanesulfonate; dimethyl(4-hydroxynaphthyl)sulfonium trifluoromethanesulfonate, heptafluoropropanesulfonate or nonafluorobutanesulfonate; monophenyldimethylsulfonium trifluoromethanesulfonate, heptafluoropropanesulfonate or nonafluorobutanesulfonate; diphenylmonomethylsulfonium trifluoromethanesulfonate, heptafluoropropanesulfonate or nonafluorobutanesulfonate; (4-methylphenyl)diphenylsulfonium trifluoromethanesulfonate, heptafluoropropanesulfonate or nonafluorobutanesulfonate; (4-methoxyphenyl)diphenylsulfonium trifluoromethanesulfonate, heptafluoropropanesulfonate or nonafluorobutanesulfonate; tri(4-tert-butyl)phenylsulfonium trifluoromethanesulfonate, heptafluoropropanesulfonate or nonafluorobutanesulfonate; diphenyl(1-(4-methoxy)naphthyl)sulfonium trifluoromethanesulfonate, heptafluoropropanesulfonate or nonafluorobutanesulfonate; di(1-naphthyl)phenylsulfonium trifluoromethanesulfonate, heptafluoropropanesulfonate or nonafluorobutanesulfonate; 1-phenyltetrahydrothiophenium trifluoromethanesulfonate, heptafluoropropanesulfonate or nonafluorobutanesulfonate; 1-(4-methylphenyl)tetrahydrothiophenium trifluoromethanesulfonate, heptafluoropropanesulfonate or nonafluorobutanesulfonate; 1-(3,5-dimethyl-4-hydroxyphenyl)tetrahydrothiophenium trifluoromethanesulfonate, heptafluoropropanesulfonate or nonafluorobutanesulfonate; 1-(4-methoxynaphthalene-1-yl)tetrahydrothiophenium trifluoromethanesulfonate, heptafluoropropanesulfonate or nonafluorobutanesulfonate; 1-(4-ethoxynaphthalene-1-yl)tetrahydrothiophenium trifluoromethanesulfonate, heptafluoropropanesulfonate or nonafluorobutanesulfonate; 1-(4-n-butoxynaphthalene-1-yl)tetrahydrothiophenium trifluoromethanesulfonate, heptafluoropropanesulfonate or nonafluorobutanesulfonate; 1-phenyltetrahydrothiopyranium trifluoromethanesulfonate, heptafluoropropanesulfonate or nonafluorobutanesulfonate; 1-(4-hydroxyphenyl)tetrahydrothiopyranium trifluoromethanesulfonate, heptafluoropropanesulfonate or nonafluorobutanesulfonate; 1-(3,5-dimethyl-4-hydroxyphenyl)tetrahydrothiopyranium trifluoromethanesulfonate, heptafluoropropanesulfonate or nonafluorobutanesulfonate; and 1-(4-methylphenyl)tetrahydrothiopyranium trifluoromethanesulfonate, heptafluoropropanesulfonate or nonafluorobutanesulfonate.

It is also possible to use onium salts in which the anion moiety of these onium salts is replaced by an alkyl sulfonate such as methanesulfonate, n-propanesulfonate, n-butanesulfonate, n-octanesulfonate, 1-adamantanesulfonate, or 2-norbornanesulfonate; or a sulfonate such as d-camphor-10-sulfonate, benzenesulfonate, perfluorobenzenesulfonate, or p-toluenesulfonate.

Furthermore, onium salts in which the anion moiety of these onium salts is replaced by an anion moiety represented by any one of formulas (b1) to (b8) shown below can also be used.

[Chemical Formula 73]

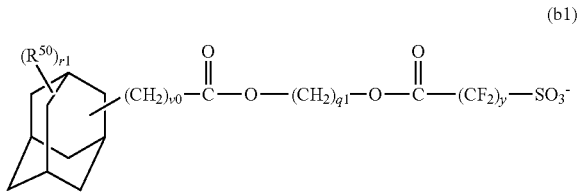

(b1)

(b2)

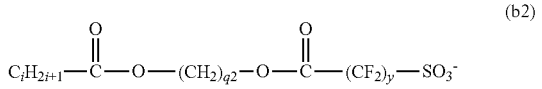

(b3)

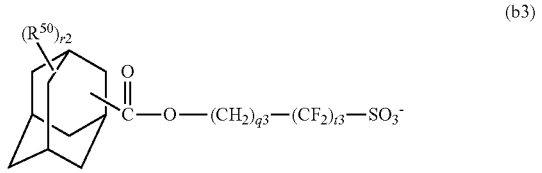

(b4)

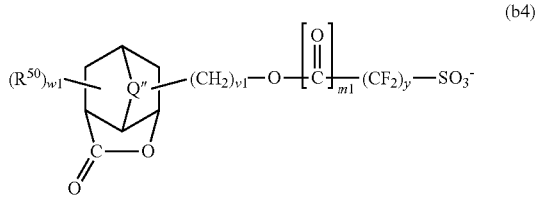

(b5)

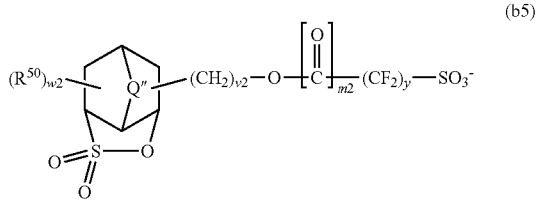

(b6)

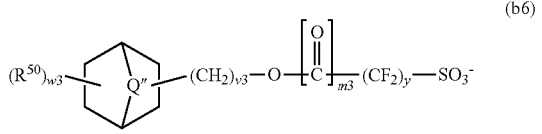

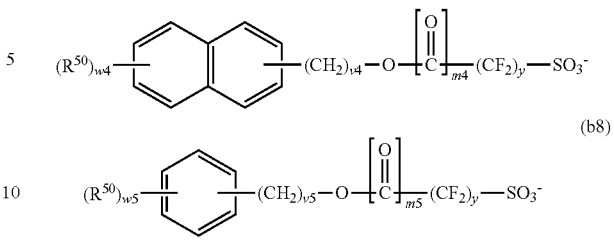

(b7)

(b8)

In the formulas, y represents an integer of 1 to 3; each of q1 and q2 independently represents an integer of 1 to 5; q3 represents an integer of 1 to 12; t3 represents an integer of 1 to 3; each of r1 and r2 independently represents an integer of 0 to 3; i represents an integer of 1 to 20; $R^{50}$ represents a substituent; each of m1 to m5 independently represents 0 or 1; each of v0 to v5 independently represents an integer of 0 to 3; each of w1 to w5 independently represents an integer of 0 to 3; and Q" is the same as defined above.

As the substituent for $R^{50}$, the same groups as those which the aforementioned aliphatic hydrocarbon group or aromatic hydrocarbon group for $X^b$ may have as a substituent can be used.

If there are two or more of the $R^{50}$ group, as indicated by the values r1, r2, and w1 to w5, then the two or more of the $R^{50}$ groups may be the same or different from each other.

Further, onium salt-based acid generators in which the anion moiety in general formula (b-1) or (b-2) ($R^{4"}SO_3^-$) is replaced by an anion represented by general formula (b-3) or (b-4) shown below (the cation moiety is the same as the cation moiety in the aforementioned formula (b-1) or (b-2)) may be used.

[Chemical Formula 74]

(b-3)

(b-4)

In the formulas, X" represents an alkylene group of 2 to 6 carbon atoms in which at least one hydrogen atom has been substituted with a fluorine atom; and each of Y" and Z" independently represents an alkyl group of 1 to 10 carbon atoms in which at least one hydrogen atom has been substituted with a fluorine atom.

X" represents a linear or branched alkylene group in which at least one hydrogen atom has been substituted with a fluorine atom, and the alkylene group has 2 to 6 carbon atoms, preferably 3 to 5 carbon atoms, and most preferably 3 carbon atoms.

Each of Y" and Z" independently represents a linear or branched alkyl group in which at least one hydrogen atom has been substituted with a fluorine atom, and the alkyl group has 1 to 10 carbon atoms, preferably 1 to 7 carbon atoms, and most preferably 1 to 3 carbon atoms.

The smaller the number of carbon atoms of the alkylene group for X" or those of the alkyl group for Y" and Z" within the above-mentioned range of the number of carbon atoms, the more the solubility in a resist solvent is improved.

Further, in the alkylene group for X" or the alkyl group for Y" and Z", it is preferable that the number of hydrogen atoms substituted with fluorine atoms is as large as possible because the acid strength increases and the transparency to high energy radiation of 200 nm or less or electron beam is improved.

The fluorination ratio of the alkylene group or alkyl group is preferably from 70 to 100%, more preferably from 90 to 100%, and it is particularly desirable that the alkylene group or alkyl group be a perfluoroalkylene group or perfluoroalkyl group in which all hydrogen atoms are substituted with fluorine atoms.

Further, an onium salt-based acid generator in which the anion moiety ($R^{4"}SO_3^-$) in general formula (b-1) or (b-2) has been replaced with $R^a$—$COO^-$ (in the formula, $R^a$ represents an alkyl group or a fluorinated alkyl group) can also be used (the cation moiety is the same as that in general formula (b-1) or (b-2)).

In the formula above, as $R^a$, the same groups as those described above for $R^{4"}$ can be used.

Specific examples of the group represented by the formula "$R^a$—$COO^-$" include a trifluoroacetic acid ion, an acetic acid ion, and a 1-adamantanecarboxylic acid ion.

Furthermore, as an onium salt-based acid generator, a sulfonium salt having a cation represented by general formula (b-5) or (b-6) shown below as the cation moiety may be used.

[Chemical Formula 75]

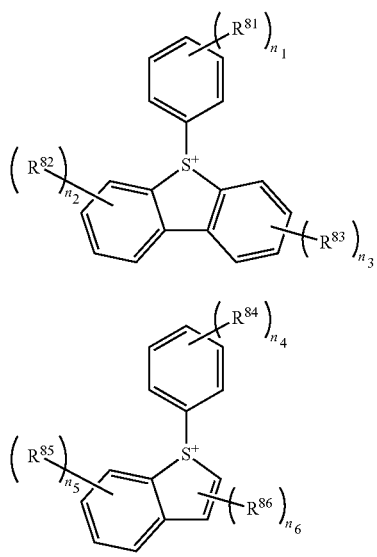

(b-5)

(b-6)

In formulas (b-5) and (b-6) above, each of $R^{81}$ to $R^{86}$ independently represents an alkyl group, an acetyl group, an alkoxy group, a carboxy group, a hydroxyl group or a hydroxyalkyl group; each of $n_1$ to $n_5$ independently represents an integer of 0 to 3; and $n_6$ represents an integer of 0 to 2.

With respect to $R^{81}$ to $R^{86}$, the alkyl group is preferably an alkyl group of 1 to 5 carbon atoms, more preferably a linear or branched alkyl group, and most preferably a methyl group, ethyl group, propyl group, isopropyl group, n-butyl group or tert butyl group.

The alkoxy group is preferably an alkoxy group of 1 to 5 carbon atoms, more preferably a linear or branched alkoxy group, and most preferably a methoxy group or ethoxy group.

The hydroxyalkyl group is preferably the aforementioned alkyl group in which one or more hydrogen atoms have been substituted with hydroxy groups, and examples thereof include a hydroxymethyl group, a hydroxyethyl group and a hydroxypropyl group.

If there are two or more of an individual $R^{81}$ to $R^{86}$ group, as indicated by the corresponding value of $n_1$ to $n_6$, then the two or more of the individual $R^{81}$ to $R^{86}$ group may be the same or different from each other.

$n_1$ is preferably 0 to 2, more preferably 0 or 1, and still more preferably 0.

It is preferable that $n_2$ and $n_3$ each independently represent 0 or 1, and more preferably 0.

$n_4$ is preferably 0 to 2, and more preferably 0 or 1.

$n_5$ is preferably 0 or 1, and more preferably 0.

$n_6$ is preferably 0 or 1, and more preferably 1.

Preferable examples of the cation represented by formula (b-5) or (b-6) are shown below.

[Chemical Formula 76]

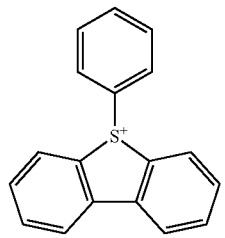

(b-5-1)

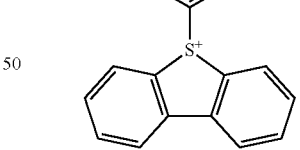

(b-5-2)

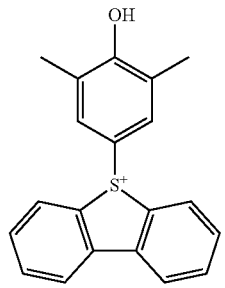

(b-5-3)

-continued (b-5-4)
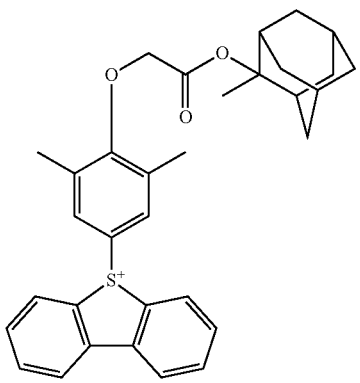

(b-5-5)
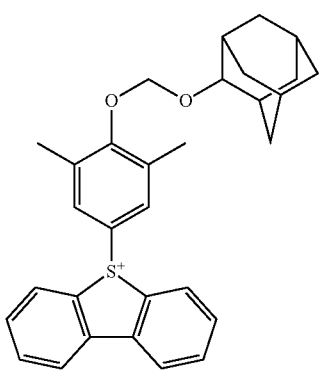

(b-5-6)
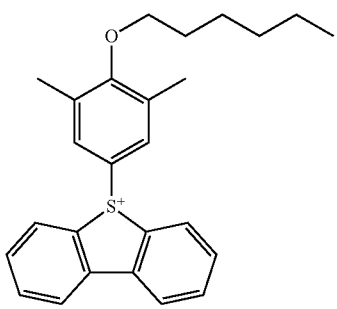

(b-6-1)
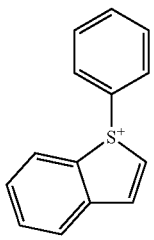

(b-6-2)
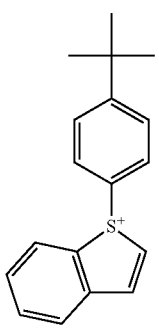

Furthermore, a sulfonium salt having a cation represented by general formula (b-7) or (b-8) shown below as the cation moiety may be used.

[Chemical Formula 77]

(b-7)
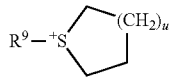

(b-8)
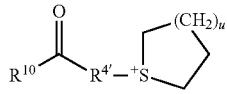

In formulas (b-7) and (b-8) shown below, each of $R^9$ and $R^{10}$ independently represents a phenyl group or naphthyl group which may have a substituent, an alkyl group of 1 to 5 carbon atoms, an alkoxy group or a hydroxyl group. Examples of the substituent are the same as the substituents described above in relation to the substituted aryl group for $R^{1\prime\prime\prime}$ to $R^{3\prime\prime\prime}$ (i.e., an alkyl group, an alkoxy group, an alkoxyalkyloxy group, an alkoxycarbonylalkyloxy group, a halogen atom, a hydroxy group, an oxo group (=O), an aryl group, —C(=O)—O—$R^{6\prime}$, —O—C(=O)—$R^{7\prime}$, —O—$R^{8\prime}$, a group in which $R^{56\prime}$ in the aforementioned general formula —O—$R^{50}$—C(=O)—O—$R^{56}$ has been substituted with $R^{56\prime}$).

$R^{4\prime}$ represents an alkylene group of 1 to 5 carbon atoms.

u is an integer of 1 to 3, and most preferably 1 or 2.

Preferable examples of the cation represented by formula (b-7) or (b-8) are shown below. In the formula, $R^C$ represents a substituent described above in the explanation of the aforementioned substituted aryl group (an alkyl group, an alkoxy group, an alkoxyalkyloxy group, an alkoxycarbonylalkyloxy group, a halogen atom, a hydroxy group, an oxo group (=O), an aryl group, —C(=O)—O—$R^{6\prime}$, —O—C(=O)—$R^{7\prime}$, and —O—$R^{8\prime}$).

[Chemical Formula 78]

(b-7-1)
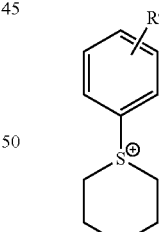

(b-7-2)
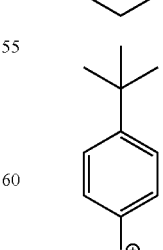

(b-7-3)

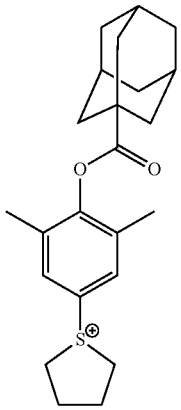

(b-7-4)

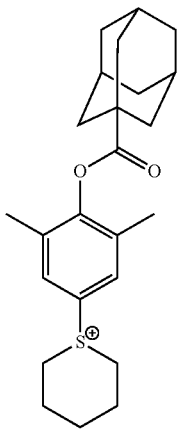

(b-7-5)

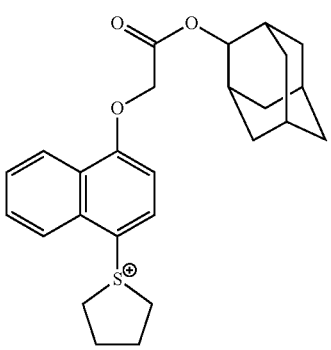

[Chemical Formula 79]

(b-8-1)

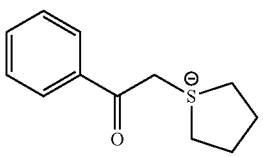

(b-8-2)

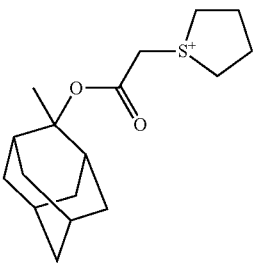

The anion moiety of the sulfonium salt having a cation moiety represented by any one of formulae (b-5) to (b-8) as a cation moiety thereof is not particularly limited, and the same anion moieties for onium salt-based acid generators which have been proposed may be used. Examples of such anion moieties include fluorinated alkylsulfonic acid ions such as anion moieties ($R^{4''}SO_3^-$) for onium salt-based acid generators represented by general formula (b-1) or (b-2) shown above; anion moieties represented by general formula (b-3) or (b-4) shown above; and anion moieties represented by any one of the aforementioned formula (b1) to (b8).

In the present description, an oximesulfonate acid generator is a compound having at least one group represented by general formula (B-1) shown below, and has a feature of generating acid by irradiation. Such oximesulfonate acid generators are widely used for a chemically amplified resist composition, and can be appropriately selected.

[Chemical Formula 80]

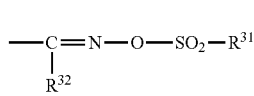

(B-1)

In the formula, each of $R^{31}$ and $R^{32}$ independently represents an organic group.

The organic group for $R^{31}$ and $R^{32}$ refers to a group containing a carbon atom, and may include atoms other than carbon atoms (e.g., a hydrogen atom, an oxygen atom, a nitrogen atom, a sulfur atom, a halogen atom (such as a fluorine atom and a chlorine atom) and the like).

As the organic group for $R^{31}$, a linear, branched, or cyclic alkyl group or aryl group is preferable. The alkyl group or the aryl group may have a substituent. The substituent is not particularly limited, and examples thereof include a fluorine atom and a linear, branched, or cyclic alkyl group having 1 to 6 carbon atoms. The alkyl group or the aryl group "has a substituent" means that part or all of the hydrogen atoms of the alkyl group or the aryl group is substituted with a substituent.

The alkyl group preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. As the alkyl group, a partially or completely halogenated alkyl group (hereinafter, sometimes referred to as a "halogenated alkyl group") is particularly desirable. The "partially halogenated alkyl group" refers to an alkyl group in which part of the hydrogen atoms are substituted with halogen atoms and the "completely halogenated alkyl group" refers to an alkyl group in which all of the hydrogen atoms are substituted with halogen atoms. Examples of halogen atoms include fluorine atoms, chlorine atoms, bromine atoms and iodine atoms, and fluorine atoms are particularly desirable. In other words, the halogenated alkyl group is preferably a fluorinated alkyl group.

The aryl group preferably has 4 to 20 carbon atoms, more preferably 4 to 10 carbon atoms, and most preferably 6 to 10 carbon atoms. As the aryl group, partially or completely halogenated aryl group is particularly desirable. The "partially halogenated aryl group" refers to an aryl group in which some of the hydrogen atoms are substituted with halogen atoms and the "completely halogenated aryl group" refers to an aryl group in which all of hydrogen atoms are substituted with halogen atoms.

As $R^{31}$, an alkyl group of 1 to 4 carbon atoms which has no substituent or a fluorinated alkyl group of 1 to 4 carbon atoms is particularly desirable.

As the organic group for $R^{32}$, a linear, branched, or cyclic alkyl group, aryl group, or cyano group is preferable. Examples of the alkyl group and the aryl group for $R^{32}$ include the same alkyl groups and aryl groups as those described above for $R^{31}$.

As $R^{32}$, a cyano group, an alkyl group of 1 to 8 carbon atoms having no substituent or a fluorinated alkyl group of 1 to 8 carbon atoms is particularly desirable.

Preferred examples of the oxime sulfonate acid generator include compounds represented by general formula (B-2) or (B-3) shown below.

[Chemical Formula 81]

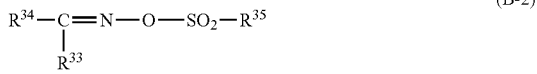

(B-2)

In the formula, $R^{33}$ represents a cyano group, an alkyl group having no substituent or a halogenated alkyl group; $R^{34}$ represents an aryl group; and $R^{35}$ represents an alkyl group having no substituent or a halogenated alkyl group.

[Chemical Formula 82]

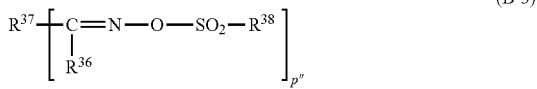

(B-3)

In the formula, $R^{36}$ represents a cyano group, an alkyl group having no substituent or a halogenated alkyl group; $R^{37}$ represents a divalent or trivalent aromatic hydrocarbon group; $R^{38}$ represents an alkyl group having no substituent or a halogenated alkyl group; and p" represents 2 or 3.

In general formula (B-2), the alkyl group having no substituent or the halogenated alkyl group for $R^{33}$ preferably has 1 to 10 carbon atoms, more preferably 1 to 8 carbon atoms, and most preferably 1 to 6 carbon atoms.

As $R^{33}$, a halogenated alkyl group is preferable, and a fluorinated alkyl group is more preferable.

The fluorinated alkyl group for $R^{33}$ preferably has 50% or more of the hydrogen atoms thereof fluorinated, more preferably 70% or more, and most preferably 90% or more.

Examples of the aryl group for $R^{34}$ include groups in which one hydrogen atom has been removed from an aromatic hydrocarbon ring, such as a phenyl group, a biphenyl group, a fluorenyl group, a naphthyl group, an anthryl group, and a phenanthryl group, and heteroaryl groups in which some of the carbon atoms constituting the ring(s) of these groups are substituted with hetero atoms such as an oxygen atom, a sulfur atom, and a nitrogen atom. Of these, a fluorenyl group is preferable.

The aryl group for $R^{34}$ may have a substituent such as an alkyl group of 1 to 10 carbon atoms, a halogenated alkyl group, or an alkoxy group. The alkyl group and halogenated alkyl group as the substituent preferably has 1 to 8 carbon atoms, and more preferably 1 to 4 carbon atoms. Further, the halogenated alkyl group is preferably a fluorinated alkyl group.

The alkyl group having no substituent or the halogenated alkyl group for $R^{35}$ preferably has 1 to 10 carbon atoms, more preferably 1 to 8 carbon atoms, and most preferably 1 to 6 carbon atoms.

As $R^{35}$, a halogenated alkyl group is preferable, and a fluorinated alkyl group is more preferable.

In terms of enhancing the strength of the acid generated, the fluorinated alkyl group for $R^{35}$ preferably has 50% or more of the hydrogen atoms fluorinated, more preferably 70% or more, still more preferably 90% or more. A completely fluorinated alkyl group in which 100% of the hydrogen atoms are substituted with fluorine atoms is particularly desirable.

In general formula (B-3), as the alkyl group having no substituent and the halogenated alkyl group for $R^{36}$, the same alkyl group having no substituent and the halogenated alkyl group described above for $R^{33}$ can be used.

Examples of the divalent or trivalent aromatic hydrocarbon group for $R^{37}$ include groups in which one or two hydrogen atoms have been removed from the aryl group for $R^{34}$.

As the alkyl group having no substituent or the halogenated alkyl group for $R^{38}$, the same one as the alkyl group having no substituent or the halogenated alkyl group for $R^{35}$ can be used.

p" is preferably 2.

Specific examples of suitable oxime sulfonate acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Further, oxime sulfonate acid generators disclosed in Japanese Unexamined Patent Application, First Publication No. Hei 9-208554 (Chemical Formulas 18 and 19 shown in paragraphs [0012] to [0014]) and oxime sulfonate acid generators disclosed in WO 2004/074242A2 (Examples 1 to 40 described at pages 65 to 85) may be preferably used.

Furthermore, as preferable examples, the following can be used.

[Chemical Formula 83]

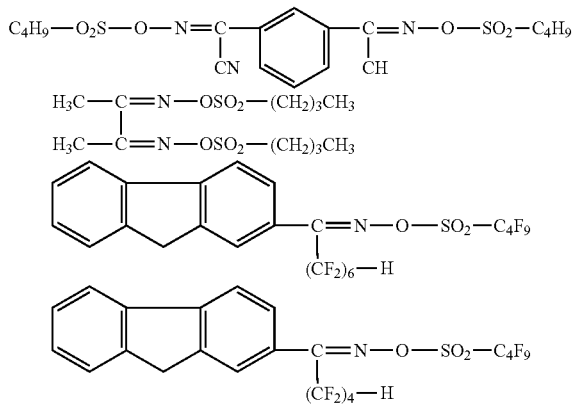

Of the aforementioned diazomethane acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Further, diazomethane acid generators disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 may be preferably used.

Furthermore, as examples of poly(bis-sulfonyl)diazomethanes, those disclosed in Japanese Unexamined Patent Application, First Publication No. Hei 11-322707, including 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane, and 1,10-bis(cyclohexylsulfonyldiazomethylsulfonyl)decane, may be given.

As the component (B), one type of these acid generators may be used alone, or two or more types may be used in combination.

In the negative-tone development resist composition of the present invention, when the component (B) is used, the amount of the component (B) relative to 100 parts by weight of the component (A) is preferably within a range from 0.5 to 60 parts by weight, more preferably from 1 to 50 parts by weight, and still more preferably from 1 to 40 parts by weight. When the amount of the component (B) is within the above-mentioned range, formation of a resist pattern can be satisfactorily performed. Further, by virtue of the above-mentioned range, when each of the components are dissolved in an organic solvent, a uniform solution can be obtained and the storage stability becomes satisfactory.

The negative-tone development resist composition of the present invention may contain a nitrogen-containing organic compound (D) (hereafter, referred to as "component (D)") which does not fall under the category of the component (A) and the component (B), as long as the effects of the present invention are not impaired.

As the component (D), there is no particular limitation as long as it functions as an acid diffusion control agent, i.e., a quencher which traps the acid generated from the component (A1) and the component (B) upon exposure. A multitude of these components (D) have already been proposed, and any of these known compounds may be used.

Examples thereof include an aliphatic amine and an aromatic amine. Among these, an aliphatic amine is preferable, and a secondary aliphatic amine or tertiary aliphatic amine is particularly desirable.

An aliphatic amine is an amine having one or more aliphatic groups, and the aliphatic groups preferably have 1 to 20 carbon atoms.

Examples of these aliphatic amines include amines in which at least one hydrogen atom of ammonia ($NH_3$) has been substituted with an alkyl group or hydroxyalkyl group of no more than 20 carbon atoms (i.e., alkylamines or alkylalcoholamines), and cyclic amines.

The alkyl group and the alkyl group within the hydroxyalkyl group may be any of linear, branched or cyclic.

When the alkyl group is linear or branched, the alkyl group preferably has 2 to 20 carbon atoms, and more preferably 2 to 8 carbon atoms.

When the alkyl group is cyclic (i.e., a cycloalkyl group), the number of carbon atoms is preferably 3 to 30, more preferably 3 to 20, still more preferably 3 to 15, still more preferably 4 to 12, and most preferably 5 to 10. The alkyl group may be monocyclic or polycyclic. Examples thereof include groups in which one or more of the hydrogen atoms have been removed from a monocycloalkane; and groups in which one or more of the hydrogen atoms have been removed from a polycycloalkane such as a bicycloalkane, a tricycloalkane, or a tetracycloalkane. Specific examples of the monocycloalkane include cyclopentane and cyclohexane. Specific examples of the polycycloalkane include adamantane, norbornane, isobornane, tricyclodecane and tetracyclododecane.

Specific examples of alkylamines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine, and tri-n-dodecylamine.

Specific examples of alkylalcoholamines include diethanolamine, triethanolamine, diisopropanolamine, triisopropanolamine, di-n-octanolamine, tri-n-octanolamine, stearyldiethanolamine and lauryldiethanolamine.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine, and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

Examples of other aliphatic amines include tris(2-methoxymethoxyethyl)amine, tris {2-(2-methoxyethoxy)ethyl}amine, tris {2-(2-methoxyethoxymethoxy)ethyl}amine, tris {2-(1-methoxyethoxy)ethyl}amine, tris {2-(1-ethoxyethoxy)ethyl}amine, tris {2-(1-ethoxypropoxy)ethyl}amine and tris[2-{2-(2-hydroxyethoxy)ethoxy}ethyl]amine.

Examples of aromatic amines include aniline, pyridine, 4-dimethylaminopyridine, pyrrole, indole, pyrazole, imidazole and derivatives thereof, as well as diphenylamine, triphenylamine and tribenzylamine.

These compounds can be used either alone, or in combinations of two or more different compounds.

The component (D) is typically used in an amount within a range from 0.01 to 5.0 parts by weight, relative to 100 parts by weight of the component (A). When the amount of the component (D) is within the above-mentioned range, the shape of the resist pattern and the post exposure stability of the latent image formed by the pattern-wise exposure of the resist layer are improved.

Furthermore, in the negative-tone development resist composition for immersion exposure according to the present invention, for preventing any deterioration in sensitivity, and improving the resist pattern shape and the post exposure stability of the latent image formed by the pattern-wise exposure of the resist layer, at least one compound (E) (hereafter referred to as "component (E)") selected from the group consisting of organic carboxylic acids, and phosphorus oxo acids and derivatives thereof can be added.

Examples of suitable organic carboxylic acids include acetic acid, malonic acid, citric acid, malic acid, succinic acid, benzoic acid, and salicylic acid.

Examples of phosphorus oxo acids include phosphoric acid, phosphonic acid and phosphinic acid. Among these, phosphonic acid is particularly desirable.

Examples of oxo acid derivatives include esters in which a hydrogen atom within the above-mentioned oxo acids is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenylphosphonic acid, diphenyl phosphonate and dibenzyl phosphonate.

Examples of phosphinic acid derivatives include phosphinic acid esters such as phenylphosphinic acid.

As the component (E), one type may be used alone, or two or more types may be used in combination.

The component (E) is typically used in an amount within a range from 0.01 to 5.0 parts by weight, relative to 100 parts by weight of the component (A).

If desired, other miscible additives can also be added to the resist composition of the present invention. Examples of such miscible additives include additive resins for improving the performance of the resist film, surfactants for improving the applicability, dissolution inhibitors, plasticizers, stabilizers, colorants, halation prevention agents, and dyes.

The resist composition for immersion exposure according to the present invention can be prepared by dissolving the materials for the resist composition in an organic solvent (hereafter, frequently referred to as "component (S)").

The component (S) may be any organic solvent which can dissolve the respective components to give a uniform solution, and one or more kinds of any organic solvent can be appropriately selected from those which have been conventionally known as solvents for a chemically amplified resist.

Examples thereof include lactones such as γ-butyrolactone; ketones such as acetone, methyl ethyl ketone, cyclohexanone, methyl-n-pentyl ketone, methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, mono ethyl ether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; and aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene.

These solvents can be used individually, or in combination as a mixed solvent.

Among these, propylene glycol monomethyl ether acetate (PGMEA), propylene glycol monomethyl ether (PGME), cyclohexanone and ethyl lactate (EL) are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably in the range of 1:9 to 9:1, more preferably from 2:8 to 8:2. For example, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME weight ratio is preferably from 1:9 to 9:1, more preferably from 2:8 to 8:2, and still more preferably 3:7 to 7:3. Alternatively, when PGME and cyclohexanone is mixed as the polar solvent, the PGMEA:(PGME+cyclohexanone) weight ratio is preferably from 1:9 to 9:1, more preferably from 2:8 to 8:2, and still more preferably 3:7 to 7:3.

Further, as the component (S), a mixed solvent of γ-butyrolactone with PGMEA, EL or the aforementioned mixed solvent of PGMEA with a polar solvent, is also preferable. The mixing ratio (former:latter) of such a mixed solvent is preferably from 70:30 to 95:5.

The amount of the organic solvent is not particularly limited, and is appropriately adjusted to a concentration which enables coating of a coating solution to a substrate, depending on the thickness of the coating film. In general, the organic solvent is used in an amount such that the solid content of the resist composition becomes within the range from 1 to 20% by weight, and preferably from 2 to 15% by weight.

By the method of forming a resist pattern according to the present invention, a fine resist pattern can be stably formed with excellent lithography properties by a negative-tone developing process using a developing solution containing an organic solvent.

In a negative-tone developing process, in the case where a conventional developing solution containing a ketone solvent or an ester solvent is used, depending on the kind of base component of the resist composition (e.g., a specific resin component having a structural unit which generates acid upon exposure), a resist pattern could not be obtained. The reason for this is considered that the resin component used as the base component which exhibits increased polarity by the action of acid has low affinity for the developing solution.

In the method of forming a resist pattern according to the present invention, by virtue of using a developing solution containing a nitrile solvent, it is considered that the polarity of the developing solution is increased as compared to a conventional developing solution. As a result, it is presumed that the affinity of the resin component for the developing solution during development is increased, such that a pattern can be reliably resolved. In addition, in the present invention, the component (A1) includes a structural unit (a0) which generates acid upon exposure. By virtue of the component (A1) including the structural unit (a0), the structural unit (a0) is uniformly distributed within the resist film together with the component (A1). As a result, at exposed portions, acid is uniformly generated from the structural unit (a0), thereby uniformly proceeding the decomposition of the acid dissociable group within the component (A1) at exposed portions. Furthermore, in the present invention, since the structural unit containing an acid dissociable group is copolymerized with the structural unit (a0) which generates acid upon exposure, diffusion of acid generated upon exposure can be controlled. It is presumed that the above effects can be obtained by the above actions.

EXAMPLES

As follows is a description of examples of the present invention, although the scope of the present invention is by no way limited by these examples.

In the following examples, a unit represented by a chemical formula (I) is referred to as "compound (1)", and the same applies for compounds represented by other formulas.

Component (A1)

Synthesis Example 1

In a separable flask equipped with a thermometer, a reflux tube and a nitrogen feeding pipe, 10.00 g (58.77 mmol) of a compound (1), 14.71 g (58.77 mmol) of a compound (5), 6.94 g (29.38 mmol) of a compound (15) and 9.87 g (20.03 mmol) of a compound (19) were dissolved in 53.35 g of a mixed solvent of methyl ethyl ketone (MEK)/cyclohexanone (CH) =50/50 (weight ratio). Then, 15.03 mmol of dimethyl 2,2'-azobis(isobutyrate) (product name: V-601) as a polymerization initiator was added and dissolved in the resulting solution.

Then, the resulting solution was dropwise added to 28.94 g of a mixed solvent of MEK/CH=50/50 (weight ratio) heated to 80° C., in a nitrogen atmosphere over 4 hours. Thereafter, the reaction solution was heated for 1 hour while stirring, and then cooled to room temperature.

The obtained reaction polymer solution was dropwise added to an excess amount of isopropanol to deposit a polymer. Thereafter, the precipitated white powder was separated by filtration, followed by washing with isopropanol, methanol and MEK and drying, thereby obtaining 27.1 g of a polymeric compound (1) as an objective compound.

With respect to the polymeric compound (1), the weight average molecular weight (Mw) and the dispersity (Mw/Mn) were determined by the polystyrene equivalent value as measured by gel permeation chromatography (GPC). As a result, it was found that the weight average molecular weight was 15,000, and the dispersity was 1.63. Further, as a result of an analysis by carbon 13 nuclear magnetic resonance spectroscopy (600 MHz, $^{13}$C-NMR), it was found that the composition of the copolymer (ratio (molar ratio) of the respective structural units within the structural formula) was l/m/n/o=35.2/32.6/19.4/12.8.

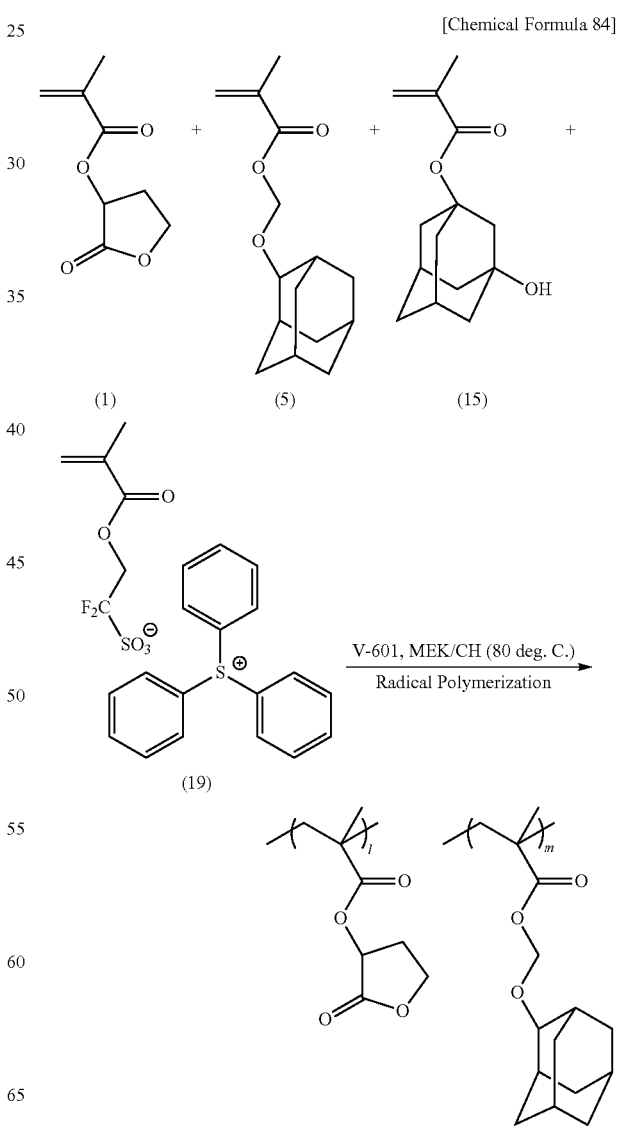

[Chemical Formula 84]

-continued

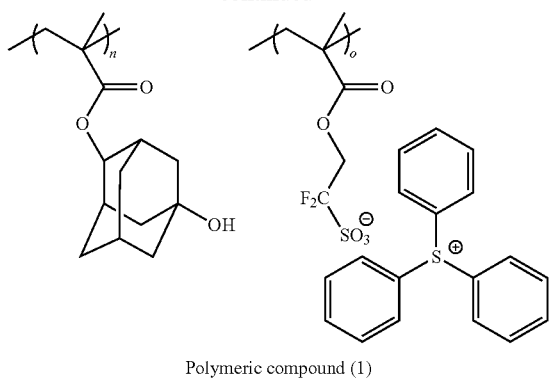

Polymeric compound (1)

Component (A1)

Synthesis Examples 2-20

Synthesis of Polymeric Compounds (2) to (20)

Polymeric compounds (2) to (20) were synthesized in the same manner as in Component (A1) Synthesis Example 1, except that the following monomers (1) to (21) which derived the structural units constituting each polymeric compound were used in predetermined molar ratio.

With respect to each polymeric compound, the structural units for deriving the compound, the copolymer compositional ratio as determined by carbon 13 nuclear magnetic resonance spectrometry (600 MHz $^{13}$C-NMR) and the weight average molecular weight and the dispersity (Mw/Mn) determined by the polystyrene equivalent value as measured by gel permeation chromatography (GPC) are shown in Table 1.

[Chemical Formula 85]

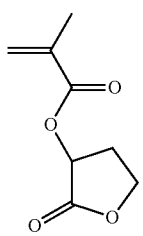
(1)

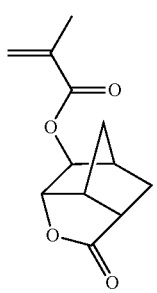
(2)

-continued

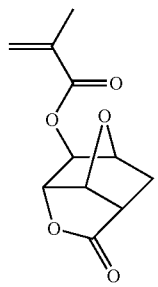
(3)

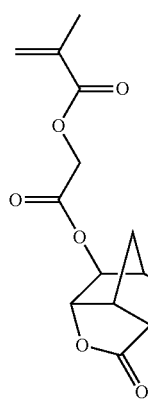
(4)

[Chemical Formula 86]

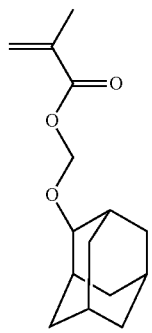
(5)

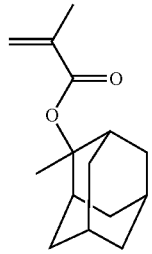
(6)

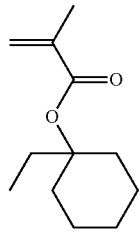
(7)

-continued
(8)
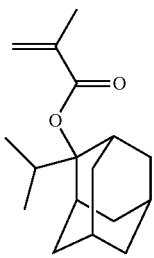
(9)
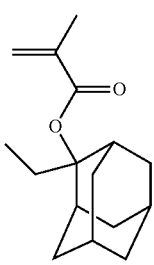
(10)
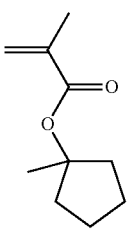
(11)
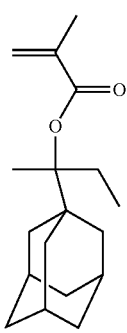
(12)
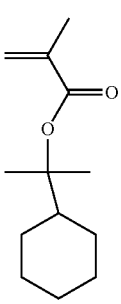
-continued
[Chemical Formula 87]
(13)
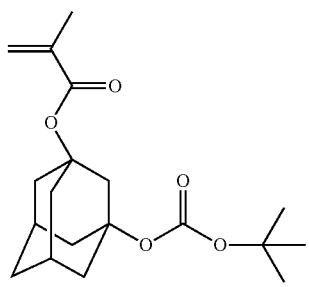
(14)
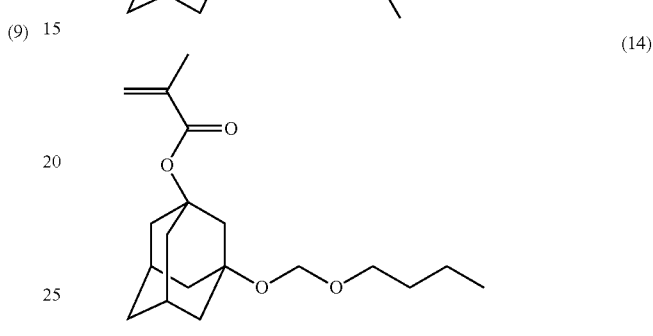
[Chemical Formula 88]
(15)
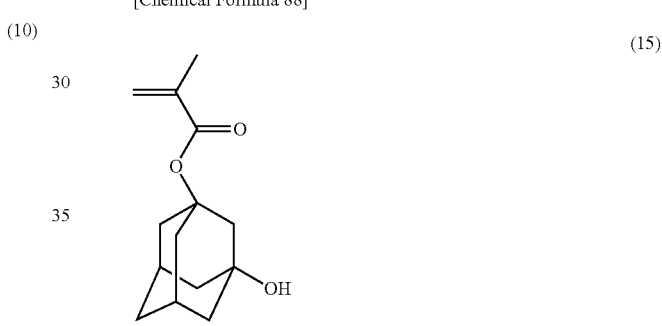
(16)
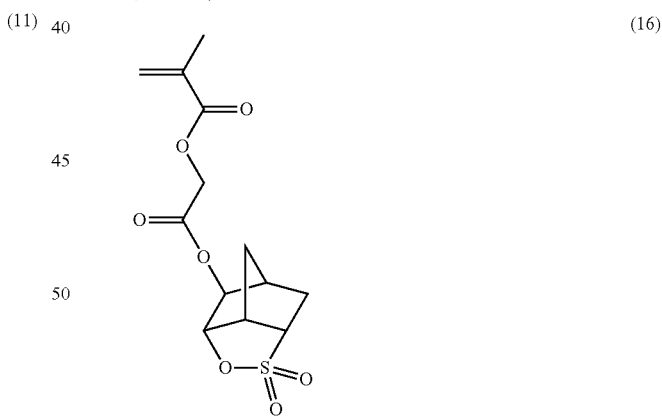
(17)
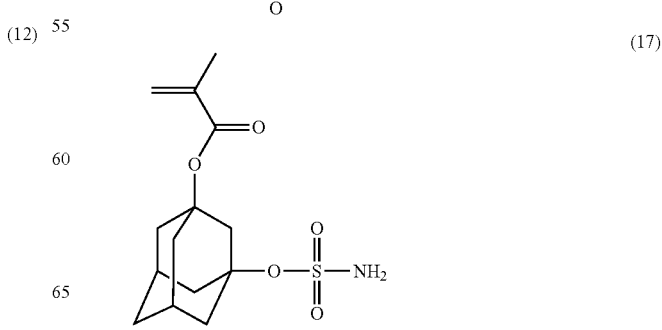

-continued

(18)
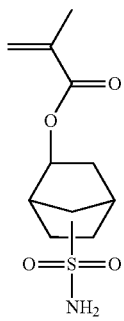

[Chemical Formula 89]

(19)
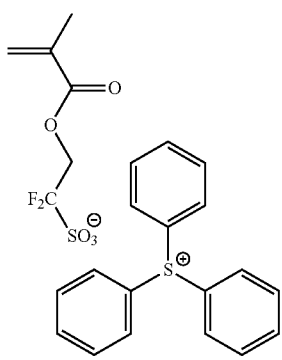

-continued

(20)
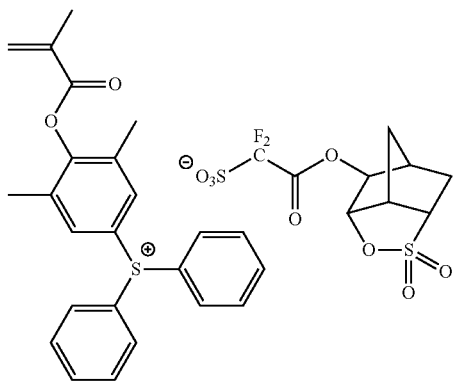

(21)
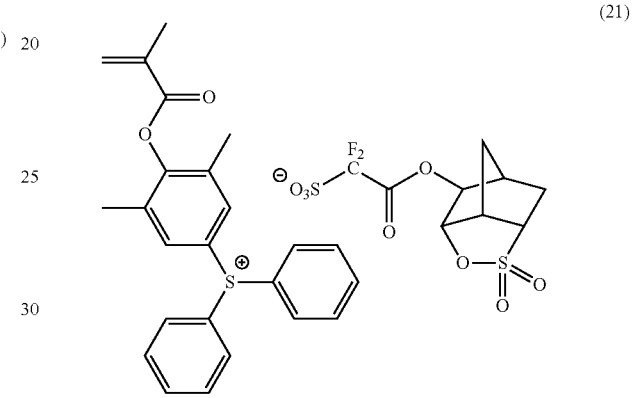

TABLE 1

| | Compound deriving each structural unit | Copolymer compositional ratio | Mw | Mw/Mn |
|---|---|---|---|---|
| Polymeric compound 1 | (1)/(5)/(15)/(19) | 35.2/32.6/19.4/12.8 | 15000 | 1.63 |
| Polymeric compound 2 | (1)/(5)/(15)/(19) | 38.1/37.4/18.7/5.8 | 14800 | 1.72 |
| Polymeric compound 3 | (1)/(5)/(15)/(19) | 35.4/34.9/17.2/12.5 | 7200 | 1.63 |
| Polymeric compound 4 | (1)/(5)/(15)/(19) | 32.5/31.7/16.2/19.6 | 19000 | 1.85 |
| Polymeric compound 5 | (1)/(5)/(15)/(20) | 34.7/35.4/17.3/12.6 | 16200 | 1.67 |
| Polymeric compound 6 | (16)/(5)/(15)/(21) | 35.8/34.8/17.1/12.3 | 18900 | 1.87 |
| Polymeric compound 7 | (1)/(16)/(5)/(15)/(19) | 20.4/16.0/34.3/16.9/12.4 | 13600 | 1.69 |
| Polymeric compound 8 | (1)/(6)/(19) | 43.2/44.7/12.1 | 13900 | 1.70 |
| Polymeric compound 9 | (1)/(6)/(15)/(19) | 36.2/33.4/17.8/12.6 | 13700 | 1.67 |
| Polymeric compound 10 | (1)/(7)/(15)/(19) | 35.1/34.7/17.8/12.4 | 14600 | 1.74 |
| Polymeric compound 11 | (1)/(7)/(17)/(19) | 35.6/34.3/17.4/12.7 | 14600 | 1.80 |
| Polymeric compound 12 | (16)/(8)/(15)/(19) | 36.8/33.2/17.0/13.0 | 15500 | 1.66 |
| Polymeric compound 13 | (16)/(8)/(18)/(19) | 35.7/34.5/17.8/12.0 | 14800 | 1.78 |
| Polymeric compound 14 | (2)/(6)/(15)/(19) | 35.6/34.1/17.5/12.8 | 15100 | 1.73 |
| Polymeric compound 15 | (3)/(9)/(15)/(19) | 34.9/34.8/17.9/12.4 | 14900 | 1.72 |
| Polymeric compound 16 | (4)/(8)/(9)/(15)/(19) | 35.0/30.2/5.3/16.7/12.8 | 14400 | 1.75 |

TABLE 1-continued

| | Compound deriving each structural unit | Copolymer compositional ratio | Mw | Mw/Mn |
|---|---|---|---|---|
| Polymeric compound 17 | (1)/(16)/(8)/(10)/(15)/(19) | 30.2/17.5/20.3/10.7/8.4/12.9 | 15000 | 1.77 |
| Polymeric compound 18 | (1)/(6)/(13)/(19) | 34.7/35.7/17.4/12.2 | 15700 | 1.68 |
| Polymeric compound 19 | (1)/(8)/(14)/(19) | 36.4/32.8/17.6/13.2 | 13500 | 1.79 |
| Polymeric compound 20 | (1)/(16)/(11)/(12)/(15)/(19) | 30.5/17.3/20.1/10.5/8.8/12.8 | 14100 | 1.75 |

Negative Tone-Development Resist Composition

Examples 1 to 20

The components shown in Table 2 were mixed together and dissolved to obtain negative-tone development resist compositions.

TABLE 2

| | Component (A) | Component (D) | Component (E) | Component (S) | | |
|---|---|---|---|---|---|---|
| Example 1 | (A)-1 [100] | (D)-1 [1.95] | (E)-1 [0.83] | (S)-1 [1960] | (S)-2 [1310] | (S)-3 [1090] |
| Example 2 | (A)-2 [100] | (D)-1 [1.95] | (E)-1 [0.83] | (S)-1 [1960] | (S)-2 [1310] | (S)-3 [1090] |
| Example 3 | (A)-3 [100] | (D)-1 [1.95] | (E)-1 [0.83] | (S)-1 [1960] | (S)-2 [1310] | (S)-3 [1090] |
| Example 4 | (A)-4 [100] | (D)-1 [1.95] | (E)-1 [0.83] | (S)-1 [1960] | (S)-2 [1310] | (S)-3 [1090] |
| Example 5 | (A)-5 [100] | (D)-1 [1.95] | (E)-1 [0.83] | (S)-1 [1960] | (S)-2 [1310] | (S)-3 [1090] |
| Example 6 | (A)-6 [100] | (D)-1 [1.95] | (E)-1 [0.83] | (S)-1 [1960] | (S)-2 [1310] | (S)-3 [1090] |
| Example 7 | (A)-7 [100] | (D)-1 [1.95] | (E)-1 [0.83] | (S)-1 [1960] | (S)-2 [1310] | (S)-3 [1090] |
| Example 8 | (A)-8 [100] | (D)-1 [1.95] | (E)-1 [0.83] | (S)-1 [1960] | (S)-2 [1310] | (S)-3 [1090] |
| Example 9 | (A)-9 [100] | (D)-1 [1.95] | (E)-1 [0.83] | (S)-1 [1960] | (S)-2 [1310] | (S)-3 [1090] |
| Example 10 | (A)-10 [100] | (D)-1 [1.95] | (E)-1 [0.83] | (S)-1 [1960] | (S)-2 [1310] | (S)-3 [1090] |
| Example 11 | (A)-11 [100] | (D)-1 [1.95] | (E)-1 [0.83] | (S)-1 [1960] | (S)-2 [1310] | (S)-3 [1090] |
| Example 12 | (A)-12 [100] | (D)-1 [1.95] | (E)-1 [0.83] | (S)-1 [1960] | (S)-2 [1310] | (S)-3 [1090] |
| Example 13 | (A)-13 [100] | (D)-1 [1.95] | (E)-1 [0.83] | (S)-1 [1960] | (S)-2 [1310] | (S)-3 [1090] |
| Example 14 | (A)-14 [100] | (D)-1 [1.95] | (E)-1 [0.83] | (S)-1 [1960] | (S)-2 [1310] | (S)-3 [1090] |
| Example 15 | (A)-15 [100] | (D)-1 [1.95] | (E)-1 [0.83] | (S)-1 [1960] | (S)-2 [1310] | (S)-3 [1090] |
| Example 16 | (A)-16 [100] | (D)-1 [1.95] | (E)-1 [0.83] | (S)-1 [1960] | (S)-2 [1310] | (S)-3 [1090] |
| Example 17 | (A)-17 [100] | (D)-1 [1.95] | (E)-1 [0.83] | (S)-1 [1960] | (S)-2 [1310] | (S)-3 [1090] |
| Example 18 | (A)-18 [100] | (D)-1 [1.95] | (E)-1 [0.83] | (S)-1 [1960] | (S)-2 [1310] | (S)-3 [1090] |
| Example 19 | (A)-19 [100] | (D)-1 [1.95] | (E)-1 [0.83] | (S)-1 [1960] | (S)-2 [1310] | (S)-3 [1090] |
| Example 20 | (A)-20 [100] | (D)-1 [1.95] | (E)-1 [0.83] | (S)-1 [1960] | (S)-2 [1310] | (S)-3 [1090] |

In Table 2, the values in brackets [ ] indicate the amount (in terms of parts by weight) of the component added, and the reference characters indicate the following.

(A)-1 to (A)-20: the aforementioned polymeric compounds (1) to (20)
(D)-1: tri-n-octylamine.
(E)-1: salicylic acid
(S)-1: propyleneglycol monomethyletheracetate
(S)-2: propylene glycol monomethyl ether
(S)-3: cyclohexanone <Formation of Resist Pattern by Negative Tone Development (1)>

Example 21

An organic antireflection film composition (product name: ARC29, manufactured by Brewer Science Ltd.) was applied to an 8-inch silicon wafer using a spinner, and the composition was then baked and dried on a hotplate at 205° C. for 60 seconds, thereby forming an organic antireflection film having a thickness of 77 nm.

The negative-tone development resist composition of Example 1 was then applied to the organic anti-reflection film using a spinner, and was then prebaked (PAB) and dried on a hotplate at 130° C. for 60 seconds, thus forming a resist film having a film thickness of 60 nm.

Subsequently, the resist film was selectively irradiated with an ArF excimer laser (193 nm) through a photomask targeting a line and space pattern (LS pattern) with a line width of 160 nm and a pitch of 320 nm, using an ArF exposure apparatus NSR-5302 (manufactured by Nikon Corporation; NA (numerical aperture)=0.60, 2/3 annular).

Thereafter, a post exposure bake (PEB) treatment was conducted at 110° C. for 60 seconds, followed by solvent development for 60 seconds at 23° C. using a mixed solvent of butyl acetate and acetonitrile (butyl acetate/acetonitrile=70/30 (weight ratio)). Further, a post bake treatment was conducted at 100° C. for 60 seconds.

As a result, the unexposed portions of the resist film were dissolved and removed, so as to form an LS pattern having lines with a width of 160 nm provided at equal intervals (pitch: 320 nm). The optimum exposure dose Eop (mJ/cm$^2$) with which the L/S pattern was formed is indicated in Table 3.

Comparative Example 1

A resist pattern was formed in the same manner as in Example 21, except that a 2.38 wt % aqueous TMAH solution (product name: NMD-3; manufactured by Tokyo Ohka Kogyo Co., Ltd.) was used as a developing solution instead of a mixed solvent of butyl acetate and acetonitrile (butyl acetate/acetonitrile=70/30 (weight ratio)).

As a result, the exposed portions of the resist film were dissolved and removed, so as to form an LS pattern having lines with a width of 160 nm provided at equal intervals (pitch: 320 nm). The optimum exposure dose Eop (mJ/cm$^2$) with which the L/S pattern was formed is indicated in Table 3.

Comparative Example 2

A resist pattern was formed in the same manner as in Example 21, except that butyl acetate was solely used as a developing solution instead of a mixed solvent of butyl acetate and acetonitrile (butyl acetate/acetonitrile=70/30 (weight ratio)).

As a result, neither the unexposed portions nor the exposed portions of the resist film were dissolved, and a pattern could not be resolved.

[Evaluation of Minimum Dimension]

In the formation of an LS pattern with a target dimension of a liner width of 160 nm and a pitch of 320 nm, the exposure time for the selective exposure was gradually extended, and the exposure dose was increased to larger than the Eop. The line width just before the pattern collapsed (the limit dimension with which a pattern is resolved) was measured. The results are indicated under "minimum dimension (nm)" in Table 3.

[Evaluation of Line Width Roughness (LWR)]

With respect to each of the LS patterns formed with the above Eop and having a line width of 160 nm and a pitch of 320 nm, the line width at 400 points in the lengthwise direction of the line were measured using a measuring scanning electron microscope (SEM) (product name: S-9380, manufactured by Hitachi, Ltd.; acceleration voltage: 800V). From the results, the value of 3 times the standard deviation s (i.e., 3s) was determined, and the average of the 3s values at 5 points was calculated as "LWR (nm)". The results are shown in Table 3.

The smaller this 3s value is, the lower the level of roughness of the line width, indicating that a LS pattern with a uniform width was obtained.

TABLE 3

|  | Eop (mJ/cm$^2$) | Minimum dimension (nm) | LWR (nm) |
| --- | --- | --- | --- |
| Example 21 | 11.0 | 47.5 | 11.8 |
| Comparative Example 1 | 7.0 | 87.2 | 13.5 |
| Comparative Example 2 | | Not resolved | |

From the results shown in Table 3, it can be seen that the resist pattern formed by the method of Example 21 hardly suffered pattern collapse, showed excellent resolution and roughness was reduced, as compared to the resist pattern formed by the method of Comparative Example 1.

By the method of Comparative Example 2, a resist pattern could not be resolved, and the Eop, the minimum dimension and LWR could not be measured.

<Formation of Resist Pattern by Negative Tone Development (2)>

Example 22

The negative-tone development resist composition of Example 1 was uniformly applied to a substrate having an organic underlayer film on a silicon wafer using a spinner, and was then prebaked (PAB) at 130° C. for 90 seconds, thereby forming a resist film (film thickness: 40 nm).

Subsequently, the resist film was subjected to drawing (exposure) using an electron beam lithography apparatus ELS-7500 (manufactured by ELIONIX INC.) at an acceleration voltage of 50 keV, targeting a pattern having lines with a width of 40 nm arranged at a pitch of 80 nm.

Thereafter, a bake treatment (PEB) was conducted at 120° C. for 90 seconds, followed by solvent development for 60 seconds at 23° C. using a mixed solvent of butyl acetate and acetonitrile (butyl acetate/acetonitrile=70/30 (weight ratio)).

As a result, the unexposed portions of the resist film were dissolved and removed, so as to form an LS pattern having lines with a width of 40 nm provided at equal intervals (pitch: 80 nm). The optimum exposure dose Eop (mJ/cm$^2$) with which the L/S pattern was formed is indicated in Table 4.

Comparative Example 3

A resist pattern was formed in the same manner as in Example 22, except that a 2.38 wt % aqueous TMAH solution (product name: NMD-3; manufactured by Tokyo Ohka Kogyo Co., Ltd.) was used as a developing solution instead of a mixed solvent of butyl acetate and acetonitrile (butyl acetate/acetonitrile=70/30 (weight ratio)).

As a result, the exposed portions of the resist film were dissolved and removed, so as to form an LS pattern having lines with a width of 40 nm provided at equal intervals (pitch: 80 nm). The optimum exposure dose Eop (mJ/cm$^2$) with which the L/S pattern was formed is indicated in Table 4.

Comparative Example 4

A resist pattern was formed in the same manner as in Example 22, except that butyl acetate was solely used as a developing solution instead of a mixed solvent of butyl acetate and acetonitrile (butyl acetate/acetonitrile=70/30 (weight ratio)).

As a result, neither the unexposed portions nor the exposed portions of the resist film were dissolved, and a pattern could not be resolved.

[Evaluation of Critical Resolution]

With the above Eop, the pattern size was changed, and the minimum dimension of a pattern resolved (critical resolution (nm)) was determined. The results are shown in Table 4.

[Evaluation of Line Width Roughness (LWR)]

With respect to the LS pattern formed with the above Eop having a line width of 40 nm and a pitch of 80 nm, the "LWR (nm)" was calculated in the same manner as described above. The results are shown in Table 4.

TABLE 4

|  | Eop (mJ/cm$^2$) | Critical resolution (nm) | LWR (nm) |
| --- | --- | --- | --- |
| Example 22 | 48 | 32.9 | 7.9 |
| Comparative Example 3 | 28 | 36.0 | 8.7 |
| Comparative Example 4 | | Not resolved | |

From the results shown in Table 4, it can be seen that the resist pattern formed by the method of Example 22 exhibited excellent resolution and roughness was reduced, as compared to the resist pattern formed by the method of Comparative Example 3.

By the method of Comparative Example 4, a resist pattern could not be resolved, and the Eop, the critical resolution and LWR could not be measured.

< Formation of Resist Pattern by Negative Tone Development (3)>

Examples 23 to 41

An organic antireflection film composition (product name: ARC29, manufactured by Brewer Science Ltd.) was applied to an 8-inch silicon wafer using a spinner, and the composition was then baked and dried on a hotplate at 205° C. for 60 seconds, thereby forming an organic antireflection film having a thickness of 77 nm.

Each of the negative-tone development resist compositions of Examples 2 to 20 was then applied to the organic antireflection film using a spinner, and was then prebaked (PAB, ° C.) and dried on a hotplate at a temperature indicated in Table 5 for 60 seconds, thus forming a resist film having a film thickness of 60 nm.

Subsequently, the resist film was selectively irradiated with an ArF excimer laser (193 nm) through a photomask targeting a line and space pattern (LS pattern) with a line width of 160 nm and a pitch of 320 nm, using an ArF exposure apparatus NSR-5302 (manufactured by Nikon Corporation; NA (numerical aperture)=0.60, ⅔ annular illumination).

Next, a post exposure bake treatment (PEB, ° C.) was conducted at a temperature indicated in Table 5 for 60 seconds. Then, using as a developing solution, a mixed solvent of butyl acetate and acetonitrile (butyl acetate/acetonitrile=80/20 (weight ratio)) in Example 23, a mixed solvent of butyl acetate and acetonitrile (butyl acetate/acetonitrile=60/40 (weight ratio)) in Example 25, and a mixed solvent of butyl acetate and acetonitrile (butyl acetate/acetonitrile=70/30 (weight ratio)) in Examples 24 and 26 to 41, a solvent development was conducted at 23° C. for 60 seconds. Further, a post bake treatment was conducted at 100° C. for 60 seconds.

As a result, in each of the examples, the unexposed portions of the resist film were dissolved and removed, so as to form an LS pattern having lines with a width of 160 nm provided at equal intervals (pitch: 320 nm). The optimum exposure dose Eop (mJ/cm$^2$) with which the L/S pattern was formed is indicated in Table 5.

Comparative Examples 5 to 23

Resist patterns were formed in the same manner as in Examples 23 to 41, except that a 2.38 wt % aqueous TMAH solution (product name: NMD-3; manufactured by Tokyo Ohka Kogyo Co., Ltd.) was used as a developing solution instead of a mixed solvent of butyl acetate and acetonitrile.

As a result, in each of the examples, the exposed portions of the resist film were dissolved and removed, so as to form an LS pattern having lines with a width of 160 nm provided at equal intervals (pitch: 320 nm). The optimum exposure dose Eop (mJ/cm$^2$) with which the L/S pattern was formed is indicated in Table 5.

Comparative Examples 24 to 42

Resist patterns were formed in the same manner as in Examples 23 to 41, except that butyl acetate was solely used as a developing solution instead of a mixed solvent of butyl acetate and acetonitrile.

As a result, in each of the comparative examples, neither the unexposed portions nor the exposed portions of the resist film were dissolved, and a pattern could not be resolved.

[Evaluation of Minimum Dimension]

In the formation of an LS pattern with a target dimension of a line width of 160 nm and a pitch of 320 nm in each example, the exposure time for the selective exposure was gradually extended, and the exposure dose was increased to larger than the Eop. The line width just before the pattern collapsed (the limit dimension with which a pattern is resolved) was measured. The results are indicated under "minimum dimension (nm)" in Table 5.

[Evaluation of Line Width Roughness (LWR)]

With respect to each of the LS patterns formed in each example with the above Eop and having a line width of 160 nm and a pitch of 320 nm, the line width at 400 points in the lengthwise direction of the line were measured using a measuring scanning electron microscope (SEM) (product name: S-9380, manufactured by Hitachi, Ltd.; acceleration voltage: 800V). From the results, the value of 3 times the standard deviation s (i.e., 3s) was determined, and the average of the 3s values at 5 points was calculated as "LWR (nm)". The results are shown in Table 5.

TABLE 5

| Negative tone development composition | PAB/PEB (° C.) | Developing solution: 2.38 wt % aqueous TMAH solution | | | | Mixed solvent of butyl acetate and acetonitrile | | | | Solely butyl acetate | |
|---|---|---|---|---|---|---|---|---|---|---|---|
| | | Comparative Example | Eop (mJ/cm$^2$) | minimum dimension (nm) | LWR (nm) | Example | Eop (mJ/cm$^2$) | minimum dimension (nm) | LWR (nm) | Comparative Example | |
| Example 2 | 130/120 | 5 | 10 | 85.3 | 14.2 | 23 | 14 | 48.2 | 12.4 | 24 | Not resolved |
| Example 3 | 130/110 | 6 | 6 | 82.1 | 13.4 | 24 | 8 | 47.5 | 11.5 | 25 | Not resolved |
| Example 4 | 130/100 | 7 | 5 | 81.2 | 13.0 | 25 | 7 | 44.2 | 11.2 | 26 | Not resolved |
| Example 5 | 130/110 | 8 | 5 | 80.5 | 13.6 | 26 | 7 | 45.6 | 11.8 | 27 | Not resolved |
| Example 6 | 120/100 | 9 | 5 | 84.9 | 14.2 | 27 | 6 | 47.0 | 12.0 | 28 | Not resolved |
| Example 7 | 130/110 | 10 | 9 | 80.7 | 13.1 | 28 | 12 | 42.8 | 11.3 | 29 | Not resolved |
| Example 8 | 130/120 | 11 | 6 | 80.4 | 13.7 | 29 | 9 | 43.4 | 11.6 | 30 | Not resolved |
| Example 9 | 130/120 | 12 | 8 | 82.6 | 13.6 | 30 | 12 | 46.6 | 11.5 | 31 | Not resolved |
| Example 10 | 130/110 | 13 | 8 | 80.2 | 13.3 | 31 | 11 | 42.7 | 11.3 | 32 | Not resolved |
| Example 11 | 130/110 | 14 | 7 | 79.5 | 13.1 | 32 | 10 | 41.4 | 11.1 | 33 | Not resolved |

TABLE 5-continued

| Negative tone development composition | PAB/PEB (° C.) | Developing solution 2.38 wt % aqueous TMAH solution | | | | Mixed solvent of butyl acetate and acetonitrile | | | | Solely butyl acetate | |
|---|---|---|---|---|---|---|---|---|---|---|---|
| | | Comparative Example | Eop (mJ/cm²) | minimum dimension (nm) | LWR (nm) | Example | Eop (mJ/cm²) | minimum dimension (nm) | LWR (nm) | Comparative Example | |
| Example 12 | 120/110 | 15 | 9 | 81.0 | 13.6 | 33 | 13 | 44.2 | 11.7 | 34 | Not resolved |
| Example 13 | 120/105 | 16 | 8 | 80.5 | 13.4 | 34 | 11 | 41.5 | 11.3 | 35 | Not resolved |
| Example 14 | 130/120 | 17 | 10 | 83.7 | 13.8 | 35 | 14 | 46.8 | 11.6 | 36 | Not resolved |
| Example 15 | 130/110 | 18 | 9 | 82.9 | 13.8 | 36 | 12 | 45.1 | 11.5 | 37 | Not resolved |
| Example 16 | 120/105 | 19 | 8 | 82.0 | 13.5 | 37 | 11 | 43.0 | 11.3 | 38 | Not resolved |
| Example 17 | 120/110 | 20 | 9 | 79.6 | 13.0 | 38 | 12 | 41.7 | 11.2 | 39 | Not resolved |
| Example 18 | 130/120 | 21 | 10 | 80.3 | 13.7 | 39 | 14 | 41.4 | 11.9 | 40 | Not resolved |
| Example 19 | 120/105 | 22 | 8 | 79.5 | 13.0 | 40 | 11 | 40.6 | 11.0 | 41 | Not resolved |
| Example 20 | 120/110 | 23 | 8 | 78.2 | 13.0 | 41 | 10 | 40.1 | 11.3 | 42 | Not resolved |

From the results shown in Table 5, it can be seen that the resist patterns formed by the method of Examples 23 to 41 exhibited excellent resolution and roughness was reduced, as compared to the resist patterns formed by the method of Comparative Examples 5 to 23.

By the method of Comparative Examples 24 to 42, a resist pattern could not be resolved, and the Eop, the critical resolution and LWR could not be measured.

Component (A1)

Synthesis Example 21

Synthesis of Polymeric Compound (21)

A polymeric compound (21) was synthesized in the same manner as in Component (A1) Synthesis Example 1, except that the compound (16), the compound (8) and the compound (19) were used with predetermined molar ratio.

With respect to the polymeric compound (21), the weight average molecular weight (Mw) and the dispersity (Mw/Mn) were determined by the polystyrene equivalent value as measured by gel permeation chromatography (GPC). As a result, it was found that the weight average molecular weight was 12,000, and the dispersity was 1.57. Further, as a result of an analysis by carbon 13 nuclear magnetic resonance spectroscopy (600 MHz, $^{13}$C-NMR), it was found that the composition of the copolymer (ratio (molar ratio) of the respective structural units within the structural formula) was (16)/(8)/(19)=45.4/40.6/14.0.

Negative Tone-Development Resist Composition

Example 42

The components shown in Table 6 were mixed together and dissolved to obtain a negative-tone development resist composition.

TABLE 6

| | Component (A) | Component (D) | Component (E) | Component (S) | | |
|---|---|---|---|---|---|---|
| Example 42 | (A)-21 [100] | (D)-1 [1.95] | (E)-1 [0.83] | (S)-1 [1960] | (S)-2 [1310] | (S)-3 [1090] |

In Table 6, the values in brackets [ ] indicate the amount (in terms of parts by weight) of the component added, and the reference characters indicate the following.

(A)-21: the aforementioned polymeric compound (21)
(D)-1: tri-n-octylamine.
(E)-1: salicylic acid
(S)-1: propyleneglycol monomethyletheracetate
(S)-2: propylene glycol monomethyl ether
(S)-3: cyclohexanone <Formation of Resist Pattern by Negative Tone Development (4)>

Example 43

An organic antireflection film composition (product name: ARC29, manufactured by Brewer Science Ltd.) was applied to an 8-inch silicon wafer using a spinner, and the composition was then baked and dried on a hotplate at 205° C. for 60 seconds, thereby forming an organic antireflection film having a thickness of 77 nm.

The negative-tone development resist composition of Example 42 was then applied to the organic anti-reflection film using a spinner, and was then prebaked (PAB) and dried on a hotplate at 130° C. for 60 seconds, thus forming a resist film having a film thickness of 60 nm.

Subsequently, the resist film was selectively irradiated with an ArF excimer laser (193 nm) through a photomask targeting a line and space pattern (LS pattern) with a line width of 160 nm and a pitch of 320 nm, using an ArF exposure apparatus NSR-5302 (manufactured by Nikon Corporation; NA (numerical aperture)=0.60, ⅔ annular illumination).

Thereafter, a post exposure bake (PEB) treatment was conducted at 110° C. for 60 seconds, followed by solvent development for 60 seconds at 23° C. using a mixed solvent of butyl acetate and acetonitrile (butyl acetate/acetonitrile=60/40 (weight ratio)). Further, a post bake treatment was conducted at 100° C. for 60 seconds.

As a result, the unexposed portions of the resist film were dissolved and removed, so as to form an LS pattern having lines with a width of 160 nm provided at equal intervals (pitch: 320 nm). The optimum exposure dose Eop (mJ/cm$^2$) with which the L/S pattern was formed is indicated in Table 7.

Example 44

A resist pattern was formed in the same manner as in Example 43, except that a mixed solvent of butyl acetate and propionitrile (butyl acetate/propionitrile=50/50 (weight ratio)) was used as a developing solution instead of a mixed solvent of butyl acetate and acetonitrile (butyl acetate/acetonitrile=60/40 (weight ratio)).

As a result, the exposed portions of the resist film were dissolved and removed, so as to form an LS pattern having lines with a width of 160 nm provided at equal intervals (pitch: 320 nm). The optimum exposure dose Eop (mJ/cm$^2$) with which the L/S pattern was formed is indicated in Table 7.

Example 45

A resist pattern was formed in the same manner as in Example 43, except that butyronitrile was solely used as a developing solution instead of a mixed solvent of butyl acetate and acetonitrile (butyl acetate/acetonitrile=60/40 (weight ratio)).

As a result, the exposed portions of the resist film were dissolved and removed, so as to form an LS pattern having lines with a width of 160 nm provided at equal intervals (pitch: 320 nm). The optimum exposure dose Eop (mJ/cm$^2$) with which the L/S pattern was formed is indicated in Table 7.

Example 46

A resist pattern was formed in the same manner as in Example 43, except that valeronitrile was solely used as a developing solution instead of a mixed solvent of butyl acetate and acetonitrile (butyl acetate/acetonitrile=60/40 (weight ratio)).

As a result, the exposed portions of the resist film were dissolved and removed, so as to form an LS pattern having lines with a width of 160 nm provided at equal intervals (pitch: 320 nm). The optimum exposure dose Eop (mJ/cm$^2$) with which the L/S pattern was formed is indicated in Table 7.

Comparative Example 43

A resist pattern was formed in the same manner as in Example 43, except that a 2.38 wt % aqueous TMAH solution (product name: NMD-3; manufactured by Tokyo Ohka Kogyo Co., Ltd.) was used as a developing solution instead of a mixed solvent of butyl acetate and acetonitrile (butyl acetate/acetonitrile=60/40 (weight ratio)).

As a result, the exposed portions of the resist film were dissolved and removed, so as to form an LS pattern having lines with a width of 160 nm provided at equal intervals (pitch: 320 nm). The optimum exposure dose Eop (mJ/cm$^2$) with which the L/S pattern was formed is indicated in Table 7.

Comparative Example 44

A resist pattern was formed in the same manner as in Example 21, except that butyl acetate was solely used as a developing solution instead of a mixed solvent of butyl acetate and acetonitrile (butyl acetate/acetonitrile=60/40 (weight ratio)).

As a result, neither the unexposed portions nor the exposed portions of the resist film were dissolved, and a pattern could not be resolved.

Comparative Example 45

A resist pattern was formed in the same manner as in Example 21, except that 2-heptanone was solely used as a developing solution instead of a mixed solvent of butyl acetate and acetonitrile (butyl acetate/acetonitrile=60/40 (weight ratio)).

As a result, neither the unexposed portions nor the exposed portions of the resist film were dissolved, and a pattern could not be resolved.

[Evaluation of Minimum Dimension]

In the formation of an LS pattern with a target dimension of a line width of 160 nm and a pitch of 320 nm in each example, the exposure time for the selective exposure was gradually extended, and the exposure dose was increased to larger than the Eop. The line width just before the pattern collapsed (the limit dimension with which a pattern is resolved) was measured. The results are indicated under "minimum dimension (nm)" in Table 7.

[Evaluation of Line Width Roughness (LWR)]

With respect to each of the LS patterns formed with the above Eop and having a line width of 160 nm and a pitch of 320 nm, the line width at 400 points in the lengthwise direction of the line were measured using a measuring scanning electron microscope (SEM) (product name: S-9380, manufactured by Hitachi, Ltd.; acceleration voltage: 800V). From the results, the value of 3 times the standard deviation s (i.e., 3s) was determined, and the average of the 3s values at 5 points was calculated as "LWR (nm)". The results are shown in Table 7.

The smaller this 3s value is, the lower the level of roughness of the line width, indicating that a LS pattern with a uniform width was obtained.

TABLE 7

| | Eop (mJ/cm$^2$) | Minimum dimension (nm) | LWR (nm) |
| --- | --- | --- | --- |
| Example 43 | 14 | 42.3 | 11.3 |
| Example 44 | 12 | 41.5 | 11.5 |
| Example 45 | 13 | 40.7 | 10.9 |
| Example 46 | 12 | 40.9 | 11.3 |
| Comparative Example 43 | 10 | 81.1 | 13.9 |
| Comparative Example 44 | | Not resolved | |
| Comparative Example 45 | | Not resolved | |

From the results shown in Table 7, it can be seen that the resist patterns formed by the method of Examples 43 to 46 hardly suffered pattern collapse, showed excellent resolution and roughness was reduced, as compared to the resist pattern formed by the method of Comparative Example 43.

By the method of Comparative Examples 44 and 45, a resist pattern could not be resolved, and the Eop, the minimum dimension and LWR could not be measured.

INDUSTRIAL APPLICABILITY

According to the present invention, a fine resist pattern can be stably formed with excellent lithography properties by a negative-tone developing process using a developing solution containing an organic solvent. Therefore, the present invention is extremely useful in industry.

What is claimed is:

1. A method of forming a resist pattern comprising:
   forming a resist film on a substrate using a resist composition containing a base component (A) which exhibits decreased solubility in an organic solvent by action of an acid and contains a resin component (A1) comprising a structural unit (a0) which generates acid upon exposure and a structural unit (a1) derived from an acrylate ester in which the hydrogen atom bonded to the carbon atom at the α-position is or is not substituted with a substituent and contains an acid decomposable group which exhibits increased polarity by the action of acid; exposing the resist film; and
   patterning by a negative-tone development using a developing solution consisting of the organic solvent comprising a nitrile solvent, thereby forming a negative tone resist pattern in which the unexposed portions of the resist film have been removed.

2. The method of forming a resist pattern according to claim 1, wherein the structural unit (a0) is a structural unit represented by general formula (a0-1) or (a0-2) shown below:

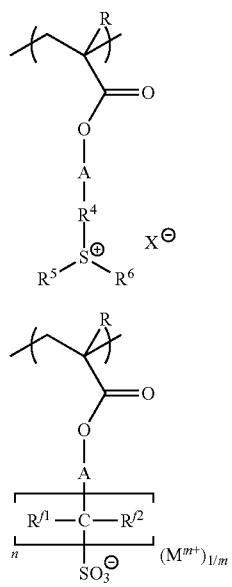

wherein R represents a hydrogen atom, an alkyl group of 1 to 5 carbon atoms or a halogenated alkyl group of 1 to 5 carbon atoms; A represents a single bond or a divalent linking group; $R^4$ represents an arylene group with or without a substituent; each of $R^5$ and $R^6$ independently represents an organic group, wherein $R^5$ and $R^6$ are or are not mutually bonded to form a ring with the sulfur atom; $X^-$ represents a counteranion; each of $R^{f1}$ and $R^{f2}$ independently represents a hydrogen atom, an alkyl group, a fluorine atom or a fluorinated alkyl group, provided that at least one of $R^{f1}$ and $R^{f2}$ represents a fluorine atom or a fluorinated alkyl group; n represents an integer of 1 to 8; $M^{m+}$ represents a countercation; and m represents an integer of 1 to 3.

3. The method of forming a resist pattern according to claim 1, wherein the resin component (A1) further comprises a structural unit (a2) derived from an acrylate ester in which the hydrogen atom bonded to the carbon atom at the α-position is or is not substituted with a substituent and contains a lactone-containing cyclic group.

4. The method of forming a resist pattern according to claim 1, wherein the resin component (A1) further comprises a structural unit (a3) derived from an acrylate ester containing a polar group-containing aliphatic hydrocarbon group and in which the hydrogen atom bonded to the carbon atom at the α-position is or is not substituted with a substituent.

5. The method of forming a resist pattern according to claim 1, wherein the structural unit (a1) comprises a structural unit represented by general formula (a1-5) shown below:

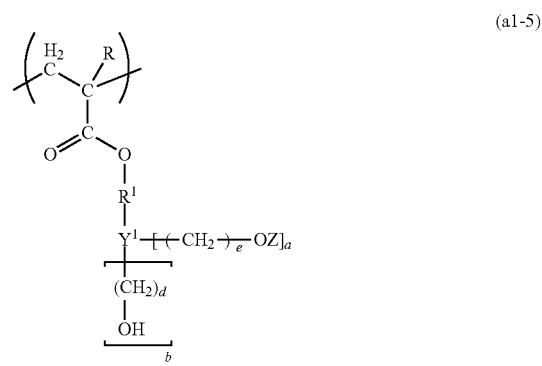

wherein R represents a hydrogen atom, an alkyl group of 1 to 5 carbon atoms or a halogenated alkyl group of 1 to 5 carbon atoms; OZ represents an acid decomposable group; $Y^1$ represents an aliphatic hydrocarbon group with or without a substituent; $R^1$ represents a single bond or a divalent linking group; a represents an integer of 1 to 3, and b represents an integer of 0 to 2, provided that a+b=1 to 3; and d and e each independently represents an integer of 0 to 3.

6. The method of forming a resist pattern according to claim 1, wherein the developing solution comprises at least one nitrile solvent selected from the group consisting of acetonitrile, propionitrile, butyronitrile, isobutyronitrile, valeronitrile, isovaleronitrile and benzonitrile.

7. The method of forming a resist pattern according to claim 1, wherein the developing solution comprises at least one nitrile solvent selected from the group consisting of acetonitrile, propionitrile, butyronitrile and valeronitrile.

8. The method of forming a resist pattern according to claim 1, wherein the developing solution comprises acetonitrile.

9. The method of forming a resist pattern according to claim 1, wherein the developing solution further comprises an ester solvent.

10. The method of forming a resist pattern according to claim 9, wherein the ester solvent is represented by general formula (1) or (2) shown below:

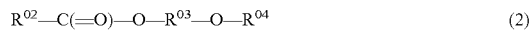

wherein each of $R^{00}$ and $R^{01}$ independently represents a hydrogen atom, an alkyl group, an alkoxy group, an alkoxycarbonyl group, a carboxy group, a hydroxy group, a cyano group or a halogen atom, provided that $R^{00}$ and $R^{01}$ are or are not mutually bonded to form a ring; each of $R^{02}$ and $R^{04}$ independently represents a hydrogen atom, an alkyl group, an alkoxy group, an alkoxycarbonyl group, a carboxy group, a hydroxy group, a cyano group or a halogen atom, provided that $R^{02}$ and $R^{04}$ are or are not mutually bonded to form a ring; and $R^{03}$ represents an alkylene group.

11. The method of forming a resist pattern according to claim 10, wherein the ester solvent is represented by formula (1).

12. The method of forming a resist pattern according to claim 10, wherein the ester solvent is butyl acetate.

13. The method of forming a resist pattern according to claim 9, wherein a mixing ratio of the nitrile solvent to the ester solvent in terms of weight ratio is 50:50 to 10:90.

14. The method of forming a resist pattern according to claim 1, wherein the resin component (A1) further comprises a structural unit (a6) represented by general formula (a6-1) shown below:

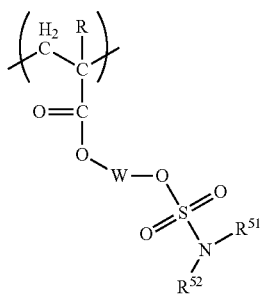

(a6-1)

wherein R represents a hydrogen atom, an alkyl group of 1 to 5 carbon atoms or a halogenated alkyl group of 1 to 5 carbon atoms; each of $R^{51}$ and $R^{52}$ independently represents a hydrogen atom or an alkyl group with or without an oxygen atom at an arbitrary position, or $R^{51}$ and $R^{52}$ are bonded together to form an alkylene group; and W represents a cyclic alkylene group with or without an oxygen atom at an arbitrary position.

15. The method of forming a resist pattern according to claim 1, wherein the resin component (A1) further comprises a structural unit (a7) is represented by general formula (a7-1) shown below:

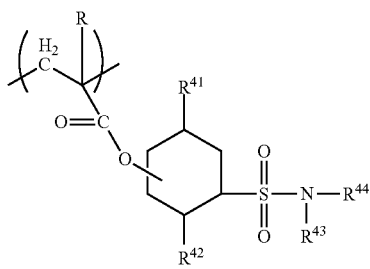

(a7-1)

wherein R represents a hydrogen atom, an alkyl group of 1 to 5 carbon atoms or a halogenated alkyl group of 1 to 5 carbon atoms; $R^{41}$ and $R^{42}$ each independently represents a hydrogen atom, an alkyl group, an alkoxy group, or $R^{41}$ and $R^{42}$ are mutually bonded to represent —O—, —S— or an alkylene group with or without an oxygen atom or a sulfur atom at an arbitrary position; and $R^{43}$ and $R^{44}$ each independently represents a hydrogen atom, an alkyl group with or without an oxygen atom at an arbitrary position, a cycloalkyl group with or without an oxygen atom at an arbitrary position, or an alkoxycarbonyl group.

16. The method of forming a resist pattern according to claim 15, wherein the structural unit (a7) is represented by general formula (a7-1-1), (a7-1-2) or (a7-1-3) shown below:

(a7-1-1)

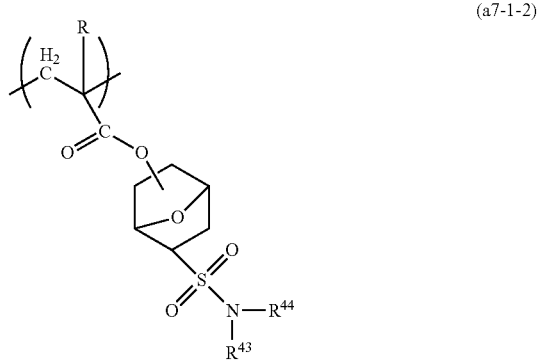

(a7-1-2)

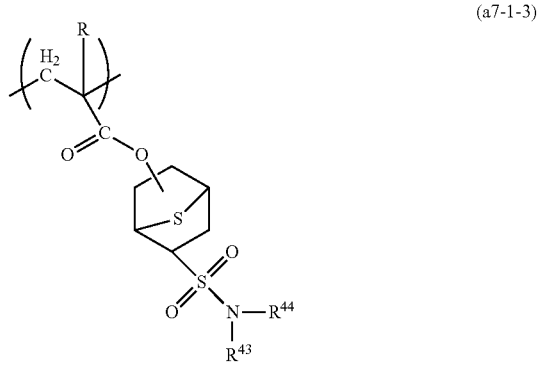

(a7-1-3)

wherein R represents a hydrogen atom, an alkyl group of 1 to 5 carbon atoms or a halogenated alkyl group of 1 to 5 carbon atoms; $A^{1''}$ represents an alkylene group with or without an oxygen atom or a sulfur atom at an arbitrary position; and $R^{43}$ and $R^{44}$ each independently represents a hydrogen atom, an alkyl group with or without an oxygen atom at an arbitrary position, a cycloalkyl group with or without an oxygen atom at an arbitrary position, or an alkoxycarbonyl group.

17. The method of forming a resist pattern according to claim 15, wherein the structural unit (a7) is represented by general formula (a7-1-11) and (a7-1-12) shown below:

(a7-1-11)
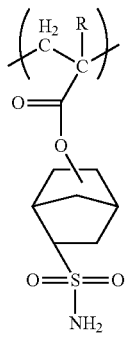

(a7-1-12)
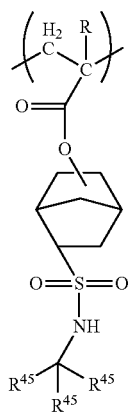

wherein R represents a hydrogen atom, an alkyl group of 1 to 5 carbon atoms or a halogenated alkyl group of 1 to 5 carbon atoms; at least one of $R^{45}$ represents a linear or branched alkyl group of 1 to 4 carbon atoms, and the or each remaining $R^{45}$ independently represents a linear or branched alkyl group of 1 to 4 carbon atoms or a monovalent aliphatic cyclic group of 4 to 20 carbon atoms, or the or each remaining $R^{45}$ are or are not mutually bonded to form a divalent aliphatic cyclic group of 4 to 20 carbon atoms together with the carbon atoms bonding each other; and the plurality of $R^{45}$ are the same or different.

18. The method of forming a resist pattern according to claim 1, wherein the resin component (A1) further comprises a structural unit (a5) derived from an acrylate ester in which the hydrogen atom bonded to the carbon atom at the α-position is or is not substituted with a substituent and contains an —$SO_2$— containing cyclic group.

19. The method of forming a resist pattern according to claim 18, wherein the structural unit (a5) is represented by general formula (a5-0) shown below:

(a5-0)
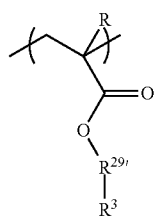

wherein R represents a hydrogen atom, an alkyl group of 1 to 5 carbon atoms or a halogenated alkyl group of 1 to 5 carbon atoms; $R^3$ represents a —$SO_2$— containing cyclic group; and $R^{29'}$ represents a single bond or a divalent linking group.

20. The method of forming a resist pattern according to claim 18, wherein the structural unit (a5) is represented by general formula (a5-0-1) shown below:

(a5-0-1)
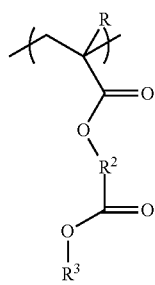

R represents a hydrogen atom, an alkyl group of 1 to 5 carbon atoms or a halogenated alkyl group of 1 to 5 carbon atoms; $R^2$ represents a divalent linking group; and $R^3$ represents an —$SO_2$— containing cyclic group.

* * * * *